United States Patent
Hirano et al.

(10) Patent No.: US 6,782,347 B2
(45) Date of Patent: Aug. 24, 2004

(54) METHOD FOR OPTIMIZING ELECTROMAGNETIC INTERFERENCE AND METHOD FOR ANALYZING THE ELECTROMAGNETIC INTERFERENCE

(75) Inventors: Shouzou Hirano, Osaka (JP); Takashi Mizokawa, Kyoto (JP); Tatsuo Ohhashi, Shiga (JP); Kenji Shimazaki, Hyogo (JP); Hiroyuki Tsujikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 162 days.

(21) Appl. No.: 09/993,965

(22) Filed: Nov. 27, 2001

(65) Prior Publication Data

US 2002/0065643 A1 May 30, 2002

(30) Foreign Application Priority Data

Nov. 27, 2000 (JP) .................................... P2000-359572
Sep. 3, 2001 (JP) .................................... P2001-265874

(51) Int. Cl.$^7$ ................................................ G06F 3/08
(52) U.S. Cl. ....................... 702/183; 702/182; 702/189; 702/191
(58) Field of Search ............................. 702/57, 65, 66, 702/69, 73, 74, 89, 111, 125, 182, 189, 191, 193, 183; 324/628; 361/705; 700/230, 290; 703/2, 5, 14, 19

(56) References Cited

U.S. PATENT DOCUMENTS

| | | |
|---|---|---|
| 5,294,826 A | 3/1994 | Marcantonio et al. ...... 257/659 |
| 5,528,756 A | 6/1996 | Molnar .................. 395/185.08 |
| 5,781,074 A | 7/1998 | Nguyen et al. ............. 331/105 |
| 5,966,684 A | 10/1999 | Richardson et al. ........ 702/191 |
| 5,969,390 A | 10/1999 | Kranzen .................... 257/363 |
| 6,044,294 A | 3/2000 | Mortazavi et al. .......... 600/547 |
| 6,185,454 B1 | 2/2001 | Thompson ..................... 607/2 |
| 6,185,460 B1 | 2/2001 | Thompson ................... 607/16 |
| 6,201,403 B1 | 3/2001 | Rollin et al. ................ 324/765 |
| 6,404,639 B1 * | 6/2002 | Wakabayashi et al. ...... 361/719 |
| 6,438,462 B1 * | 8/2002 | Hanf et al. ................. 700/297 |
| 6,519,556 B1 * | 2/2003 | Chikamichi .................. 703/13 |

FOREIGN PATENT DOCUMENTS

| | | |
|---|---|---|
| JP | 2001-22813 | 1/2001 |
| JP | 2001-28013 | 1/2001 |
| JP | 2001-256271 | 9/2001 |

* cited by examiner

Primary Examiner—Marc S. Hoff
Assistant Examiner—Felix Suarez
(74) Attorney, Agent, or Firm—McDermott Will & Emery LLP

(57) ABSTRACT

A method for optimizing electromagnetic interference (EMI) comprising: an EMI analyzing step of analyzing a quantity of electromagnetic interference of an LSI by execution of simulation; a step of selecting an instance with a large quantity of noise in said EMI analyzing step; and a step of adjusting a driving capability of said instance so that it is lowered to an extent that a delay does not occur in a signal timing of said instance selected. In order to optimize the analyzed EMI, the portion for which optimizing is required is extracted, and such a measure as increasing the area where the decoupling capacitance is created is implemented for this portion in a necessary degree. Further, by changing the aspect ratio of the block, changing the block position or changing the cell line, the decoupling capacitance can be easily created at the most efficient inserting position.

27 Claims, 55 Drawing Sheets

LOGICAL CHANGE

ESTIMATED POWER SOURCE CURRENT AT SMALL DECOUPLING CAPACITANCE

ESTIMATED POWER SOURCE CURRENT AT LARGE DECOUPLING CAPACITANCE

LOGICAL CHANGE

ESTIMATED POWER SOURCE CURRENT AT SMALL DECOUPLING CAPACITANCE

ESTIMATED POWER SOURCE CURRENT AT LARGE DECOUPLING CAPACITANCE

FIG. 8

| TIMING [ns] | POWER SOURCE CURRENT VALUE [mA] |
|---|---|
| 0 | 0 |
| 95 | 20 |
| 100 | 50 |
| 105 | 20 |
| 195 | 30 |
| 200 | 70 |
| 205 | 30 |
| 295 | 20 |
| 300 | 50 |
| 305 | 20 |
| 395 | 30 |
| 400 | 70 |
| 405 | 30 |
| 495 | 20 |
| 500 | 30 |
| 505 | 20 |

801        802

```
START OF PROCESSING
        ↓
SORTED RESULT INFORMATION
OF INSTANCE FOR WHICH          ~ 5501
MEASURE SHOULD BE MADE
        ↓
STEP OF DETERMINING CELL LINE
WHICH IS TO RELEASE "DOUBLE BACK"  ~ 5502
        ↓
STEP OF RELEASING              ~ 5503
"DOUBLE BACK"
        ↓
END OF PROCESSING
```

SORTED RESULT INFORMATION OF INSTANCE
FOR WHICH MEASURE SHOULD BE MADE

X102.XM123.MH2 - 5.2dB AT 100MHz
X178.XM123.MH2 - 6.0dB AT 100MHz
X138.XM155.MH5 - 7.0dB AT 100MHz
⋮

FIG. 76

| INSTANCE NAME | FREQUENCY OF FFT RESULT | CURRENT FREQUENCY COMPONENT |
|---|---|---|
| M1 | 50 | 1.1 |
| | 100 | 1.7 |
| | 150 | 2.0 |
| | 200 | 1.9 |
| | 250 | 1.6 |
| | 300 | 0.8 |
| | 350 | 1.5 |
| | 400 | 1.8 |
| M2 | 50 | 1.5 |
| | 100 | 2.0 |
| | 150 | 1.6 |
| | 200 | 0.9 |
| | 250 | 1.2 |
| | 300 | 1.5 |
| | 350 | 1.7 |
| | 400 | 1.1 |

| FREQUENCY | INSTANCE | CURRENT FREQUENCY COMPONENT |
|---|---|---|
| 50 | M4 | 2.0 |
| | M3 | 1.8 |
| | M8 | 1.7 |
| | M2 | 1.5 |
| | M7 | 1.4 |
| | M5 | 1.3 |
| | M1 | 1.1 |
| | M6 | 0.9 |
| 100 | M2 | 2.0 |
| | M6 | 1.9 |
| | M5 | 1.8 |
| | M1 | 1.7 |
| | M4 | 1.5 |
| | M3 | 1.3 |
| | M6 | 1.1 |
| | M7 | 1.0 |

7701    7702    7703

FREQUENCY
+

FREQUENCY

METHOD FOR OPTIMIZING ELECTROMAGNETIC INTERFERENCE AND METHOD FOR ANALYZING THE ELECTROMAGNETIC INTERFERENCE

BACKGROUND OF THE INVENTION

1. Field of the Invention

This invention relates to a method for optimizing electromagnetic interference (EMI) and a method for analyzing the electromagnetic, and more particularly to a method for optimizing the EMI by simulation at a high speed and with great accuracy for a large scale and high speed driving LSI (large scale semiconductor integrated circuit).

2. Description of the Related Art

The LSI has been widely used in not only a computer but also a communication device such as a portable telephone, a household appliance, a toy, a motorcar, etc. However, the EMI emitted form these devices has become problematic as (EMI) for a receiver such as a television/radio and a cause for malfunction of other systems. In order to overcome these inconveniences, a measure such as filtering or shielding has been made for the entire device. However, from the standpoint of the increase in the number of components, increase in cost, difficulty in the measure for a product, etc., noise suppression in an LSI package itself has been eagerly demanded.

Under such a circumstance, in each of the products, the LSI is placed as a key device. In order to assure the ability to compete, the large-scaling and speed-up of the LSI have been demanded. As the product cycle becomes short, in order to satisfy these demands, the automation of LSI designing is indispensable. Hence, necessity of adopting synchronous designing has risen as a condition for introducing the present designing automation technology. However, the entire circuitry operates synchronously with a reference clock, and in the case of the LSI designed in a large scale and driven at a high speed, the instantaneous current becomes very large, thereby leading to an increase in the EMI.

This invention relates to a simulation technique which can maintain the large-scaling and speed-up of the LSI and permits EMI evaluation indispensable to reduce the EMI.

The noise given by the LSI is roughly classified into radiation noise and conduction noise. The noise radiated directly from the LSI includes the noise radiated from the internal wiring of the LSI. However, the internal wiring is not so large as an antenna. As the operating frequency of the LSI is improved, the noise radiated directly from the LSI may be problematic in the future. However, at present, the radiation noise within the LSI is not problematic.

On the other hand, the conduction noise influences the other devices on a printed board through direct connection such as wires within the LSI, a lead frame, package or wiring on the printed board, and noise is radiated from a source or antenna of these connecting passages. The antenna of the connecting passage is much larger than the internal wiring of the LSI so that it constitutes a dominant element from the standpoint of the EMI.

The passage of the conduction noise from the LSI includes a power source and a signal. However, in the nearby electromagnetic field, a change in the current from the power source may be dominant as noise radiated from the antenna of the power source line. In many case, the package or measurement system as well as the power source is also problematic.

For example, in recent years, the EMI noise in the LSI has become an important problem so that the method of measuring the EMI noise in the LSI is being standardized by the IEC (International Electric Standard Committee). Analysis techniques such as magnetic probe technique or VDE technique have been proposed. Thus, LSI vendors can appeal the EMI noise performance of their own LSI for customers. The customers also can absolutely compare the LSIs from the standpoint of the EMI noise. Further, if the standard measuring technique prevails, the standard of the EMI noise of the LSI will be established.

However, conventionally, since the measurement system (measuring device and printed board for measurement) has not be taken into consideration, in the stage of developing the LSI, whether or not the LSI satisfies the above standard could not be determined.

Further, with respect to a signal, although there is a case where "ringing overshoot" occurring when the signal changes is problematic, in many cases, the fact that a change in a power source level within the LSI conducts as a signal waveform is problematic. It seems that the noise which conducts or radiates in either passage of the power source or signal is strongly correlated with a change in the power source current.

An explanation will be given of a power source current for a CMOS circuit using a simple inverter circuit. When an input voltage to the inverter varies, a load capacitor charging/discharging current which is a main power source current flows. A tunneling current also flows additively. Where such a CMOS circuit is designed, synchronization is carried out because of limitation of using an automated designing tool. However, owing to the synchronization, the circuits in the entire LSI operate simultaneously, and hence a peak current in the power source is generated in synchronism with a reference clock. In addition, in order to realize the high speed or shorten the period, the transistor size is increased to implement the charging/discharging in a short time. This increases the peak current. As a matter of course, large-scaling of the LSI increases the power source current in the entire LSI. In this way, the peak current of the power source increases and the power source current varies abruptly. This abrupt variation increases a harmonic component and leads to an increase in the EMI.

To execute accurate simulation of the variation in the power source current which may be a main cause of the EMI is efficient as evaluation of the EMI in the LSI.

Meanwhile, conventionally, the current simulation technique of conducting a current analysis in a transistor level has been used.

FIG. 46 is a block diagram showing a processing flow of a conventional EMI analyzing method using the current analysis technique in a transistor level. This method includes steps of layout parameter extraction (hereinafter referred to as LPE) 4603 from the layout information of an LSI which is an analysis object; circuit simulation 4606 about a switch level netlist; current source modeling processing 4608; power source line LPE processing 4610; transient analysis simulation 4612; and FET processing.

Referring to FIG. 46, an explanation will be given of the respective steps.

In step 4603, using inputs of: the layout data 4601 of a semiconductor integrated circuit which is an object for EMI analysis and an LPE rule 4602 which defines a transistor element or various line parasitic elements (resistor, capacitor, etc.), the parameter value of each element, and an output format of their extracted result, on the basis of the LPE rule 4602, the parameter of each element in the layout data 4601 is computed to create a netlist 4604. Incidentally, in this step, the parasitic element of a power source (and ground) is not used as the object of extraction.

In step 4606, using inputs of the netlist 4604 created from the above step 4603 and a test pattern 4605 for recreating a desired logic operation in an analysis object circuit, according to the operating status of an internal circuit, a charging/discharging current for charging/discharging a load capacitance, a tunneling current, etc. are computed to create current waveform information 4607 for each transistor. Incidentally, the first processing in this step is carried out on the assumption that the power source (and ground) potential is an ideal potential with no change.

In step 4608, an input of current waveform information 4607 for each transistor created in the previous step 4606 is modeled into a format applicable to later step 4612 to create current source element model information 4609. Incidentally, in order to reduce the burden of processing in the later step 4712, the technique of modeling the current source element for each functional circuit block constructed of a plurality of transistors is generally adopted.

Step 4610 will not be explained here because this step is different from step 4603 in only that as an object to be extracted, the transistor element or various kinds of interconnect line's parasitic elements are replaced by a parasitic element (resistor, decoupling capacitor, etc.) for the power source and ground line.

In step 4612, using inputs including the current element model information created in the step 4608, power source (and ground) line netlist 4611 created in the step 4610 and impedance (resistance, capacitance or inductance) 4616 of a wire or lead frame, the analysis using a transient analysis simulator represented by SPICE is carried out to create a power source voltage drop result 4617 which is a computed result of a voltage source change in the circuit to be analyzed.

Thereafter, the reprocessing of the step 4606 is carried out. In this case, the first processing of the step 4606 has been carried out on the assumption that the power source (and ground) potential is an ideal potential with no change. However, now, using an input of the power source voltage drop result 4617 created in the step 4612, the current waveform information 4607 for each transistor taking a power source voltage change into consideration is created again. Likewise, the reprocessing of the steps 4608 and 4612 is carried out again.

The loop processing of the steps 4606, 4608 and 4612 is repeated plural times to create a current waveform result 4613 with the power source voltage change reproduced with high accuracy.

In step 4614, an input of the current waveform result is subjected to fast Fourier transform (referred to as FFT) so that frequency spectrum analysis can be carried out, thereby providing an EMI analysis result 4615.

In the prior art as described above, although the inspection accuracy greatly depends on a combination of the LPE processing 4603, power source line LPE processing 4610 and the current source modeling processing 4608, the analysis accuracy in a certain level can be expected. However, since such a current analysis in the transistor level uses the transient analysis simulator represented by SPICE, the scale of the EMI analysis object circuit is limited and the processing time therefor can be increased. With the large-scaling of a semiconductor integrated circuit, in recent years, establishment of the EMI analysis with higher abstractiveness than the transistor level and capable of performing high speed analysis has been demanded.

The large-scaling of a chip and an increase in the number of elements increase the scale of a network of power source lines so that an increase in the processing time is becoming a great obstacle against the analysis of the EMI. In order to shorten the processing time, the means for reducing the resistance/capacitance of these power lines has been proposed. However, it is limited to the gate array which provides a grid pattern of power source lines.

Even if the power source current value is subjected to the FFT to perform the EMI analysis, finally, a designer must judge the FFT characteristic. Such a means takes a very long time to define the origin of a cause, or cannot define it. Its direct reflection as analysis information on correction is very insufficient.

In a measuring system also, the processing time increases according to the scale and elements of the measuring system itself. This is a problem which is not negligible in analysis of the EMI.

As described above, the conventional EMI analysis system for the LSI is not sufficient from the standpoint of compatibility between consideration of decoupling by the resistance, capacitance and resistance in a power source, ground and further measurement system and high speed processing, and of quick reflection of the EMI analysis result on the LSI designing.

In recent years when the large-scaling of a semiconductor integrated circuit has progressed, establishment of the EMI analysis using a current analysis method in the gate level with higher abstractiveness than the transistor level and capable of performing high speed analysis has been demanded. Various researches for satisfying this demand have been attempted.

Further, even if the EMI analysis has been done, it is not clear from which circuit the main cause is originated. Therefore, there is a problem that the circuit to be modified in order to improve the EMI cannot be known.

Thus, the inventors of this invention have intended to provide an EMI analysis method and apparatus which can implement high speed analysis and evaluate the EMI from the LSI through simulation in such a manner that the influence of decoupling by a resistance, capacitance and an inductance in a power source and ground is reflected on computation of a power source current.

Namely, the inventors have proposed an EMI analysis method comprising the steps: of allotting a FFT analysis discrete width to each frequency band for its modeling, and of subjecting the current change information computed by the modeling step to the FFT (Japanese Patent Appln. No. 2000-63783).

This method presents a problem that it cannot represent the influence of a decoupling capacitance on the FFT result, and can represent it by only enlarging the bottom of a triangle so that it cannot be represented accurately and its effect cannot be shown.

SUMMARY OF THE INVENTION

This invention has been accomplished in view of the above circumstance, and intends to specify the origin of EMI for an LSI subjected to analysis and take an effective measure for the EMI.

The first aspect of this invention is characterized by comprising the steps of:

an EMI analyzing step of analyzing a quantity of electromagnetic interference of an LSI by execution of simulation;

a step of selecting an instance with a large quantity of noise in the EMI analyzing step; and a step of adjusting a driving capability of the instance so that it is lowered in a degree to which a delay does not occur in a signal timing of the instance selected.

In this configuration, by selecting an instance with a large quantity of noise in the EMI analyzing step and adjusting a driving capability of the instance so that it is lowered in a degree to which a delay does not occur in a signal timing of the instance selected, the EMI can be easily optimized with good workability. Now, to lower the driving capability in a degree to which a delay does not occur means to lower the driving capability while the circuit operation is performed normally.

The second aspect of this invention, in the EMI optimizing method according to the first aspect, is characterized in that where there the instance of a first instance and a second instance having an output signal line in parallel adjacently to an output signal line of the first instance, the step of adjusting includes to adjust the driving capability of only the first instance or both of the first and the second instance so that it or they are lowered (in a degree to which the ratio of the driving capabilities to each other does not increase).

The third aspect of this invention is characterized by comprising the steps of:

an EMI analyzing step of analyzing a quantity of electromagnetic interference of an LSI by execution of simulation;

a step of selecting an instance with a large quantity of noise in the EMI analyzing step; and a step of correcting a driving capability of the instance in such a way that an inductance is added to a local power source line communicated with the instance in a degree to which a delay does not occur in a signal timing of the instance selected.

The fourth aspect of this invention, in the EMI optimizing method according to the third aspect, is characterized in that the step of correcting includes to increase a power supply line resistance.

The fifth aspect of this invention is characterized by comprising:

an EMI analyzing step of analyzing a quantity of electromagnetic interference of an LSI by execution of simulation;

a step of selecting an aggressor instance with crosstalk; and a step of adjusting a driving capability of the aggressor instance so that it is lowered in a degree to which a delay does not occur in a signal timing of the instance selected.

The six aspect of this invention, in the EMI optimizing method, is characterized by further comprising a step of raising the driving capability of a victim instance in a degree to which EMI noise of the victim instance is negligible.

The seventh aspect of this invention, in the EMI optimizing method according to the fifth aspect, is characterized in that where the driving capabilities of both of the aggressor instance and victim instance is lowered, their driving capabilities are set so that their ratio is not increased.

The eighth aspect of this invention is characterized by comprising:

an EMI analyzing step of analyzing a quantity of electromagnetic interference of an LSI by execution of simulation;

a step of sampling a block or instance with a large quantity of noise in the EMI analyzing step;

a step of reducing the EMI in the block or instance thus sampled according to a designing stage; and a step of repeating a series of said consecutive steps until the quantity of EMI is made smaller than a prescribed value.

Although the measure of creating the decoupling capacitance of a chip is created presents a demerit of increasing the chip area, this configuration permits the measure to be taken at a necessary region, and hence prevents the chip area from being increased excessively.

This configuration is very effective because when the measure of changing the aspect ratio or changing the block position is adopted, the measure for the EMI which does not increase the chip area is required.

This method provides good workability because the measure can be implemented in a floorplan.

Further, the measure of changing the cell line is effective because a decoupling capacitance can be easily created at the most effective inserting position, i.e. the position nearest to the instance at issue.

Thus, the measure for the EMI can be implemented while an increase in the chip area is suppressed as far as possible.

The ninth aspect of this invention, in the EMI optimizing method according to the eighth aspect, is characterized in that the step of reducing EMI includes a first step of changing layout data at a floorplan stage.

The tenth aspect of this invention, in the EMI optimizing method according to the 8th or 9th aspects, is characterized in that the step of reducing EMI includes a second step of changing layout data at a layout stage.

The eleventh aspect of this invention, in the EMI optimizing method according to the ninth aspect, is characterized in that the first step includes the steps of:

computing a necessary quantity of decoupling capacitance from peak current information of an object block sampled in the step of sampling;

computing a quantity of insufficiency of an power source area from the necessary quantity of decoupling capacitance thus computed in the step of computing; and changing the layout data on the basis of the quantity of insufficiency.

The twelfth aspect of this invention, in the EMI optimizing method, is characterized in that the second step includes the steps of:

computing a necessary quantity of decoupling capacitance from peak current information of an object block sampled in the step of sampling;

computing a quantity of insufficiency of an power source area from the necessary quantity of decoupling capacitance thus computed in the step of computing; and changing the layout data on the basis of the quantity of insufficiency.

The thirteenth aspect of this invention, in the EMI optimizing method, is characterized in that the first step includes the steps of:

computing a necessary quantity of decoupling capacitance from peak current information of an object block sampled in the step of sampling;

computing a quantity of insufficiency of an power source area from the necessary quantity of decoupling capacitance thus computed in the step of computing; and changing the layout data for a required block on the basis of the quantity of insufficiency.

The fourteenth aspect of this invention, in the EMI optimizing method according to 11, is characterized in that the step of changing the layout data is to change the aspect ratio of the object block so that the line area of a power source current path is changed substantially.

The fifteenth aspect of this invention, in the EMI optimizing method according to 11, characterized in that the step of changing the layout data is to change the block position of the object block so that the line area of a power source current path is changed substantially.

The sixteenth aspect of this invention, in the EMI optimizing method according to the tenth aspect, characterized in that the second step is to invert a direction of one of cell lines each sharing a ground line or power supply line so that a prescribed interval is given between the power line and the ground line adjacent to each other.

The seventeenth aspect of this invention, in the EMI optimizing method according to the tenth aspect, is characterized in that
the second step includes to arrange an auxiliary line connected to a potential between the power supply potential and ground potential above or below a layer where the power line and ground line are formed so that a sum of the capacitances between the power line and ground line, between the ground line and auxiliary line and between the auxiliary line and the power line becomes a desired decoupling capacitance.

The eighteenth aspect of this invention is characterized by comprising the steps of:
sampling blocks or instances with noise in a so high level as to require a measure for EMI in such a manner that an instantaneous current quantity for an object block created when a signal change is generated is computed by execution of simulation, taking into consideration event information inclusive of the name of an instance for each cell of an LSI at issue, name of a signal, timing of the signal change and transient information; and
sorting/displaying the blocks or instances according to the level of noise.

This configuration permits unsuitable portions to be easily detected by sorting the blocks or instance according to the noise level and displaying them, and hence provide good workability.

The nineteenth aspect of this invention is characterized by comprising the steps of:
sampling blocks or instances with noise in so high a level as to require a measure for EMI in such a manner that an instantaneous current quantity for an object block created when a signal change is generated is computed by execution of simulation, taking into consideration event information inclusive of the name of an instance for each cell of an LSI at issue, name of a signal, timing of the signal change and transient information; and
modeling the instantaneous current quantity according to a predetermined rule; and
executing frequency analysis (hereafter called as FFT analysis) of current change information computed by the step of modeling, wherein it further comprises
a step of displaying frequency information acquired in the step of FFT analysis.

The twentieth aspect of this invention, in the EMI analyzing method according to the 19th aspect, is characterized by further comprising the steps of:
highlighting a block to be noticed from the information displayed in the step of displaying;
analyzing EMI information after EMI optimizing processing is executed for the block; and
displaying the information thus analyzed.

The twenty-first aspect of this invention of this invention, in the EMI analyzing method according to the 20th aspect, further comprising the steps of:
storing the optimizing processing as processing historical information; and
displaying the processing historical information as occasion demands.

The simulation is carried out such as by an execution of a logic simulation, and includes the steps of allotting an FFT analysis discrete width to each frequency band and modeling it, and of subjecting the current change information thus computed to fast FFT processing.

The twenty-second aspect of this invention is characterized by comprising the steps of:
deciding a portion with much EMI noise on the basis of an analysis result of EMI noise in an LSI;
displaying the portion which has been decided to have much EMI noise.

In this configuration, the unsuitable portion can be easily detected and also visually observed so that the workability of optimizing can be improved very greatly.

The twenty-third aspect of this invention, in the EMI analyzing method according to the 22nd aspect, is including the step of computing a difference of the portion having a large EMI noise from differences of a plurality of FFT results and displaying it.

In this configuration, the analyzing result is easily understood so that the workability of optimizing is improved.

The twenty-forth aspect of this invention, in the EMI analyzing method according to the 22nd aspect, characterized in that the step of displaying includes to display two FFT results so that differences of specified portions of any shape are displayed in different colors for the color identification of the differences of a shape.

In this configuration, the analyzing result is easily understood so that the workability of optimizing is improved.

The twenty-fifth aspect of this invention, in the EMI analyzing method according to the 22nd aspect, is characterized in that the step of deciding includes to compute the differences on the basis of information of circuit portions sorted according to the degree of noise.

In this configuration, the information is sorted according to the degree of noise so that the computing can be easily carried out with good workability.

The twenty-sixth aspect of this invention, in the EMI analyzing method according to the 22nd aspect, is characterized in that the step of displaying includes to display the portions in color identification between circuit diagram information and layout information or by character information.

In this configuration, the workability of optimizing is improved greatly.

The twenty-seventh aspect of this invention, in the EMI analyzing method, is characterized by further comprising the steps of:
analyzing EMI information of a portion EMI-optimized for the block; and
displaying the analyzed information.

In this configuration, the optimized portion is further analyzed so that the result can be satisfied one such as a good workability.

BRIEF DESCRIPTION OF THE DRAWINGS

FIG. 8 is a view showing an example of data used in the eleventh embodiment of this invention.

FIG. 76 is a view showing an example of data in the FFT result storage means in the seventh embodiment of this invention.

FIG. 77 is a view showing an example of data in the sorted result storage means in the seventh embodiment of this invention.

DESCRIPTION OF THE PREFERRED EMBODIMENTS

An explanation will be given of various embodiments of a method of optimizing EMI according to this invention.

Embodiment 1

Figure 1:
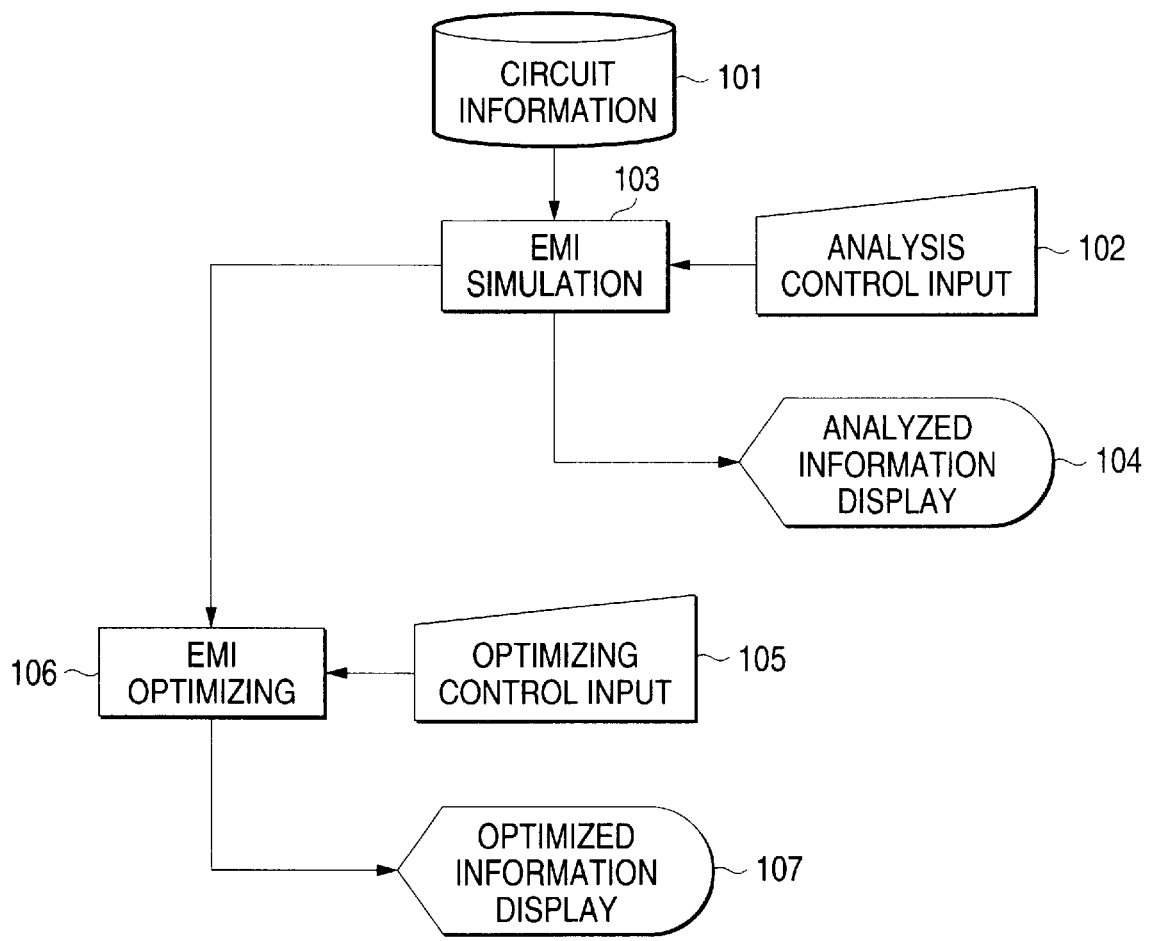
FIG. 1 is a block diagram for realizing a method of analyzing EMI according to the eleventh embodiment of this invention.

FIG. 1 is a conceptual view of an entire configuration of an EMI analysis device for executing a method for optimizing the EMI according to this invention.

The EMI analysis device includes an analysis control input unit 102, an EMI simulation unit 103, an analysis information display unit 104, an optimizing control input unit 105, an EMI optimizing unit 106 and an optimizing information display unit 107. The analysis control input unit 102 adds at least one item of power source information of a power source for supplying a current to the LSI chip, package information of a package of the LSI chip and measurement information of a measurement system for measuring the characteristic of the LSI chip to circuit information 101 of an LSI chip at issue as analysis control information and estimates the total information of the circuit information and the analysis control information as an equivalent circuit. The EMI simulation unit 103 executes the simulation in accordance with the total information estimated in the analysis control input unit 102. The analysis information display unit 104 displays the analysis information acquired by the EMI simulation unit 103. The EMI optimizing unit 106 optimizes the EMI on the basis of the analysis information acquired by the EMI simulation unit 103 and an optimizing standard supplied from the optimizing control input unit 105. The optimizing information display unit 107 displays the optimized information on the basis of the information from the EMI optimizing unit 106.

Figure 48:
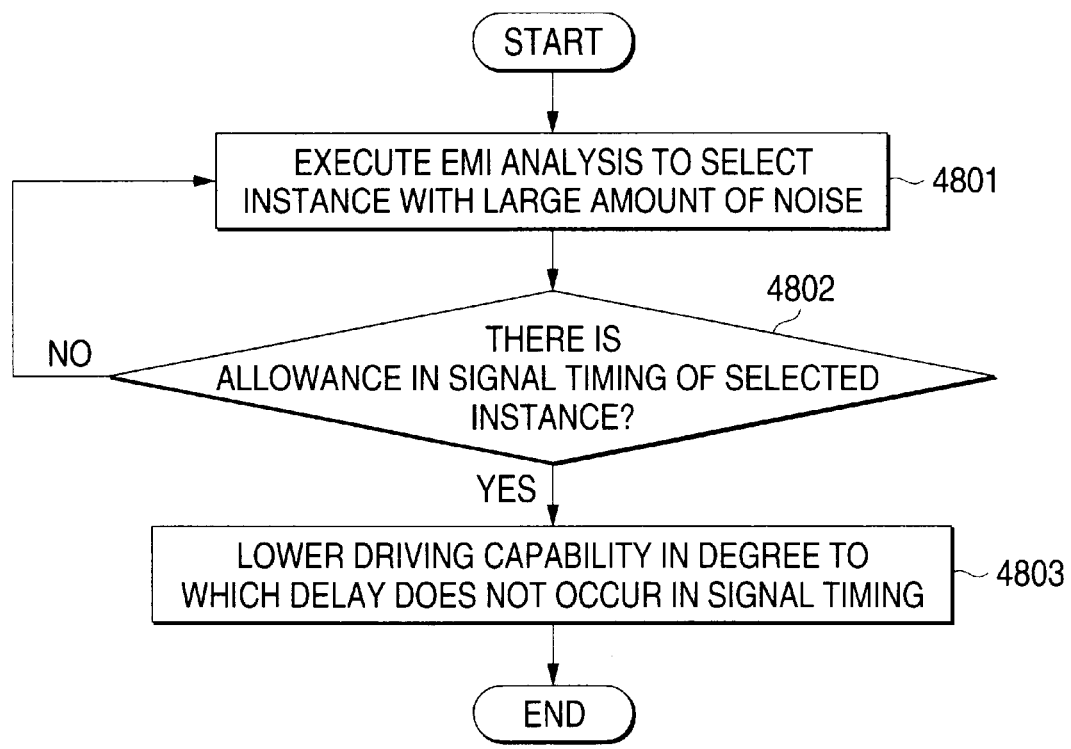
FIG. 48 is a flowchart showing an EMI optimizing step according to the first embodiment of this invention.

This device is characterized in that the EMI optimizing unit 106, as seen from a flowchart of FIG. 48, includes a step of adjusting the driving capability of an instance, which might be defined as a specific part of the circuitry blocks or cells fabricated in the LSI chip to be subjected for the optimization, so that it is lowered in a degree to which a signal timing delay does not occur. Assuming that the instance with a large amount of noise has been selected by a manner described later, an explanation will be given of executing the measure of optimizing the EMI for the instance.

First, the EMI is executed by simulation to select an instance with a large amount of noise (step 4801).

It is determined whether or not there is an allowance in a signal timing of the selected instance has an allowance (step 4802). If there is the allowance, the driving capability is lowered in a degree to which a delay does not occur in the signal timing (step 4803).

Embodiment 2

Figure 49:
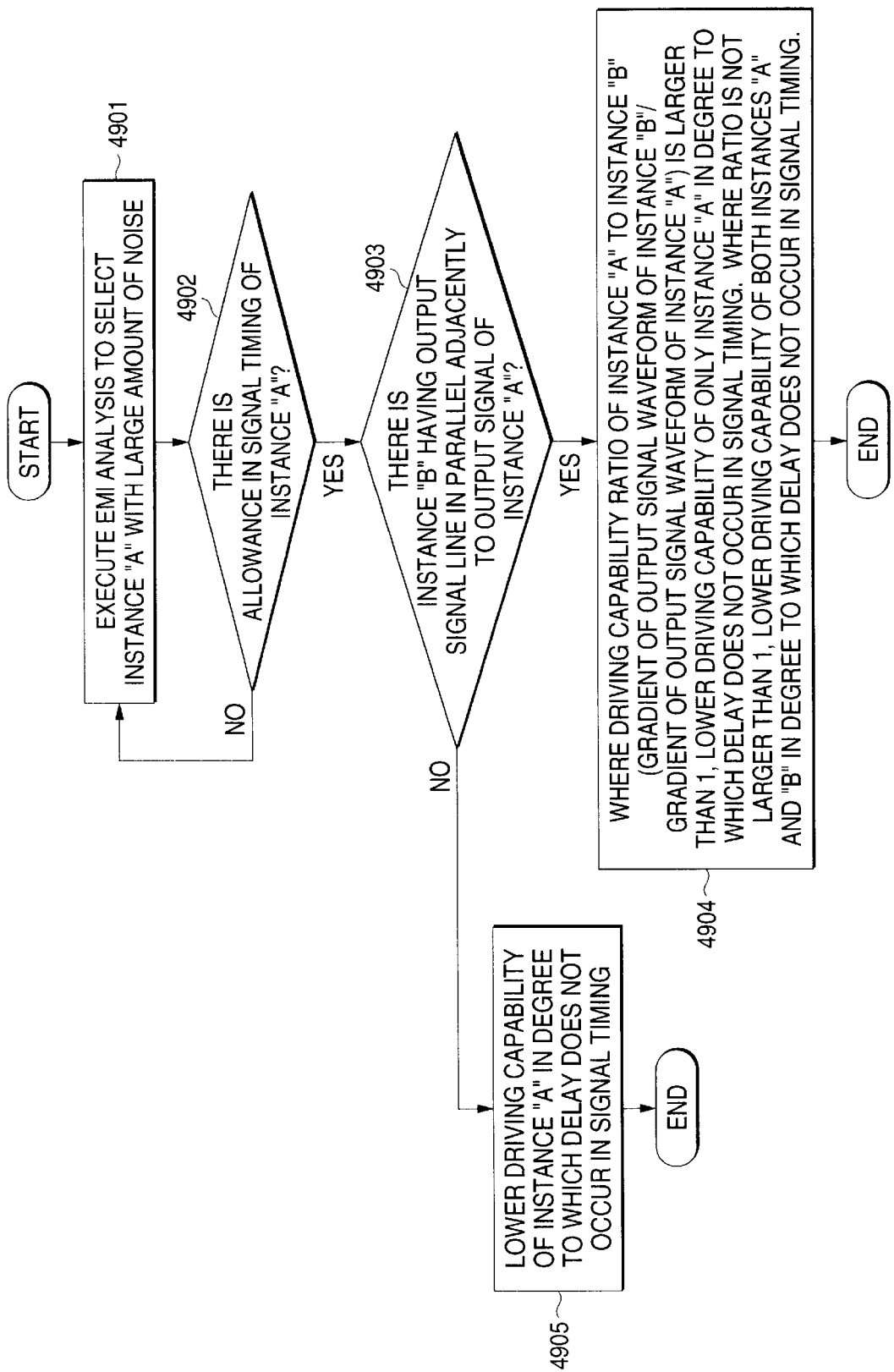
FIG. 49 is a flowchart showing an EMI optimizing step according to the second embodiment of this invention.

An explanation will be given of the second embodiment of this invention. As understood from the flowchart of FIG. 49, this embodiment is characterized in that the measure for the EMI is executed taking cross talk into consideration. Specifically, this embodiment is characterized in that where there is the other instance having an output signal line in parallel adjacently to the output signal line of the instance selected as having a large amount of noise, if the above selected instance provides a higher driving capability, the driving capability of both instances is lowered in a degree to which a delay does not occur in the signal timing.

Now assuming that the instance with a large amount of noise has been selected in the manner as described later, an explanation will be given of executing the measure of optimizing the EMI for the instance.

First, the EMI is executed by simulation to select an instance with a large amount of noise (step 4901).

Next, it is determined whether or not there is an allowance in a signal timing of the selected instance has an allowance (step 4902). If there is the allowance, in step 4903, it is determined whether there is a second instance having an output signal line in parallel adjacently to the output signal line of the first instance A selected as having a large amount of noise. If it is determined that there is the second instance, comparison is made between the first instance and the second instance. If the gradient of the output signal waveform of the first instance A is larger than or equal to that of the second instance B, the driving capability of the second instance as well as the first instance is lowered in a degree to which a delay does not occur in the signal timing and the driving capability ratio does not increase. On the other hand, if the gradient of the output signal waveform of the second instance B is larger, the driving capability of only the first instance A is lowered in a degree to which a delay does not occur in the signal timing (step 4904). Incidentally, that the driving capability ratio does not increase means that the driving capability ratio after having been changed is not larger than that before being changed. In other words, the diving capability of both first instance A and second instance B is lowered on condition that the driving capability ratio before changed≧the driving capability ratio after having been changed.

If there is not the second instance B which generates cross talk, the driving capability of the first instance A is lowered in a degree to which a delay does not occur in the signal timing (step 4905).

Embodiment 3

Figure 50:
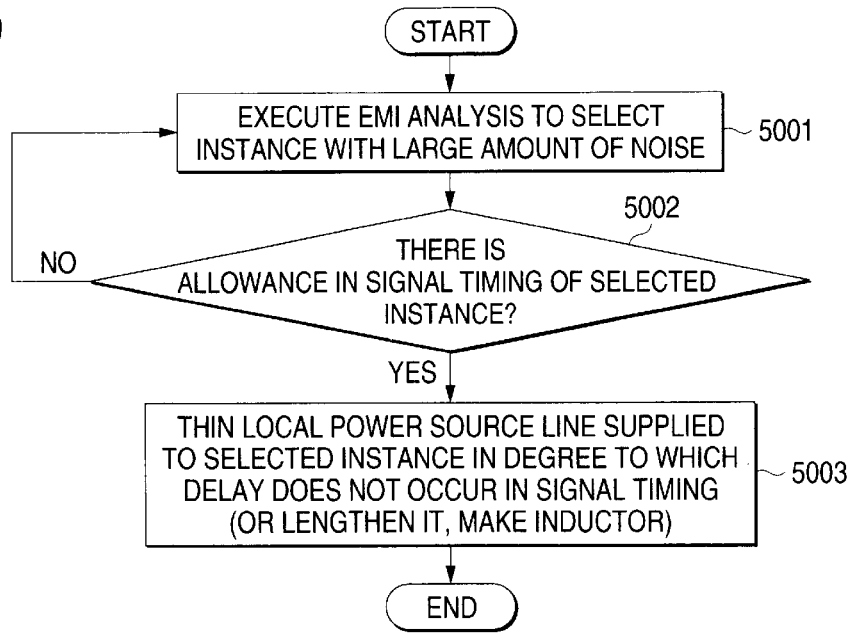
FIG. 50 is a flowchart showing an EMI optimizing step according to the third embodiment of this invention.

An explanation will be given of the third embodiment of this invention. As understood from the flowchart of FIG. 50, this embodiment is characterized in that in the EMI optimizing unit 106, the measure for the EMI is executed taking a IR drop into consideration. Specifically, this embodiment is characterized in that the resistance of the local power source line supplied to the instance selected as having a large amount of noise is increased so that the applied voltage to the instance is lowered through the IR drop in a degree to which a delay does not occur in the signal timing, thereby lowering the driving capability.

Now assuming that the instance with a large amount of noise has been selected in the manner as described later, an explanation will be given of executing the measure of optimizing the EMI for the instance.

First, the EMI analysis is executed by simulation to select an instance with a large amount of noise (step 5001).

Next, it is determined whether or not there is an allowance in a signal timing of the selected instance has an allowance (step 5002). If it is determined that there is the allowance, the resistance of the local power source line supplied to the instance selected as having a large amount of noise is increased so that the applied voltage to the instance is lowered through the IR drop in a degree to which a delay does not occur in the signal timing, thereby lowering the driving capability (step 5003).

Embodiment 4

Figure 51:
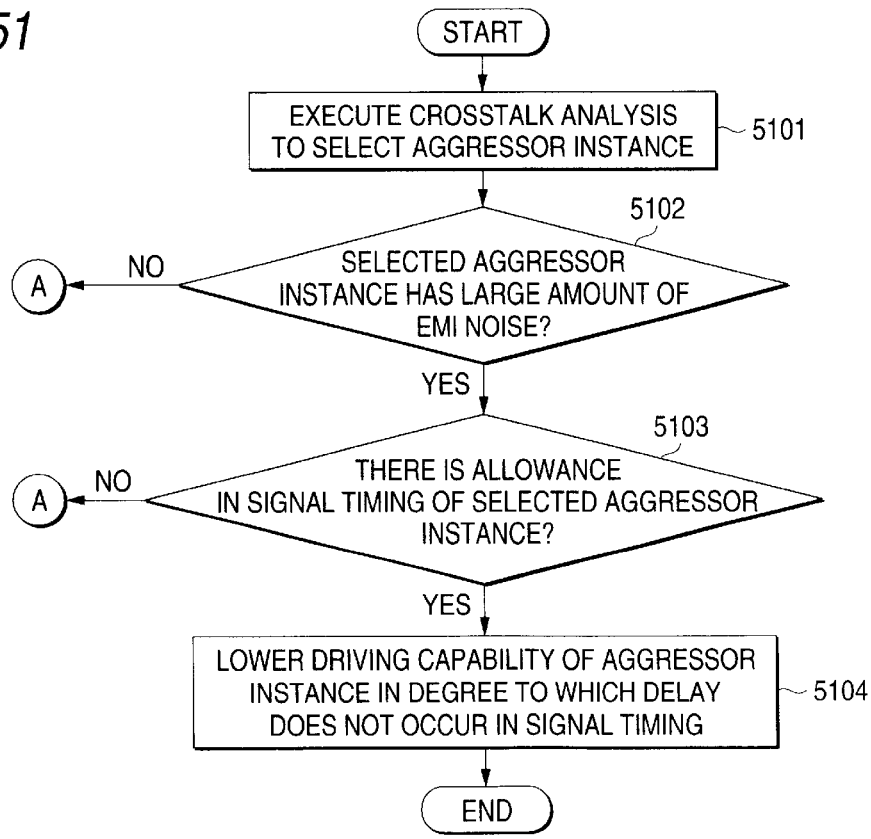
FIG. 51 is a flowchart showing an EMI optimizing step according to the fourth embodiment of this invention.

An explanation will be given of the fourth embodiment of this invention. As understood from the flowchart of FIG. 51, this embodiment is characterized in that in the EMI optimizing unit, an aggressor instance which is a perpetrator of cross talk is selected in the EMI analysis step, and the driving capability of the aggressor instance is lowered in a degree to which a delay does not occur in the signal timing of the selected aggressor instance.

Now assuming that the instance with a large amount of noise has been selected in the manner as described later, an explanation will be given of executing the measure of optimizing the EMI for the instance.

First, the EMI is executed by simulation to select an aggressor instance which is a perpetrator of noise (step 5101).

Next, it is determined whether or not the selected aggressor instance has a large amount of noise (step 5102). If it is determined that the selected aggressor instance has a large amount of noise, it is determined whether or not there is an allowance in a signal timing of the selected aggressor instance (step 5103). If it is determined that there is the allowance, the driving capability of the aggressor instance is lowered in a degree to which a delay does not occur in the signal timing of the selected aggressor instance (step 5104).

Figure 52:
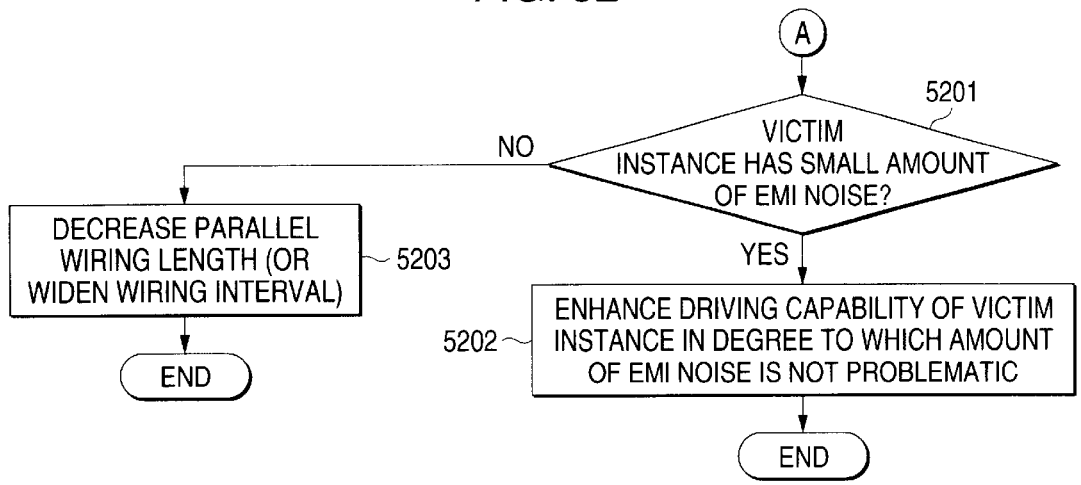
FIG. 52 is a flowchart showing an EMI optimizing step according to the fourth embodiment of this invention.

If it is determined that the selected aggressor instance does not have a large amount of noise in step 5102, and there is no allowance in step 5103, the processing is shifted to the step shown in FIG. 52.

Now, it is determined whether or not a sufferer or a victim instance has a small amount of EMI noise (step 5201). If it is determined that the victim instance has a small amount of EMI noise, the driving capability of the victim instance is enhanced in a degree to which the EMI noise is not problematic (step 5202).

On the other hand, if it is determined that the victim instance has not a small amount of EMI noise, the parallel signal line length is decreased or the line interval is widened (step 5203) so that the cross talk is reduced.

Embodiment 5

Figure 53:
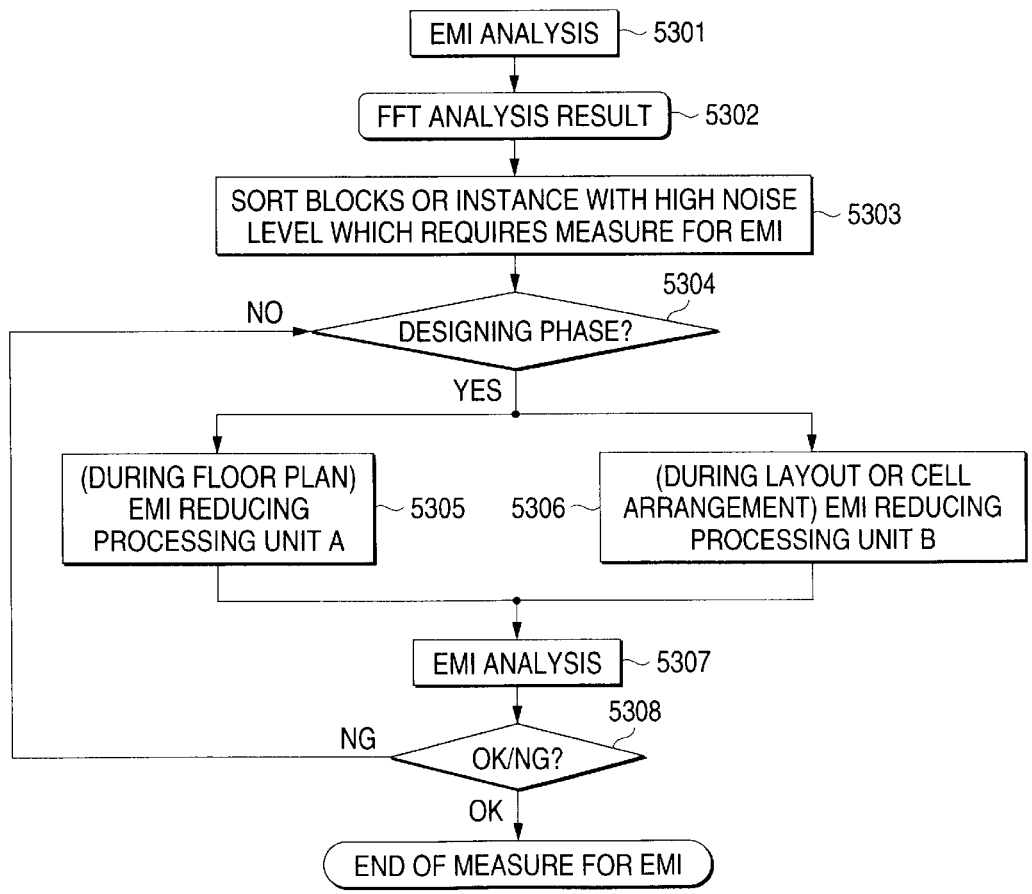
FIG. 53 is a flowchart showing the entire processing of an EMI optimizing step according to the fifth embodiment of this invention.

An explanation will be given of the fifth embodiment of this invention. FIG. 53 shows an entire processing flow of the measure for EMI by insertion of a decoupling capacitance according to the fifth embodiment of this invention. As seen from the flowchart of FIG. 53, this embodiment is characterized in that the processing of reducing the EMI is carried out separately during the time of floorplan and layout, the EMI analysis will be thereafter carried out to determine whether or not the EMI is within a prescribed range, and if not, processing is returned to a designing phase again. Further, this embodiment is characterized by comprising the steps of computing an efficient position of inserting the decoupling capacitance in an area for which optimizing of the EMI is required and making the inserting area.

The EMI analysis processing is carried out in step 5301. The frequency spectrum of the FFT analysis result is taken out (step 5302). The blocks or instances with a high noise level which requires the measure for EMI are sorted (step 5303). Specifically, with the frequency spectrum stored in an outer computer system, these blocks are stored as a group of programs having the steps corresponding to the respective elements in its input/output computing unit and sorted in a desired order.

On the other hand, an FFT result sorting means 7502 is stored as a group of programs having steps corresponding to the respective elements in the input/output computing unit of the computer system.

Thereafter, in a designing phase (step 5304), the processing of reducing the EMI during the time of floorplan is carried out in a first EMI reducing processing unit (step 5305). On the other hand, the processing of reducing the EMI during the time of layout or cell arrangement is carried out in a second EMI reducing processing unit (step 5306).

The EMI analysis is carried out again (step 5307), and it is determined whether or not the amount of EMI is less than a prescribed amount (reference amount) (step 5308).

When it is determined that the amount of EMI has become much less than the reference amount, the measure for the EMI is completed.

On the other hand, if it is determined that the amount of EMI has not become much less than the reference amount, the processing is returned to the designing phase (step 5304) again. The measure for EMI are executed in the first and the second EMI reducing processing unit.

Next, referring to FIG. 54, an explanation will be given of the step of optimizing the EMI during the time of floorplan.

Figures 55, 56:
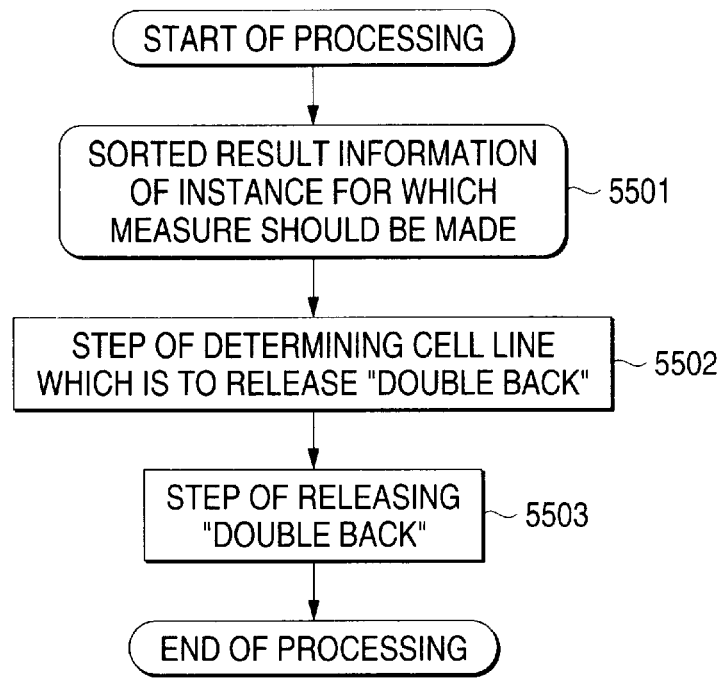
FIG. 55 is a flowchart showing the processing step in a layout cell arrangement in an EMI optimizing step according to the sixth embodiment of this invention.
FIG. 56 is a view showing the EMI optimizing processing according to the sixth embodiment of this invention.
Figure 58:
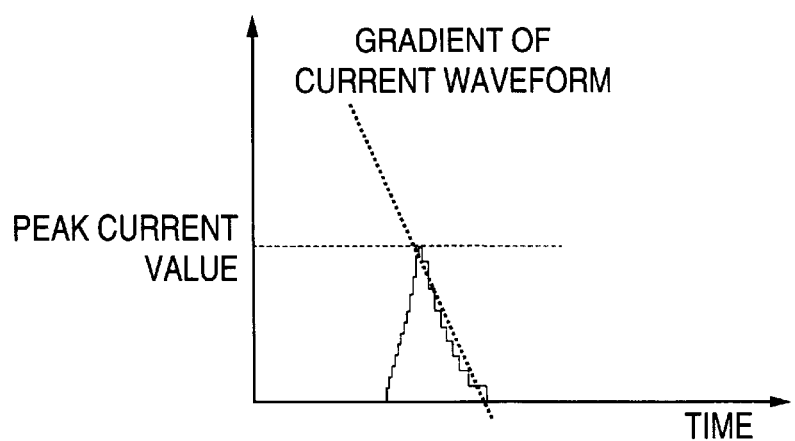
FIG. 58 is a view showing the EMI optimizing processing according to the sixth embodiment of this invention.

First, the peak current information is extracted from the EMI analysis result information of an object block acquired by sorting at the output unit of the computer system (step 5401). An example of the EMI analysis result information is shown in FIG. 56. From the information of FIG. 56, MH2 is sorted as a block with great EMI at the frequency component of 100 MHz. An example of the peak current information is shown in FIG. 58. The peak current information refers to the current information flowing through the power source line at the inlet of the block or instance. In this embodiment, it is assumed that the peak current information refers to the peak current and gradient of a current waveform which have been extracted as information.

Figure 59:
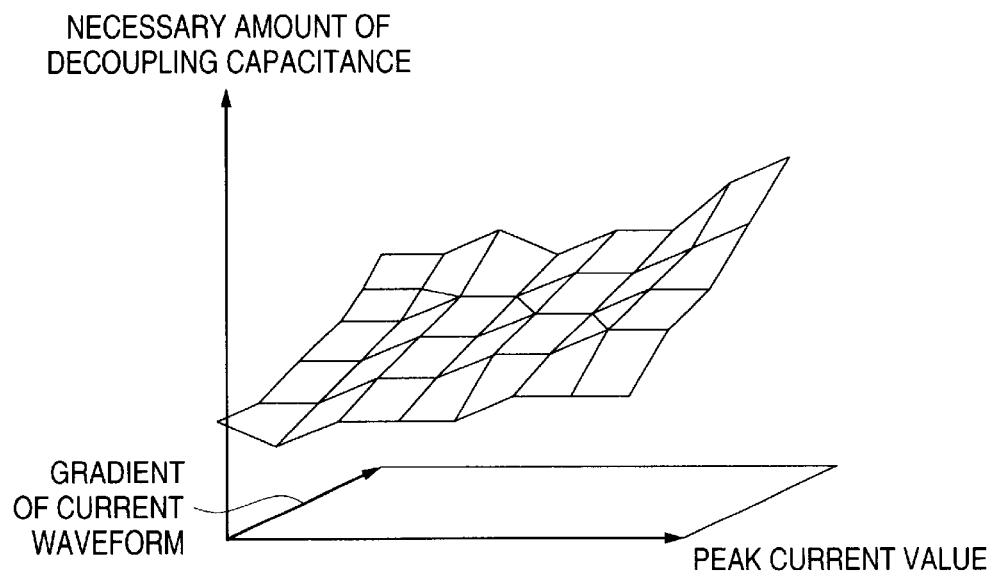
FIG. 59 is a view showing the EMI optimizing processing according to the sixth embodiment of this invention.
Figure 60:
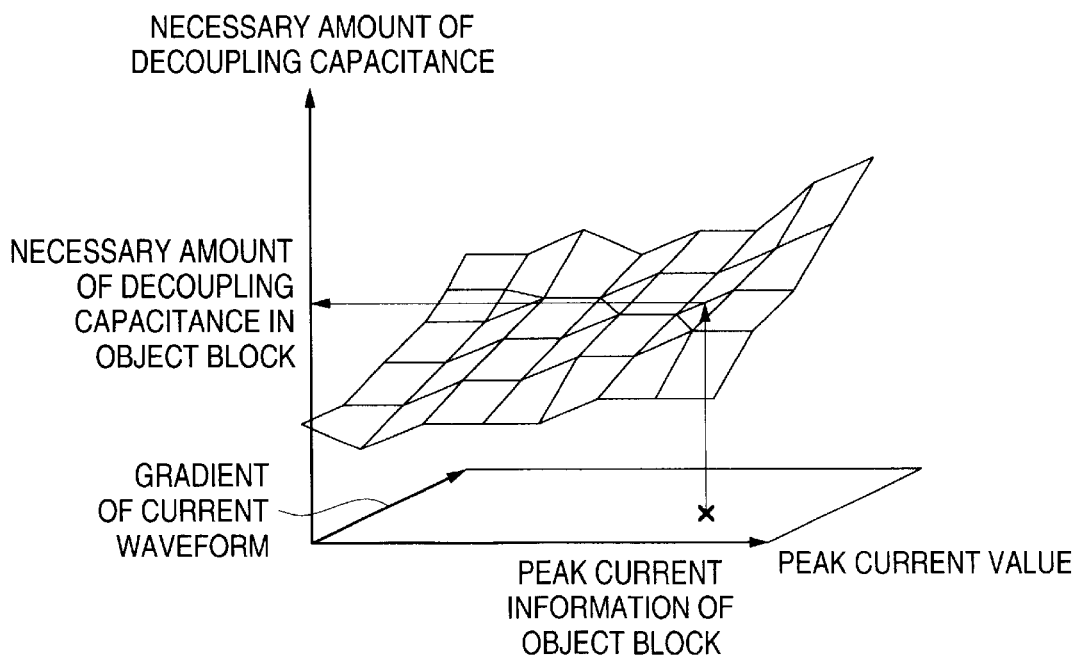
FIG. 60 is a view showing the EMI optimizing processing according to the sixth embodiment of this invention.

Meanwhile, FIG. 59 shows the relationship of the peak current vs. decoupling capacitance required to reduce the peak current. Using the data base DB1 (5402) of the relationship of the peak current vs. the decoupling capacitance, the amount of the decoupling capacitance required to reduce the EMI is computed as shown in FIG. 60 (step 5403).

Figure 61:
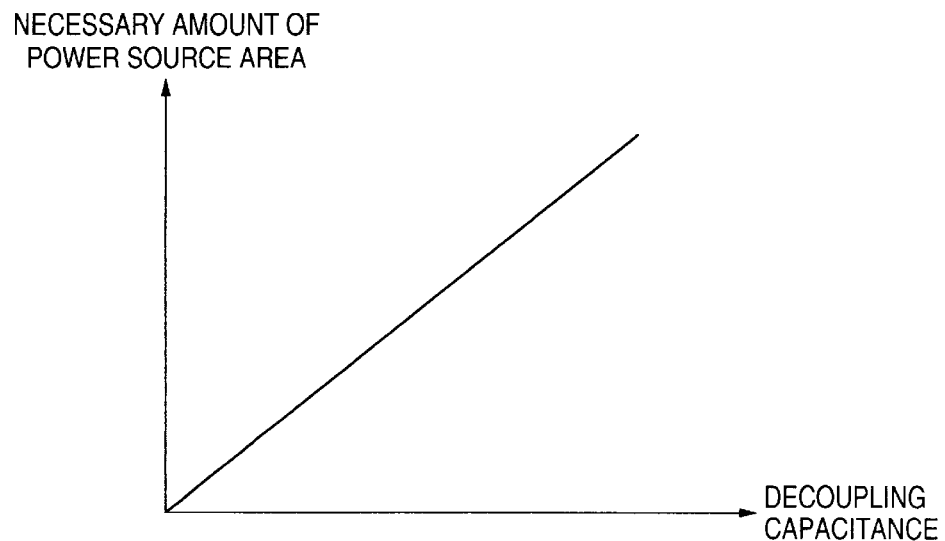
FIG. 61 is a view showing the EMI optimizing processing according to the sixth embodiment of this invention.
Figure 62:
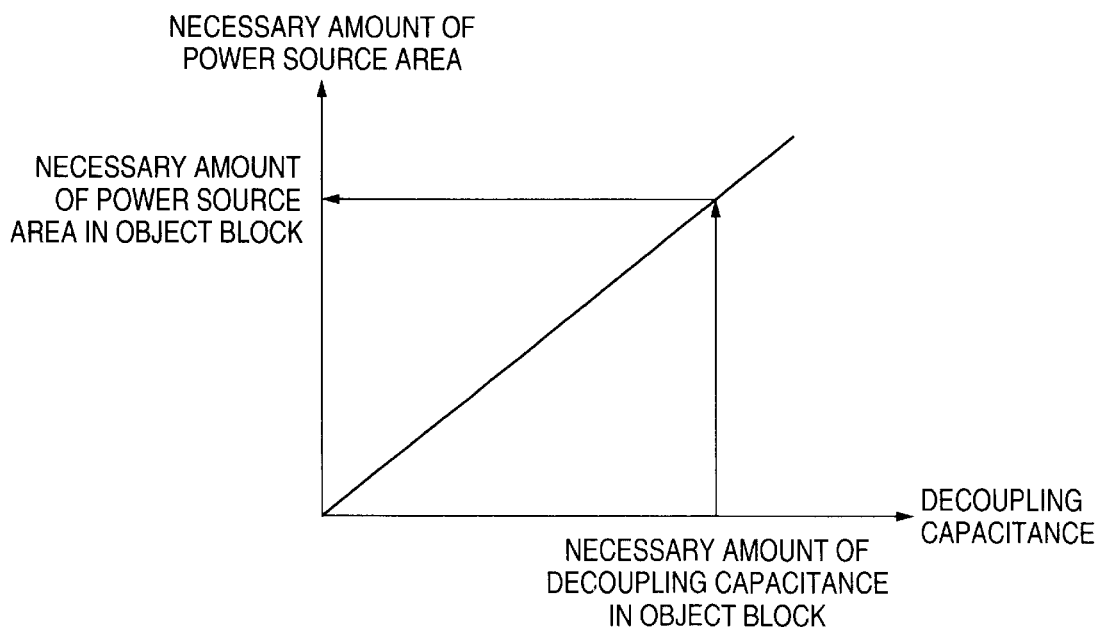
FIG. 62 is a view showing the EMI optimizing processing according to the sixth embodiment of this invention.

Meanwhile, FIG. 61 shows the relationship of the necessary decoupling capacitance of the object block thus acquired vs. the area of the power source line in which the decoupling capacitance is inserted. Using the data base DB2 (5404) of the relationship of the decoupling capacitance vs. the power source area, the required amount of the power source area is computed as shown in FIG. 62 (step 5405) (Incidentally, the power source area is defined as the area of the power source line in which the decoupling capacitance can be inserted).

Figure 63:
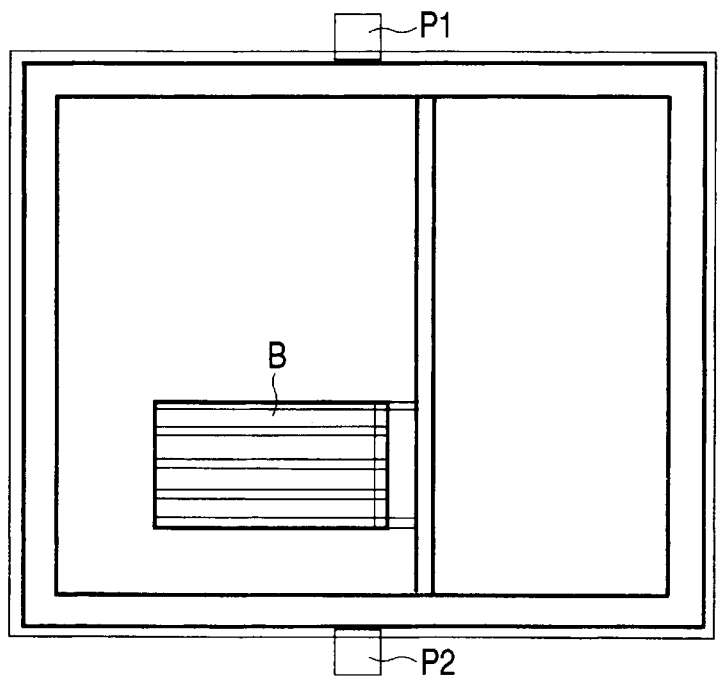
FIG. 63 is a view showing the EMI optimizing processing according to the sixth embodiment of this invention.
Figure 64:
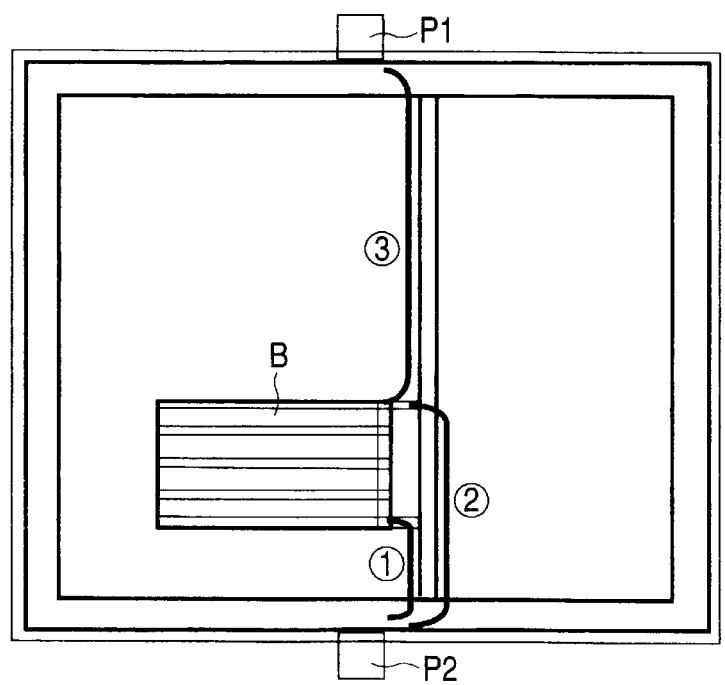
FIG. 64 is a view showing the EMI optimizing processing according to the sixth embodiment of this invention.
Figure 65:
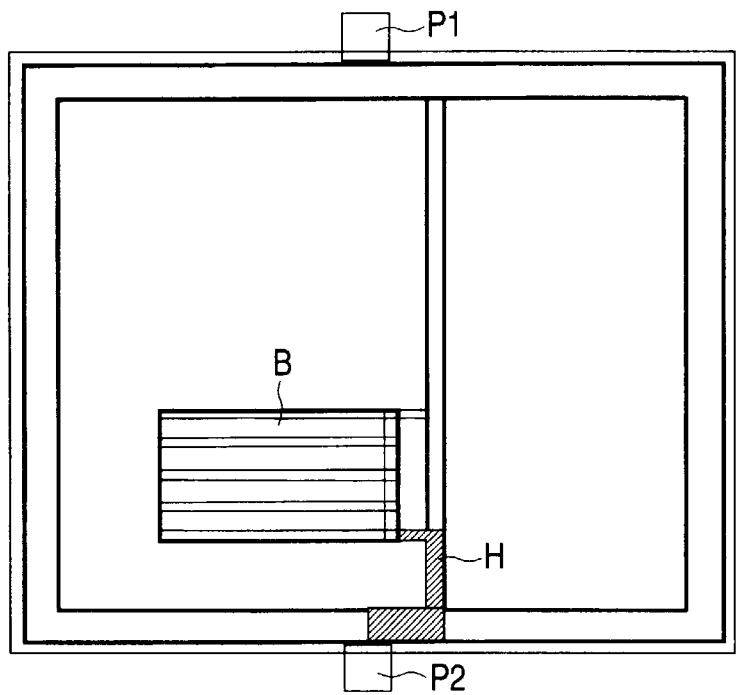
FIG. 65 is a view showing the EMI optimizing processing according to the sixth embodiment of this invention.

On the other hand, the data for layout are taken out from the data base (step 5407). In this embodiment, an object block R is located between electrode pads P1 and P2 on the opposite sides as shown in FIG. 63. On the basis of these data, current paths 1, 2 and 3 are determined in the order of a small resistance as shown in FIG. 64 (step 5408). As hatched by H in FIG. 65, the power source area of the first current path is computed (step 5408).

It is determined whether or not the power source area in where the decoupling capacitance is inserted has reached the necessary amount on the basis of the power source area of the first current path thus acquired and the necessary amount of the power source acquired from the peak current information of the object block. If not, the measure is executed for each path (step 5406). Since the current path is defined by the resistance, the peak current information can be computed for each current path in step 5401.

Figure 66:
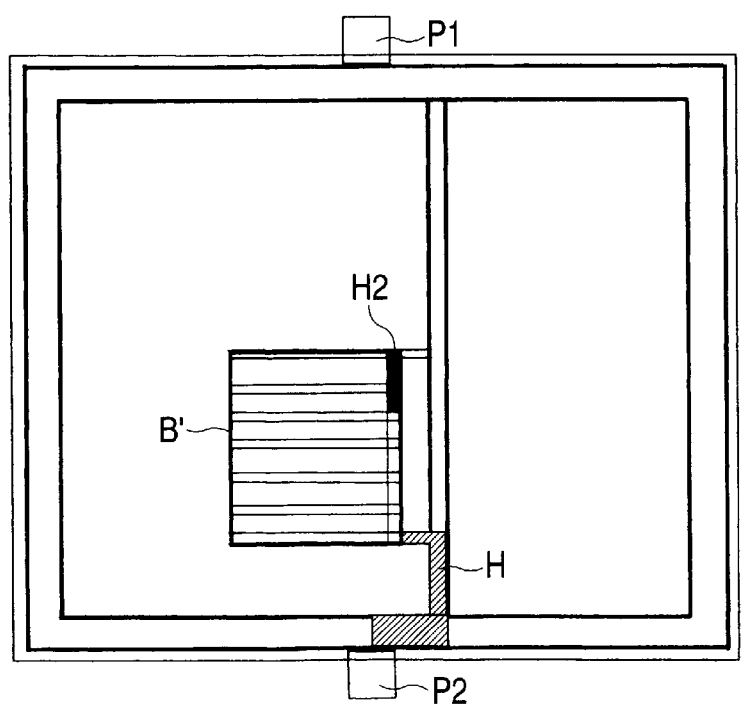
FIG. 66 is a view showing the EMI optimizing processing according to the sixth embodiment of this invention.

In order to increase the power source area by the power source area thus acquired, in an aspect ratio changing processing unit, the aspect ratio or the length/breadth ratio of the block shape is changed (step 5410). For example, if the length/breadth ratio of the object block is inverted as shown in FIG. 66, the block area is increased by the electrode area H2.

Figure 67:
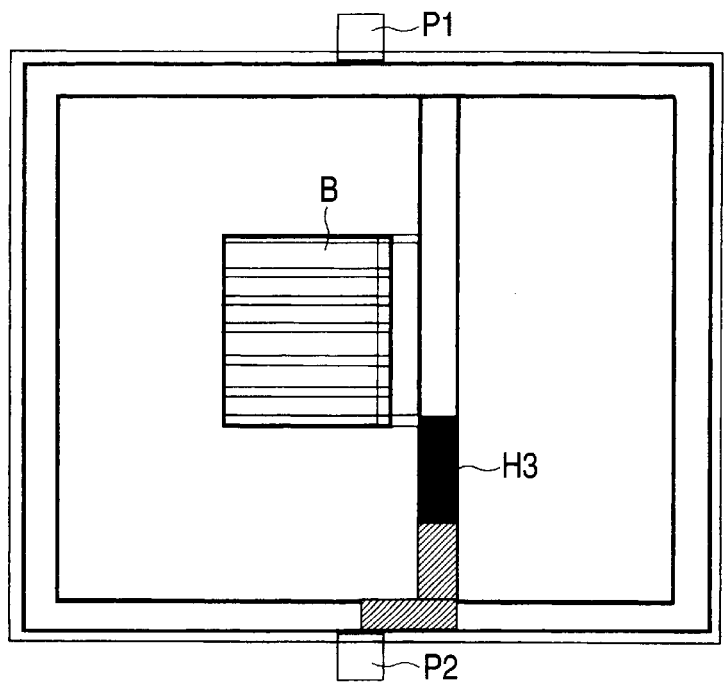
FIG. 67 is a view showing the EMI optimizing processing according to the sixth embodiment of this invention.

Further, in a block location changing processing unit, the location of the block is changed (step 5411). For example, as shown in FIG. 67, if the block location is separated from a second power source pad P2 to increase the power source line area of the first current path, the power source area is increased by the electrode area of H3.

Figure 68:
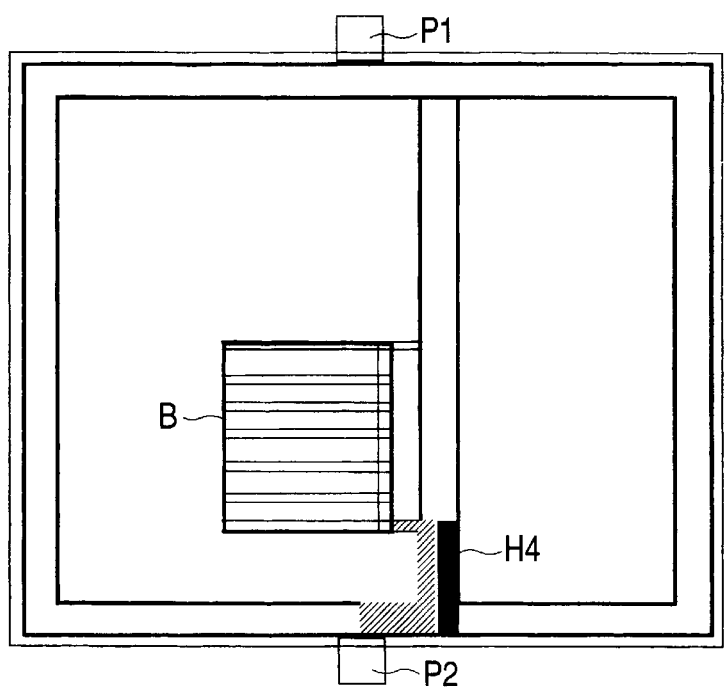
FIG. 68 is a view showing the EMI optimizing processing according to the sixth embodiment of this invention.

Further, in a power source line changing processing unit, the power source line is changed (step 5412). For example, as shown in FIG. 68, the line width is partially doubled to increase the power source line area of the first current path, the power source area is increased by the electrode area of H4.

In this way, in order to reduce the EMI, by the aspect ratio changing processing, block location changing processing and power source line changing processing, the power source area of the first current path in which the inserting effect of the decoupling capacitance is the greatest is increased. Then, it is determined again whether the necessary amount of the power source area has been satisfied (step 5413).

Figure 69:
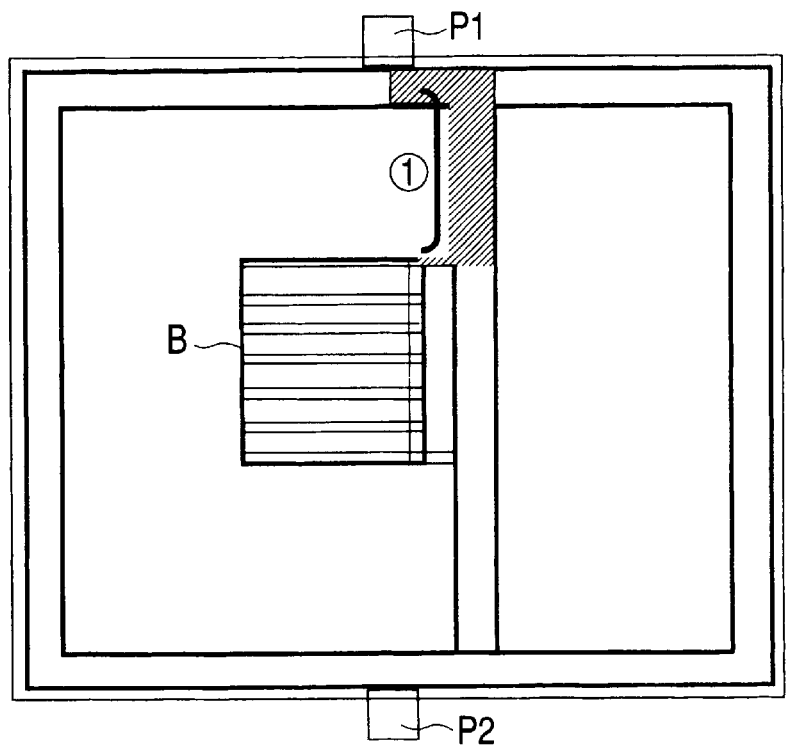
FIG. 69 is a view showing the EMI optimizing processing according to the sixth embodiment of this invention.

If it is determined that the necessary amount of the power source area has not been satisfied, the processing is returned to step 5408 where the current path is determined again. As shown in FIG. 69, if the position of the object block B is moved toward the first power source pad P1 by the above measure process so that the first current path is changed, the first current path thus newly determined becomes an object path. If the first current path has not been changed by the above measure process, the second current path becomes an object path. Further, in order to reduce the EMI for each path again, by the aspect ratio changing processing, block location changing processing and power source line changing processing, the power source area is increased to determine whether or not the necessary amount of the power source area is satisfied (step 5413). These steps are repeated until the determination of OK is made.

Generally, the measure for increasing the area which creates the decoupling capacitance of a chip is used as a technique for reducing the EMI. However, this has a demerit of increasing the chip area. In the power source line changing processing in this embodiment, the area to be subjected to the processing is limited on the basis of the analysis result, and the measure is executed for the necessary area by the necessary amount. Therefore, there is no fear that excessive measure leads to an increase in the area. Further, in the aspect ratio changing processing and block location changing processing in this embodiment, the measure for the EMI can be effectively executed without increasing the chip area.

In the previous embodiment, the power source area has been defined as the area of the power source line which can be an area in which the decoupling capacitance is inserted. However, by showing the current path to which the decoupling capacitance belongs, the power source area can be defined as being the area where the decoupling capacitance is inserted, and dealt with as such an area.

In this way, the processing for reducing the EMI at the time of floorplan is executed. On the other hand, the measure in the processing unit of reducing the EMI will be executed at the time of layout or cell arrangement in the entire processing flow explained in FIG. 53 as follows.

Figure 70:
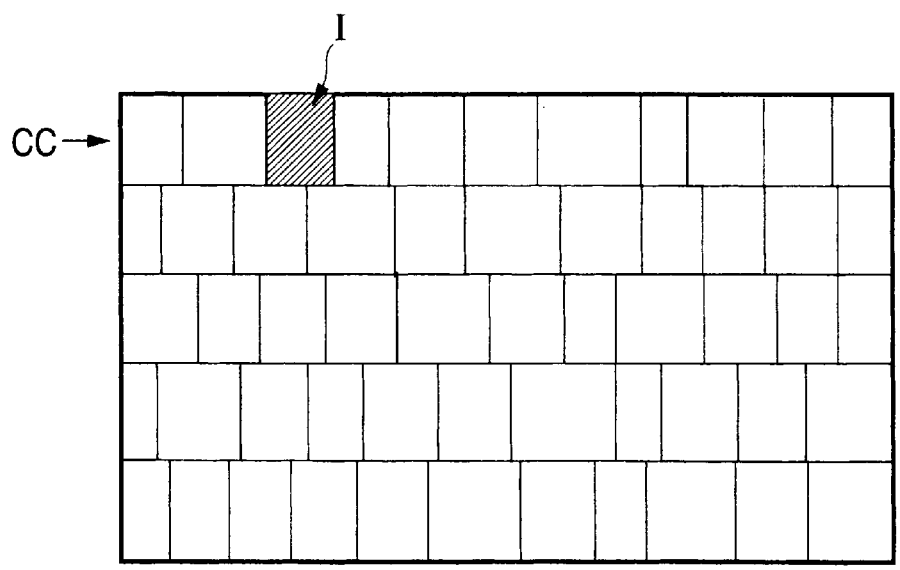
FIG. 70 is a view showing the EMI optimizing processing according to the sixth embodiment of this invention.
Figure 71:
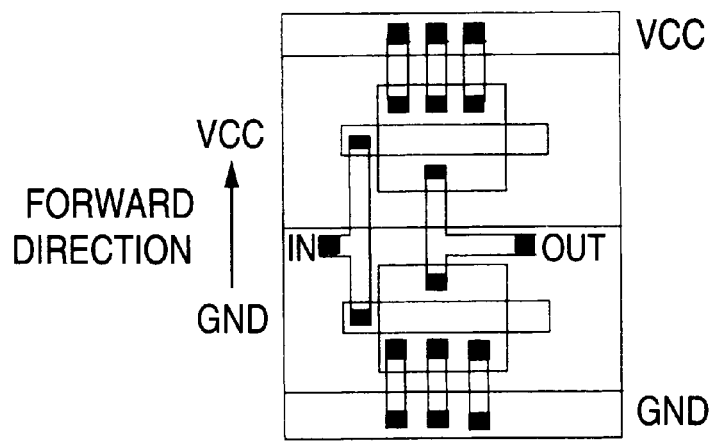
FIG. 71 is a view showing the EMI optimizing processing according to the sixth embodiment of this invention.
Figure 72:
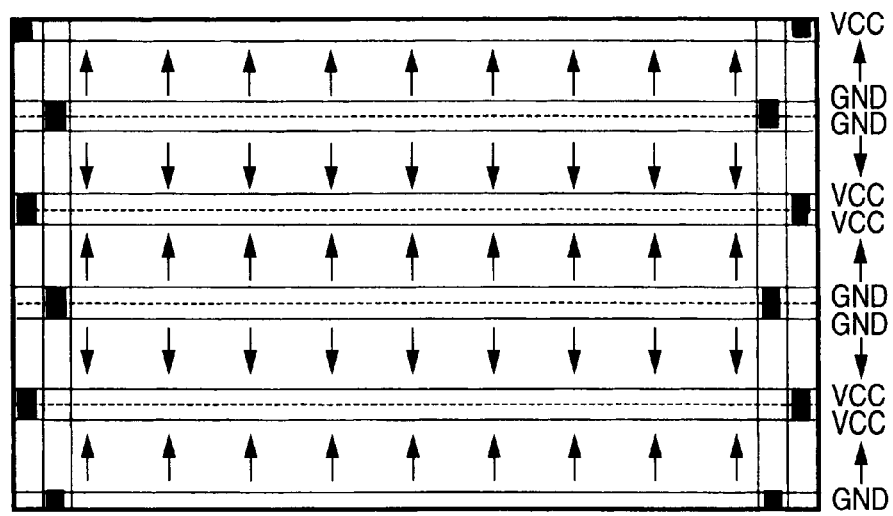
FIG. 72 is a view showing the EMI optimizing processing according to the sixth embodiment of this invention.

The step for this measure is shown in FIG. 55. FIG. 56 shows an example of the sorted result information of the instance for which the measure should be made. In the example of FIG. 56, as instances with great EMI at the frequency component of 100 MHz, X102.XM123.MH2 and X178.XM123.MH2 are sorted. Meanwhile, in a block whose example is shown in FIG. 70, each instance has a power source line and a grounding line as shown in FIG. 71. Generally, in order to facilitate the drawing of the power source, as shown in FIG. 72, in most cases, each cell line takes a "double back arrangement" i.e. in which the grounding lines and the power source lines are arranged at the same side. Therefore, by inverting the one cell line so that the power source lines and grounding lines of the adjacent cell lines are arranged apart from each other by a prescribed interval c, the decoupling capacitance is created between the adjacent power source line Vcc and grounding line GND.

In this way, the decoupling capacitance can be created in plane.

Figure 57:
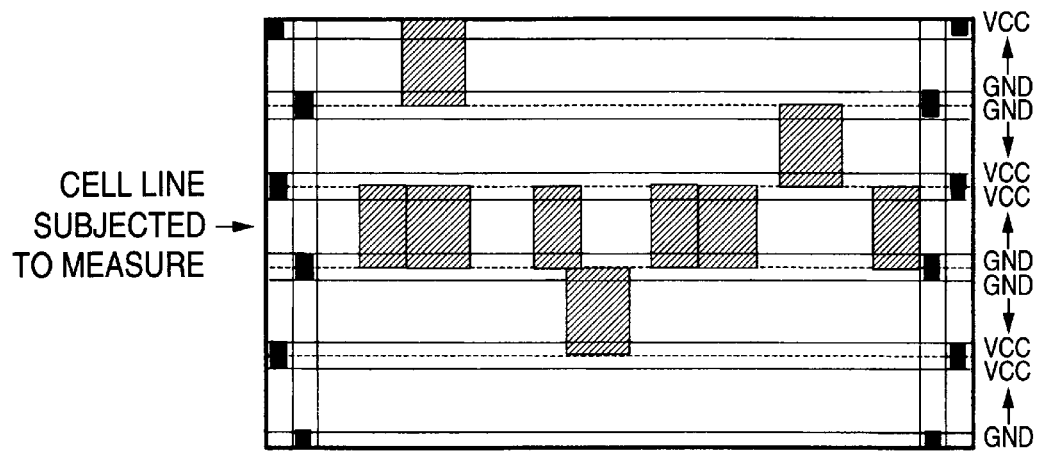
FIG. 57 is a view showing the EMI optimizing processing according to the sixth embodiment of this invention.

Using this fact, the sorted result information of the instance for which the measure should be made is extracted (step 5501). A cell line which is to release the double back, i.e. used to create planar decoupling capacitance by its inversion (step 5502). FIG. 57 is a view for explaining the inversion of the cell line. Assuming that the measure should be made for a hatched instance, the cell line with the most instances to be subjected to the measure is determined.

By releasing the double-back (step 5503), the decoupling capacitance can be increased.

Figure 73:
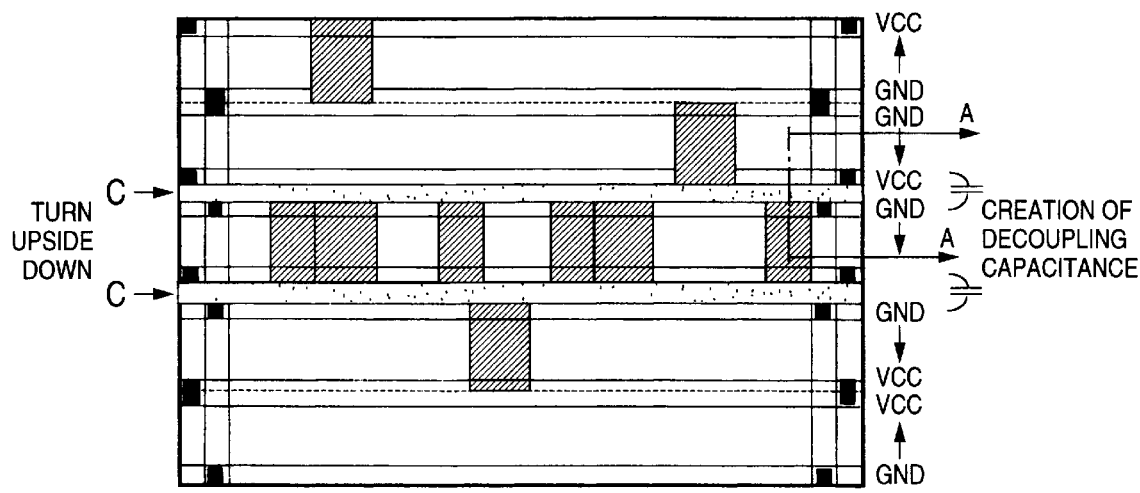
FIG. 73 is a view showing the EMI optimizing processing according to the sixth embodiment of this invention.
Figure 74:
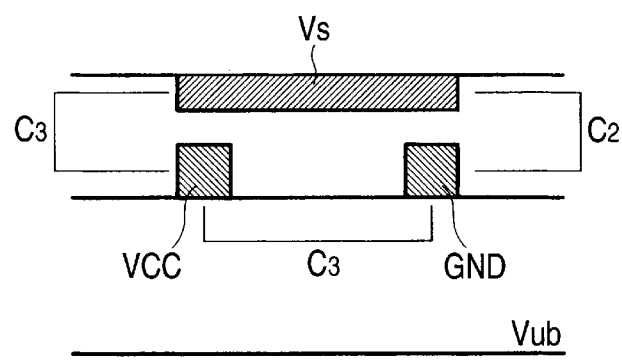
FIG. 74 is a view showing the EMI optimizing processing according to the sixth embodiment of this invention.

In the embodiment described above, in order to reduce the EMI, the planar decoupling capacitance was created by releasing the double-back or inverting the pertinent cell line. Otherwise, as seen from FIG. 74 which is a sectional view taken in line A—A in FIG. 73, an additional line line Vs is arranged above or below a grounding line and a power source line through an insulating film so that it holds an intermediate potential between those of the grounding line and power source line, whereby three decoupling capacitances can be added between the power source line and the additional line lien, between the power source line and the additional line line and between the power source line and the grounding line. Thus, the decoupling capacitance can be easily formed within a minute area. Further, the decoupling capacitance can be formed at the position nearest to the object instance so that this position is an effective position of inserting the decoupling capacitance where the effect of the measure can be easily shown.

Figure 54:
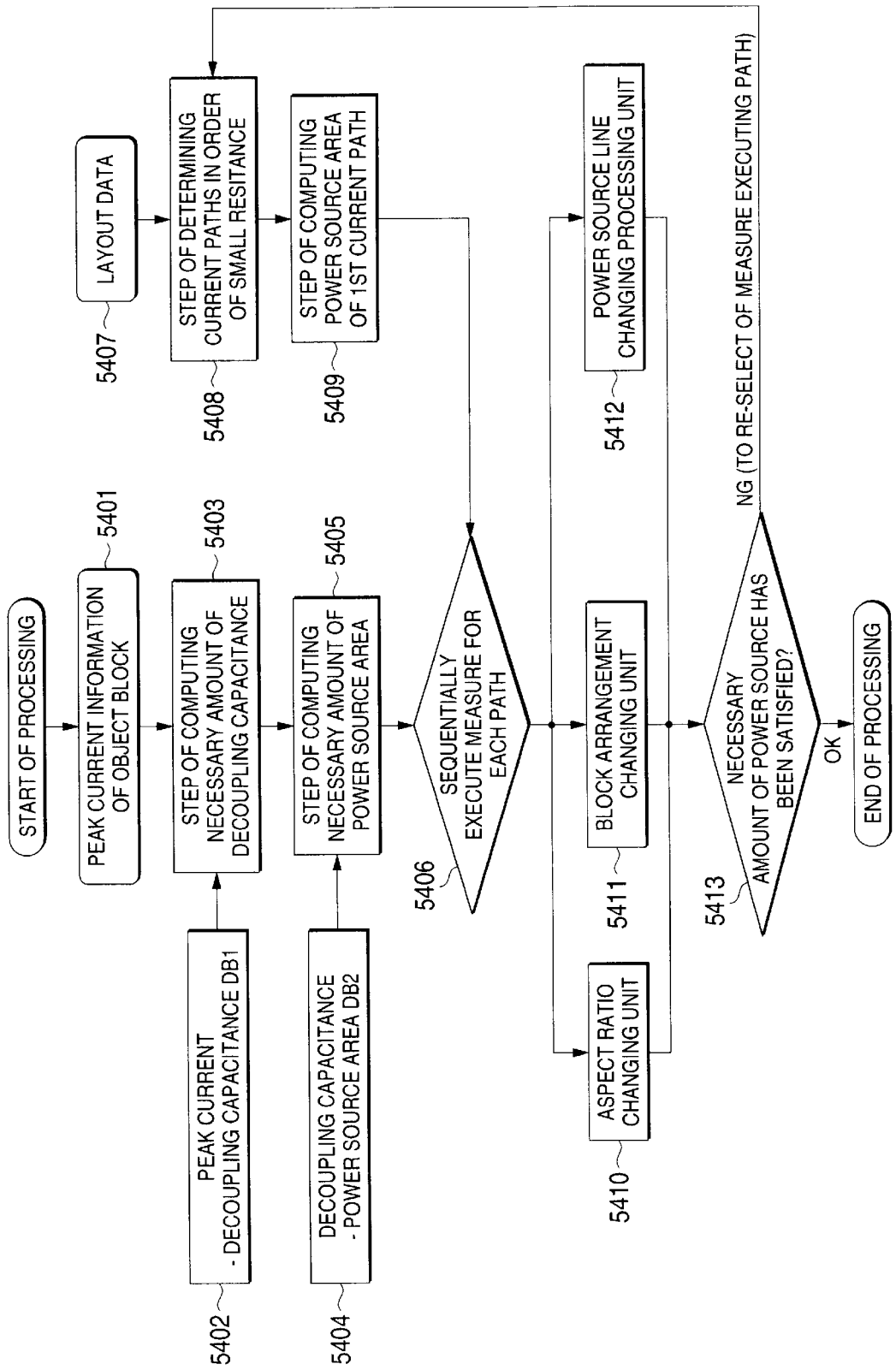
FIG. 54 is a flowchart showing the processing step in a floorplan in an EMI optimizing step according to the fifth embodiment of this invention.

The necessary amount of the power source area which is computed in the process from step 5401 to step 5405 in FIG. 54 can be easily used in the processing of reducing the EMI in the layout or cell arrangement. Since the degree to which the measure should be made can be known, an excessive increase in the area can be avoided.

Incidentally, the decoupling capacitance is determined according to the width of the power source line of the object chip and status of a peripheral circuit.

This power source line width information takes into consideration:

the presence/absence of a ling power source line formed on the periphery of the chip, which is estimated at the stage of the specification, or determined by the floorplan, and the width thereof;

the width of a stem power source line arranged between the respective modules, which is estimated at the stage of the specification, or determined by the floorplan;

the width of a trap power source formed between the respective modules, which is estimated at the stage of the specification, or determined by the floorplan;

the presence/absence of the decoupling capacitance cell formed below the power source line, which is estimated at the stage of the specification, or determined by the floorplan, etc.

The power source line width information preferably contain these values as data. However, it is not required to contain all these components.

Embodiment 6

An explanation will be given of a user interface for facilitating the optimizing step as described above.

The conventional EMI analysis means in the LSI generally adopts a technique of reporting only the FFT result. However, this technique has a disadvantage that it takes a long time to determine the position of the cause of noise.

In order to obviate such an inconvenience, this embodiment adopts a technique of executing the FFT for the current waveform for each of instances as an interface and sorting the names of the instances in order from the greater noise of each current frequency component. This facilitates the optimizing processing.

Figure 75:
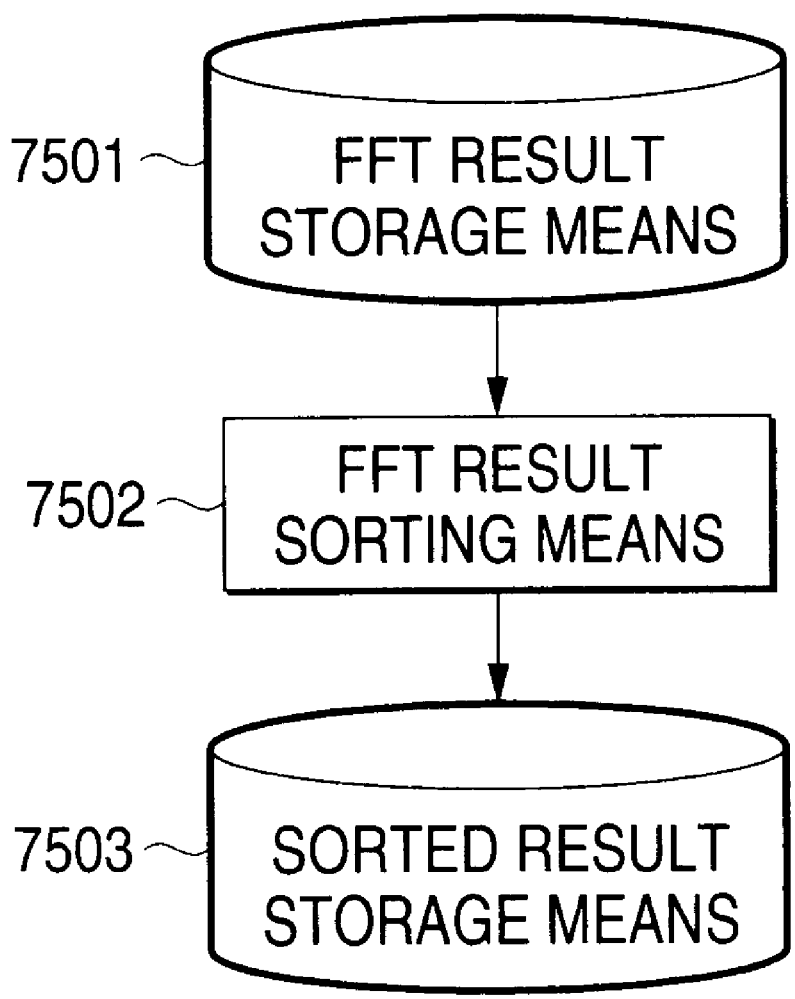
FIG. 75 is a block diagram showing an arrangement for realizing the EMI analyzing method according to the seventh embodiment of this invention.

FIG. 75 shows the arrangement of an EMI analysis apparatus according to the sixth embodiment of this invention. The EMI analysis apparatus includes a FFT result storage means 7501, FFT result sorting means 7502 and a sorting result storage means 7503.

The FFT result storage means 7501 and the sorting result storage means 7503 are allotted to the external storage device of the above computer system.

On the other hand, the FFT result sorting means 7502 is stored in the input/output computing unit as a group of programs having the steps corresponding to the respective elements.

An explanation will be given of the respective components which constitutes the EMI analysis device as shown in FIG. 75, and of the procedure of analyzing the EMI using the FFT result information shown in FIG. 76.

The FFT result storage means 7501 previously stores the FFT result information as shown in FIG. 76.

The FFT result information includes the frequency of the FFT result and current frequency component for each of instances.

The sorting result storage means 7503 stores the sorting result computed by the FFT result sorting means 7502 as shown in FIG. 77.

The sorting result information is constructed of one or more items of the FFT result information of an object circuit, which includes the name of the instance and the current frequency component for each of the frequencies.

Figure 78:
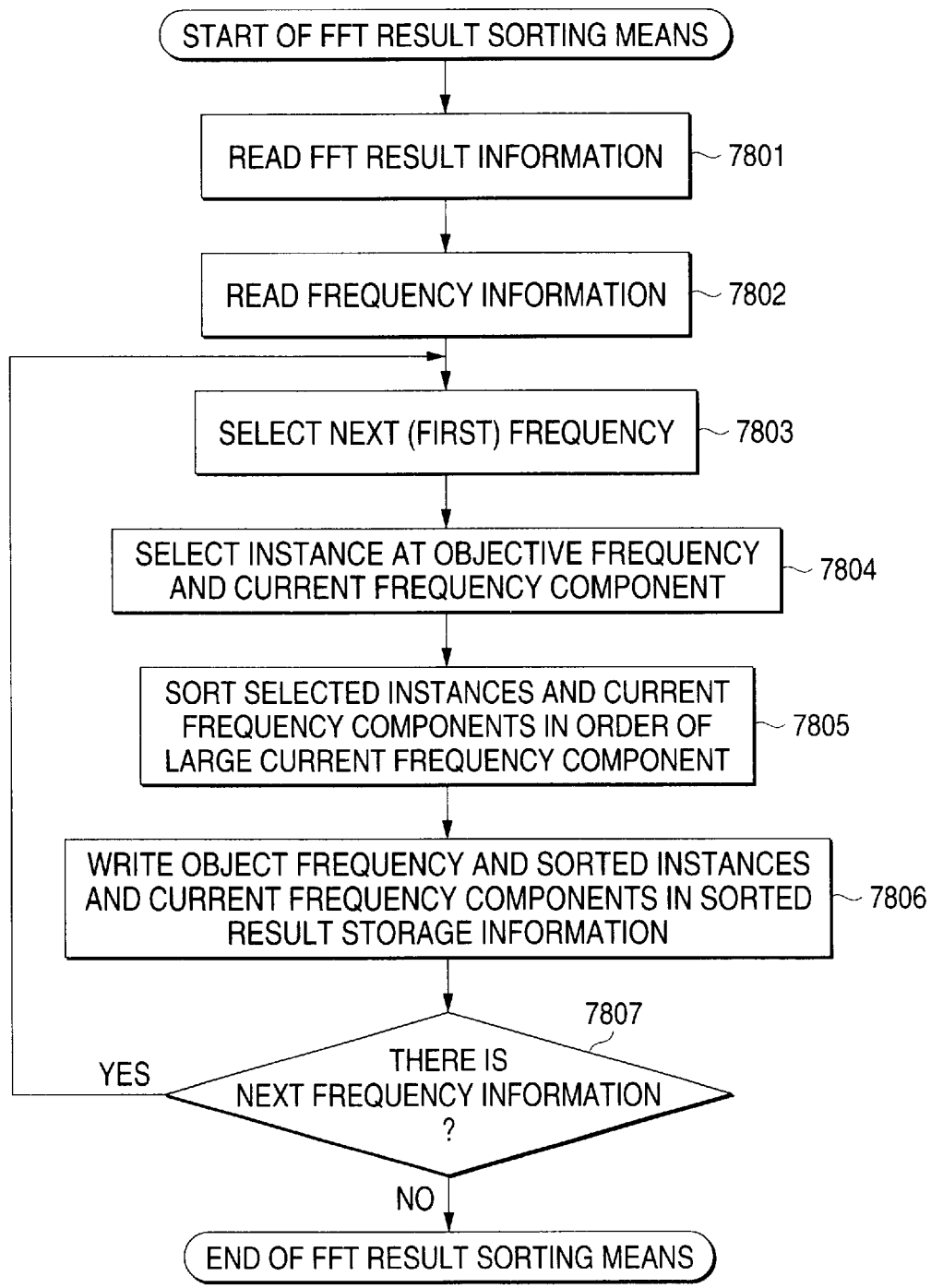
FIG. 78 is a flowchart of the FFT sorting means in the seventh embodiment of this invention.

The FFT result sorting means 7802 executes the analysis in the flowchart as shown in FIG. 78.

In step 7801, the FFT result information as shown in FIG. 76 stored in the FFT result storage means 7501 is read.

In step 7802, the frequency information in the FFT result information is read, and in step 7803, the first frequency is selected.

In step 7804, all the instances and the current frequency components corresponding to the above object frequency are selected.

In step 7805, the selected instances and current frequency components are sorted in order from a larger current frequency component.

In step 7806, the object frequency, sorted instance names and current frequency components are written in the sorting result storage information. In this case, as occasion demands, they may be displayed in the form as illustrated in FIG. 56 or in the data as illustrated in FIG. 79.

The steps from step 7804 to step 7806 is repeated until the processing of all items of frequency information described on the FFT result information is completed. Upon completion, the processing by the FFT result sorting means is completed.

By the technique described above, as a user interface, the FFT is executed for the current waveform for each instance so that the instance names are sorted in order from the current frequency component with greater noise. Thus, the instance that influences the noise can be specified.

Figure 79:
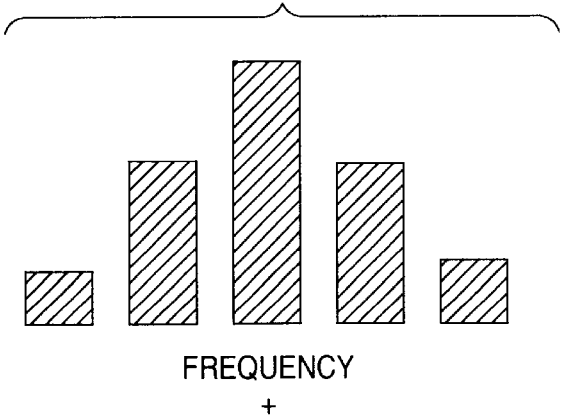
FIGS. 79(a)–79(c) show the views showing the display of the FFT result in the seventh embodiment of this invention.
Figure 79:
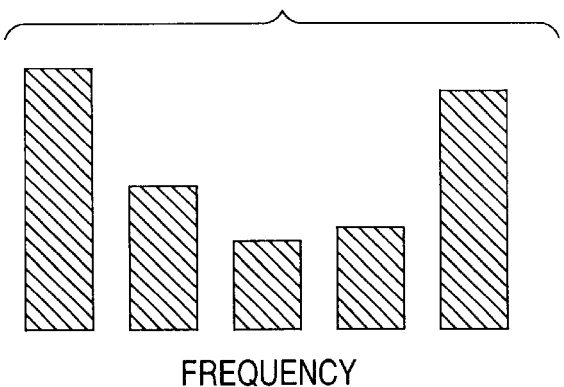
Figure 79:
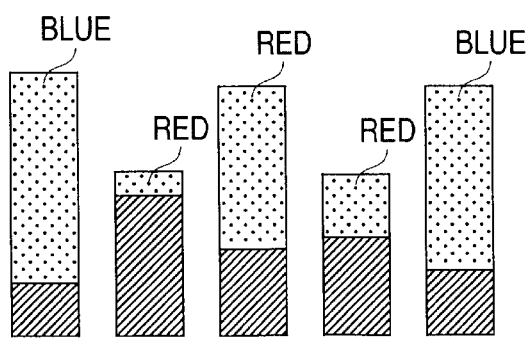

In the display of the FFT result, as shown in FIGS. 79(*a*) to (*c*), the FFT result is shown simultaneously before the measure (a), after the measure (b) and before/after the measure (c), the improvement for each frequency can be made clear. Display of the color identification of the differences permits the degree of the effect for the frequency component at issue to be determined quickly.

Embodiment 7

An explanation will be given of the user interface for facilitating the optimizing step as described above.

In the conventional EMI optimizing step in the LSI, the technique of reporting only the result was generally adopted. However, this technique presents a problem that it takes a long time to know the processing from various data inclusive of the circuit data and netlist and determine the subsequent step.

In this embodiment, in order to solve such a problem, the display step is provided for each step as a user interface so that the processing can be executed with the user's judgment. FIGS. 79 to 83 are views illustrating examples of the display.

As an example, the processing of changing the data will be explained.

The display means for executing this display step is stored as a group of programs having the steps corresponding to the respective elements in an input/output computing unit of a computer system of each functional means, and permits sequential display.

Figure 80:
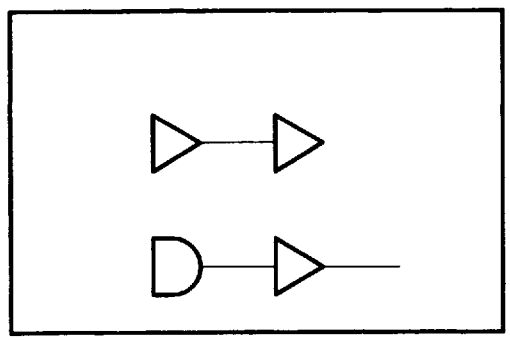
FIGS. 80(a)–80(c) show the views showing a display example of circuit data in the seventh embodiment of this invention.
Figure 80:
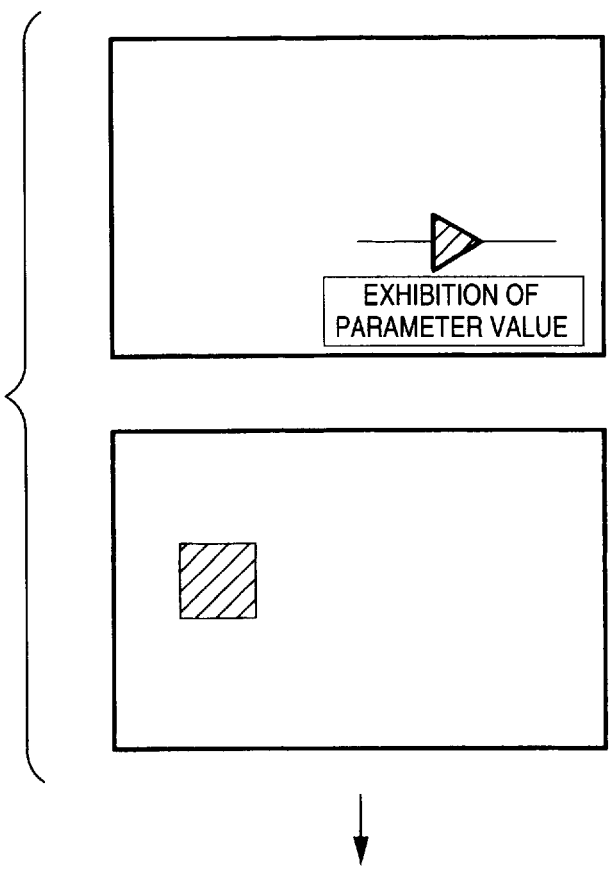
Figure 80:
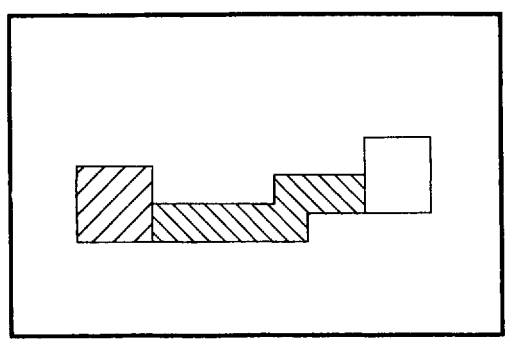
Figure 84:
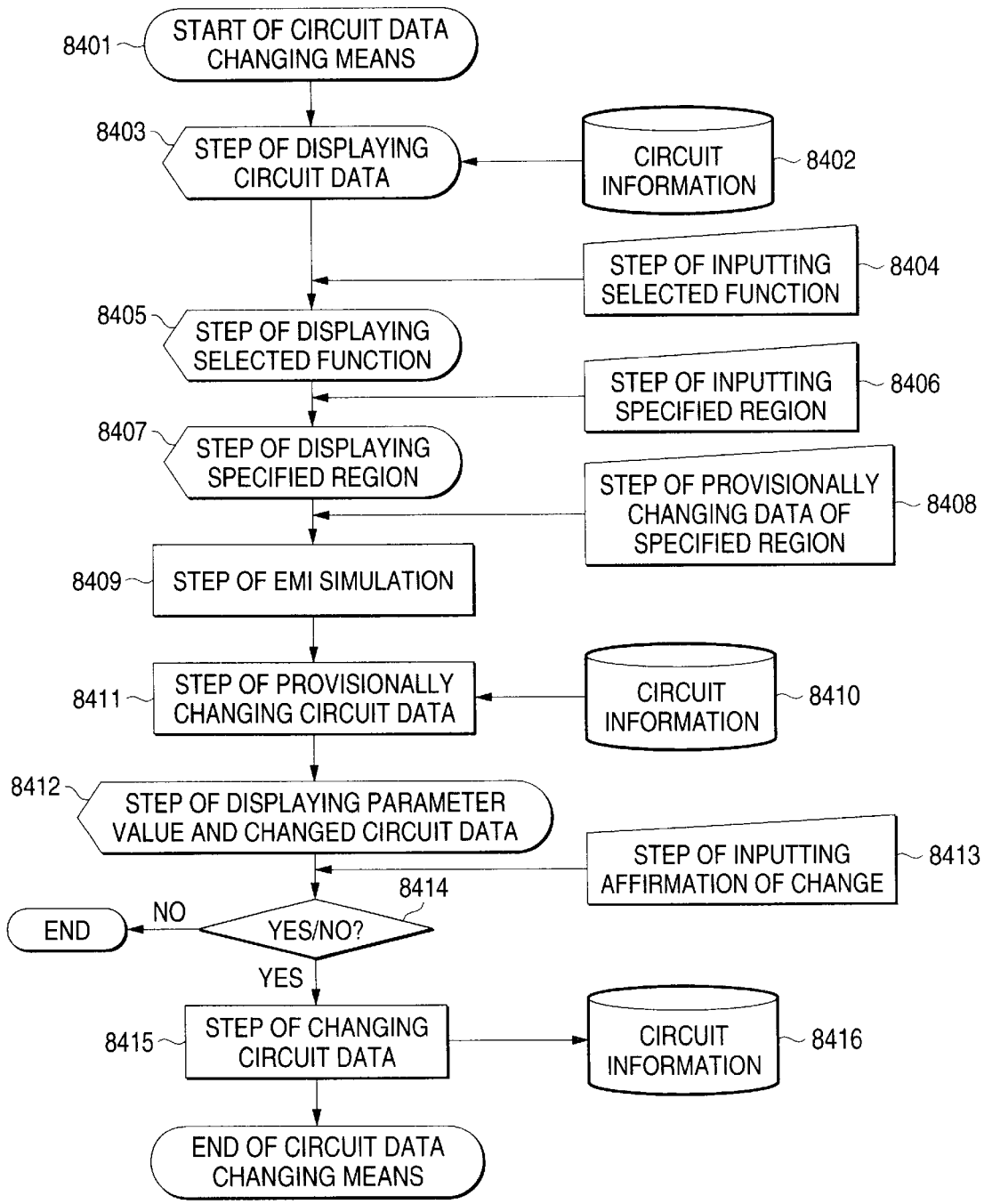
FIG. 84 is a flowchart of the processing of changing circuit data according to the seventh embodiment.

In FIG. 84, after the changing step is started by the circuit data changing means (step 8401), the position of the circuit data for which a change is required as shown in FIG. 80(*a*) is highlighted via step 8402 of extracting the circuit information (step 8403).

In a function selection inputting step (step 8404), when the function selection, e.g. either data change or parameter change should be selected, is done, the selecting function is displayed in a selecting function display step (step 8405).

In a specified region inputting step (step 8406), if the region corresponding to specified information is inputted, the specified region is displayed in the specified region displaying step (step 8407).

If the data change is selected in the function selection, judgment is made on the basis of the displayed information. In a specified region data provisional changing step (step 8408), if changing the circuit data is instructed by a specified region provisional changing step (step 8408), EMI simulation is executed correspondingly (step 8409).

The circuit information is read again (step 8410). The result of the circuit data provisional changing (step 8411) instructed by the specified region data provisional changing step (step 8408) and the parameter values corresponding to the circuit data are displayed in a displaying step (step 8412).

As seen from FIG. 80(*b*), the displayed data are adapted so that when an area that the user wants to select is selected, the screen for confirming the parameter value is displayed and thereafter the parameter is displayed. As seen from FIG. 80(*c*), another area related to the area at issue may be displayed.

Figure 81:
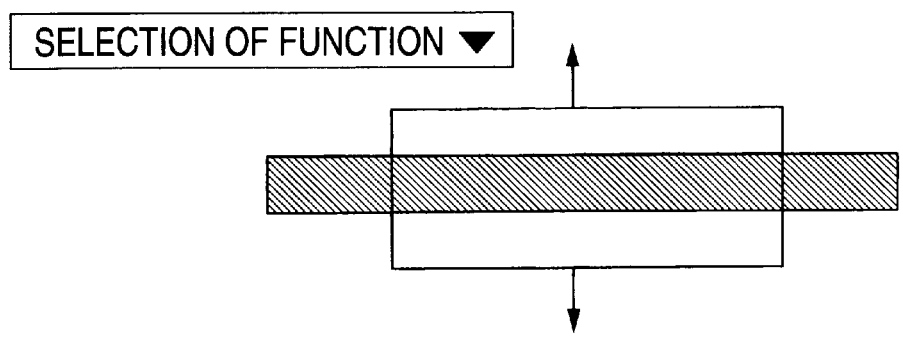
FIGS. 81(a)–81(b) show the views showing a function display in the seventh embodiment of this invention.
Figure 81:
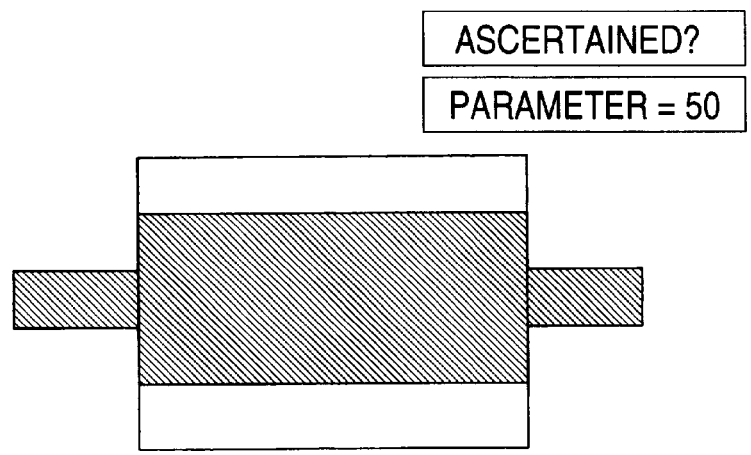

For example, in the step of displaying the selected function (step 8405), if the function of widening the line width is selected, the selected function is displayed on the screen as shown in FIG. 81(*a*) so that an internally computed parameter value is displayed as shown in FIG. 81(*b*) as a confirmed image.

Figure 83:
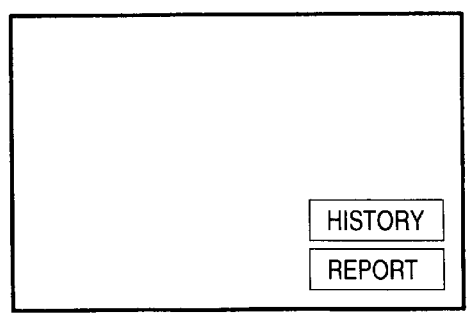
FIG. 83 is a view showing a report output in the seventh embodiment of this invention.

It is also efficient to permit the history of the processing such as a problem solving technique to be produced as a report. It is also possible to produce the processing result report as a file. FIG. 83 is a view showing an example of the display screen. B1 denotes a history display button, and B2 denotes a report display button. Pushing these buttons implements the corresponding displays.

Under the various displays thus made, the after-change affirmation inputting step (step 8413) is executed. In decision step 8414, if "YES" is selected, the circuit data is changed (step 8415) so that the circuit information 8416 is updated.

In accordance with the technique as described above, the operator can perform the optimizing step while seeing the display. Thus, the optimizing processing of the EMI can be executed with good workability and great accuracy.

Embodiment 8

In the previous embodiment, an explanation has been given of the processing of changing the circuit data by provisionally changing the data of the specified region. In the case of the step of changing the parameter value, the following display is executed.

Figure 82:
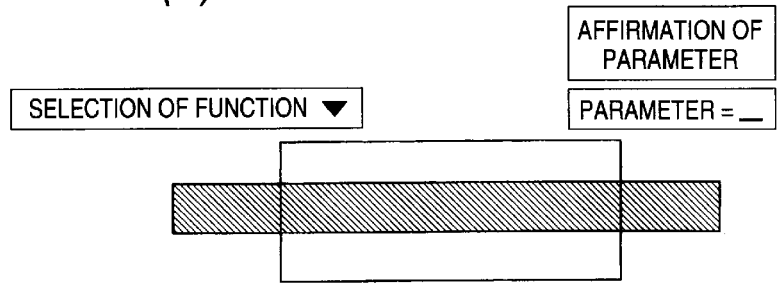
FIGS. 82(a)–82(c) show the views showing a function display in the seventh embodiment of this invention.
Figure 82:
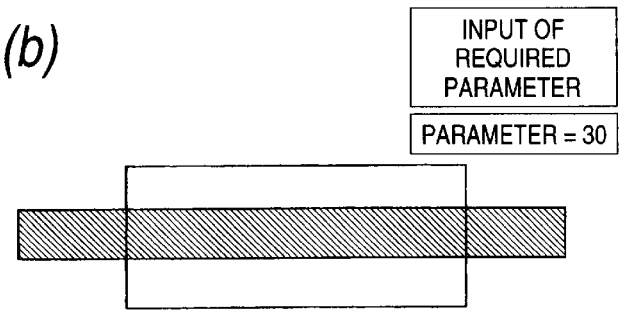
Figure 82:
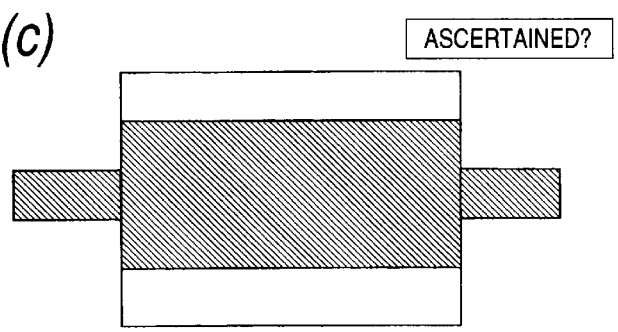

First, if the function selection is done, the function selection display is made on the screen as shown in FIG. 82(*a*). If a desired parameter value is inputted on the screen as shown in FIG. 82(*b*), the circuit data is changed to display an affirmation screen as shown in FIG. 82(*c*).

Figure 85:
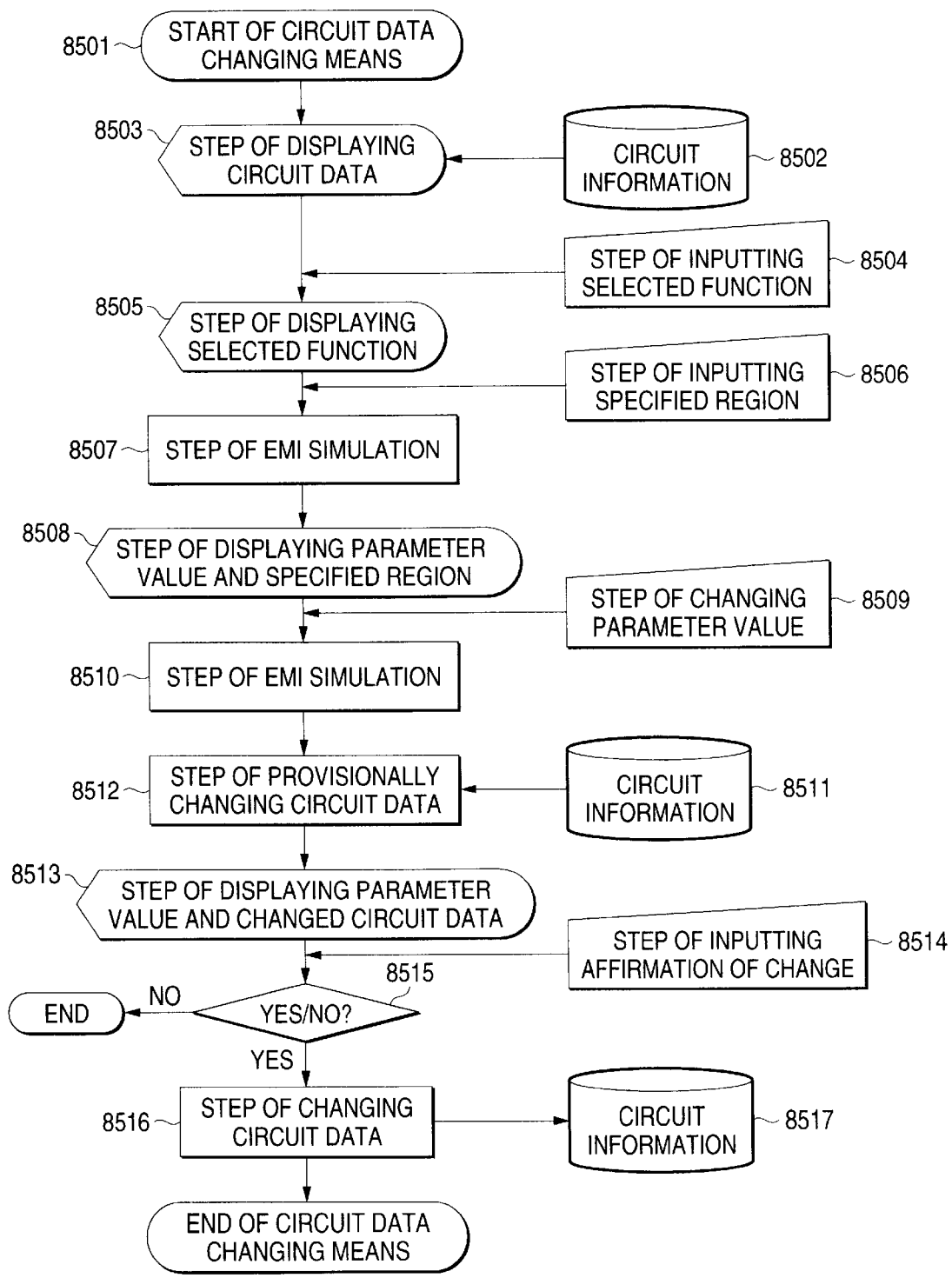
FIG. 85 is a flowchart of the processing of changing circuit data according to the eighth embodiment.

FIG. 85 shows the flowchart for changing the circuit data in the manner described above.

In this embodiment, the steps similar to those in the process of changing the circuit data as shown in FIG. 84 are used. Specifically, in the seventh embodiment, after the specified region inputting step 8406 has been executed, the EMI simulation step 8408 was executed via the specified region display step 8407. In contrast, in this embodiment, instead of the specified region displaying step 8407, as shown in FIGS. 81(*a*) and 81(*b*), a step of executing EMI simulation (step 8507) in the changed state, a step of displaying the parameter value and specified region (step 8508) and a step of changing the parameter value according to the display result (step 8509) are executed. Thereafter, a step of the EMI simulation (step 8510) (that corresponds to the EMI simulation step 8409 in FIG. 84) is executed.

Embodiments 9 and 10

Figure 86:
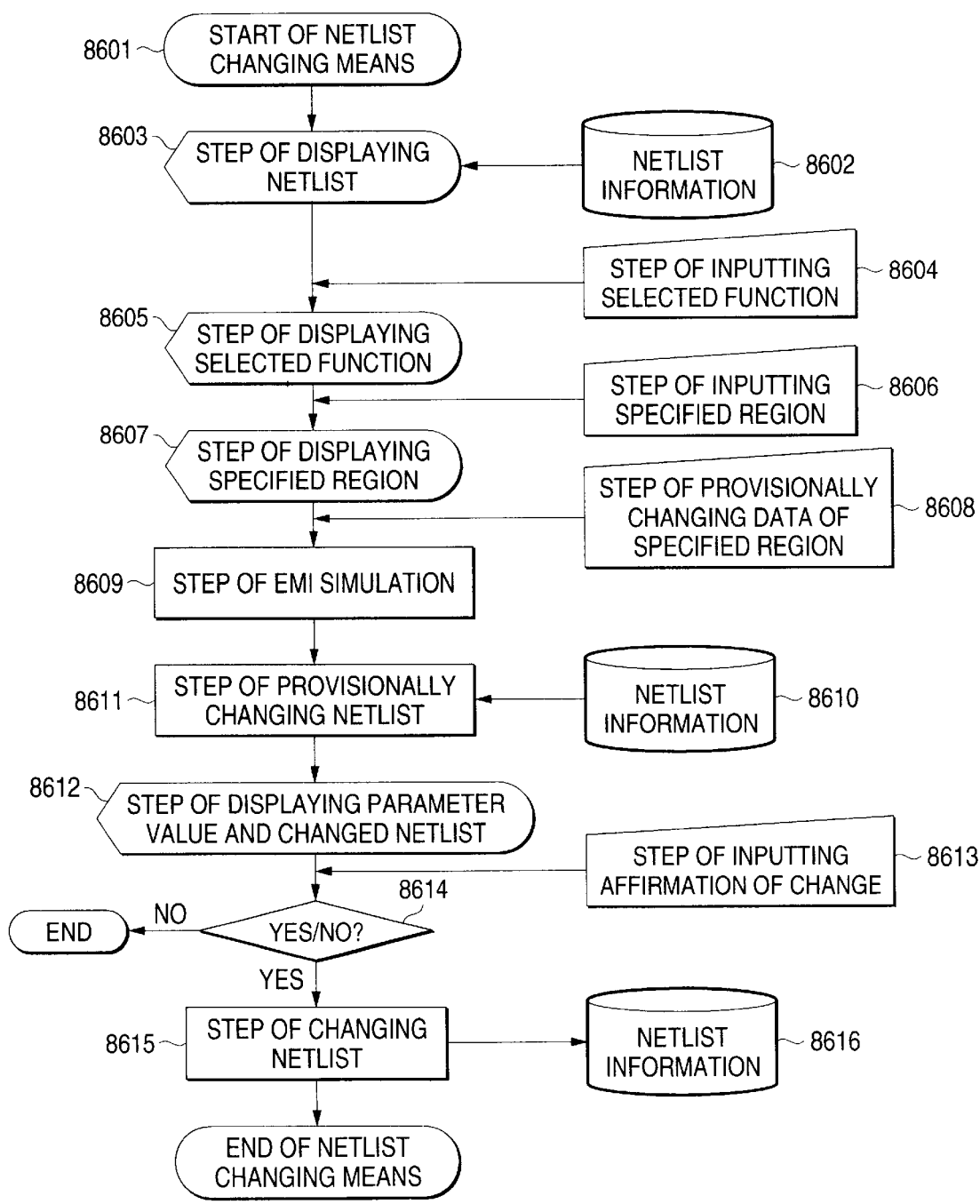
FIG. 86 is a flowchart of the processing of changing circuit data according to the ninth embodiment.
Figure 87:
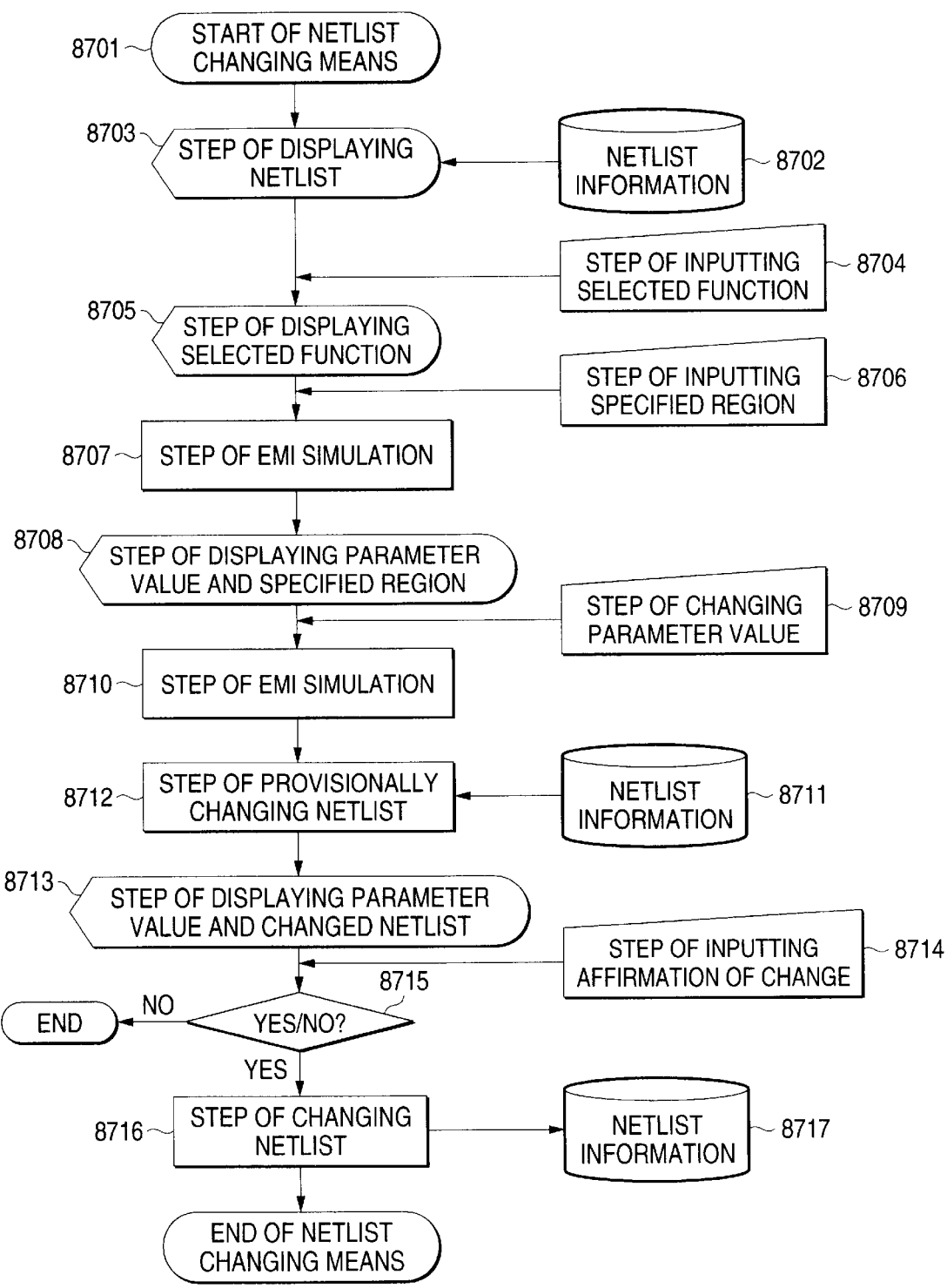
FIG. 87 is a flowchart of the processing of changing circuit data according to the tenth embodiment.

In the embodiment described above, an explanation has been given of the process of changing the circuit information. This can be applied to the process of changing the netlist. FIGS. 86 and 87 show the process of changing the netlist.

In the embodiments described above, the explanation has been given of the techniques of optimizing after the EMI analysis and facilitating the optimization. These techniques are efficient for the technique of the EMI analysis as described below. Since the technique described below permits the analysis at a higher speed and with great accuracy, excellent optimizing processing can be realized.

Incidentally, the optimizing at full automation cannot be actually realized. Therefore, using the information peculiar to the EMI (that teaches the quantity of noise originating from each instance for a certain frequency), the best optimizing method must be selected and determined in an interactive manner with a user.

Thus, the efficient optimizing can be realized.

Embodiment 11

An explanation will be given of a EMI analysis method used when the above optimizing processing is executed. The analysis method described below can be applied to any of the first to tenth embodiments described above.

FIG. 1 is a conceptual view of the entire arrangement of the EMI analysis device for executing the EMI analysis method according to this invention.

This EMI analysis device is characterized in that the circuit information 101 of the LSI chip at issue is supplemented with analysis control information of at least one item of the power source information of the power source for supplying a current to the LSI chip, package information of the package of the LSI chip and measurement system information of a measurement system for measuring the characteristic of the LSI chip to make the rough estimation of the total information including the circuit information and the analysis control information as an equivalent circuit, and the simulation is executed taking the total information into consideration.

Here, the simulation is carried out in such a manner that in the estimated current waveform for each logical change in the digital simulation, its bottom is represented by a function of a transition time and its side is represented by a function of a decoupling capacitance. This permits the EMI analysis to be carried out with great accuracy and reliability and at a high speed.

The EMI analysis device includes an analysis control input unit 102 for supplanting the circuit information 101 of the LSI chip at issue with analysis control information of at least one item of the power source information of the power source for supplying a current to the LSI chip, package information of the package of the LSI chip and measurement system information of a measurement system for measuring the characteristic of the LSI chip to make the rough estimation of the total information including the circuit information and the analysis control information as an equivalent circuit; an EMI simulation unit 103 for executing the simulation in accordance with the total information estimated by the analysis control input unit 102; an analysis information display unit 104 for displaying the analysis information obtained by the EMI simulation unit 103; an EMI optimizing unit 106 for optimizing the EMI on the basis of the analysis information obtained in the EMI simulation unit 103 and an optimizing standard supplied from an optimizing control input unit 105; and an optimized information display unit 107 for displaying the optimized information on the basis of the information supplied from the EMI optimizing unit 106.

Figure 2:
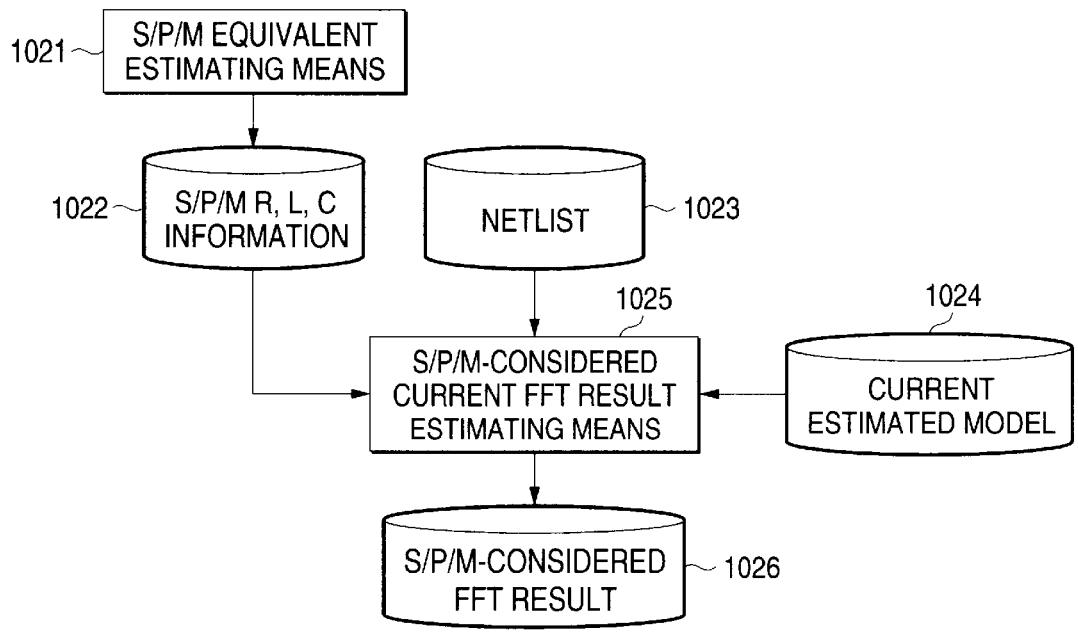
FIG. 2 is a block diagram for realizing the EMI analyzing method according to the eleventh embodiment of this invention.

The analysis control input unit 102, as seen from FIG. 2, includes an equivalent circuit estimating means 1021 for estimating, as an equivalent circuit, the total information of the circuit information supplemented with the analysis control information of at least one item of the power source information of the power source for supplying a current to the LSI chip, package information of the package of the LSI chip and measurement system information of a measurement system for measuring the characteristic of the LSI chip (hereinafter referred to as "S/P/M information"); and an FFT result estimating means 1025 considering a power source/package/measurement system (hereinafter referred to as "S/P/M") for computing the S/P/M-considered power source current and executing the FFT processing on the basis of RLC information 1022 of the that is the equivalent circuit information the total information due to the S/P/M, netlist 1023 equipped with the circuit information and a current estimating model 1024, thereby estimating the frequency spectrum of the EMI noise due to the power source current so that the S/P/M-considered FFT result 1026 is produced as the frequency spectrum which is the S/P/M-considered FFT result.

Figure 3:
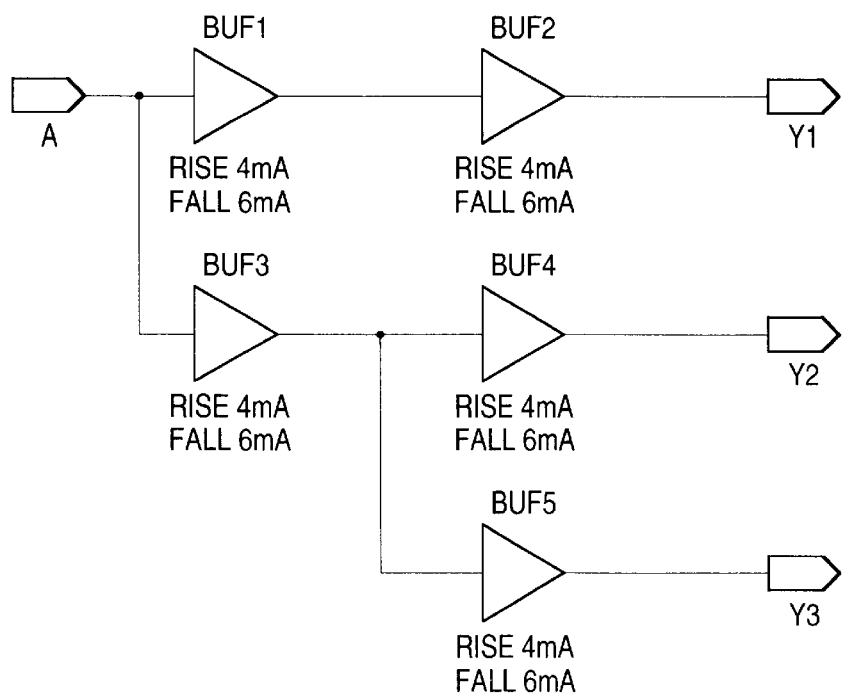
FIG. 3 is a view showing an example of a netlist used in the EMI analyzing method according to the eleventh embodiment of this invention.
Figure 4:
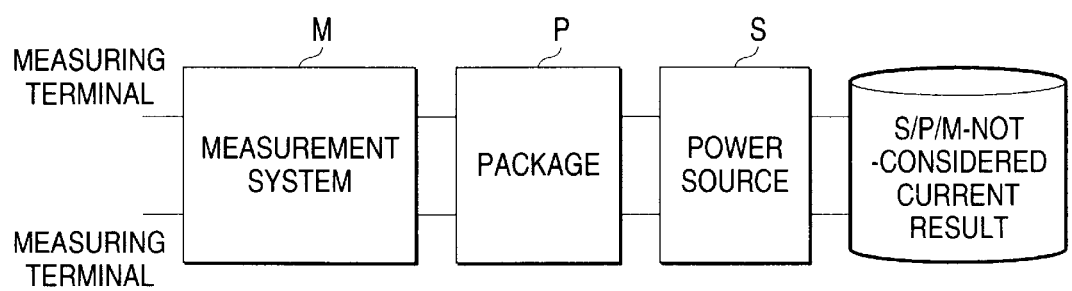
FIG. 4 is an equivalent circuit diagram showing the RLC information of S/P/M used in the EMI analyzing method according to the eleventh embodiment of this invention.
Figure 10:
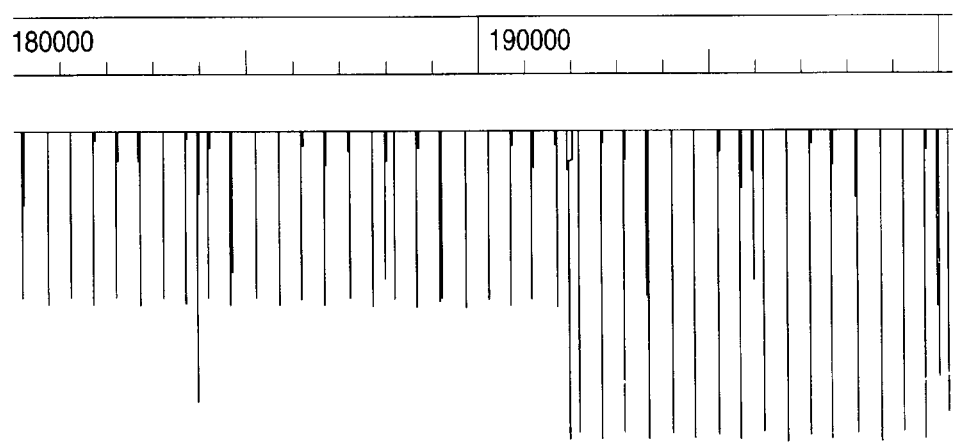
FIG. 10 is a view showing an example of frequency spectrum data corresponding to the data used in the eleventh embodiment of this invention.

An example of the netlist is shown in FIG. 3 directed to an inverted circuit. The netlist information includes the connecting information among one or more circuit elements, lines and external terminals and the information of a current when each circuit element is driven. In this example, the netlist information includes buffers BUF1, BUF2, BUF 3, BUF 4 and BUF 5 through which the current of 4 mA flows in its rise and the current of 6 mA flows in is fall, an external input terminal A and external output terminals Y1, Y2, Y3 and lines which connects these elements to another. The netlist of FIG. 3 is the circuit information of the LSI chip when the power source used to compute the S/P/M-not-considered current the as shown in FIG. 10 is used as an ideal power source. FIG. 4 shows the result when the S/P/M-not-considered current is modeled as an equivalent power source current, and the circuit information and S/P/M RLC information are modeled as an equivalent impedance.

As shown in FIG. 4, the equivalent circuit, inclusive of the package of the LSI for which the simulation is to be done and the measurement system, includes a package unit P, power source circuit S and measurement system M. Incidentally, in the equivalent circuit as shown, the package unit, power source unit and measurement system are individually arranged, but are not necessarily required to be individual.

Correlation can be taken between the measurement system thus modeled and the measurement result of the measurement system (measuring device) of the LSI to be standardized.

Figure 5:
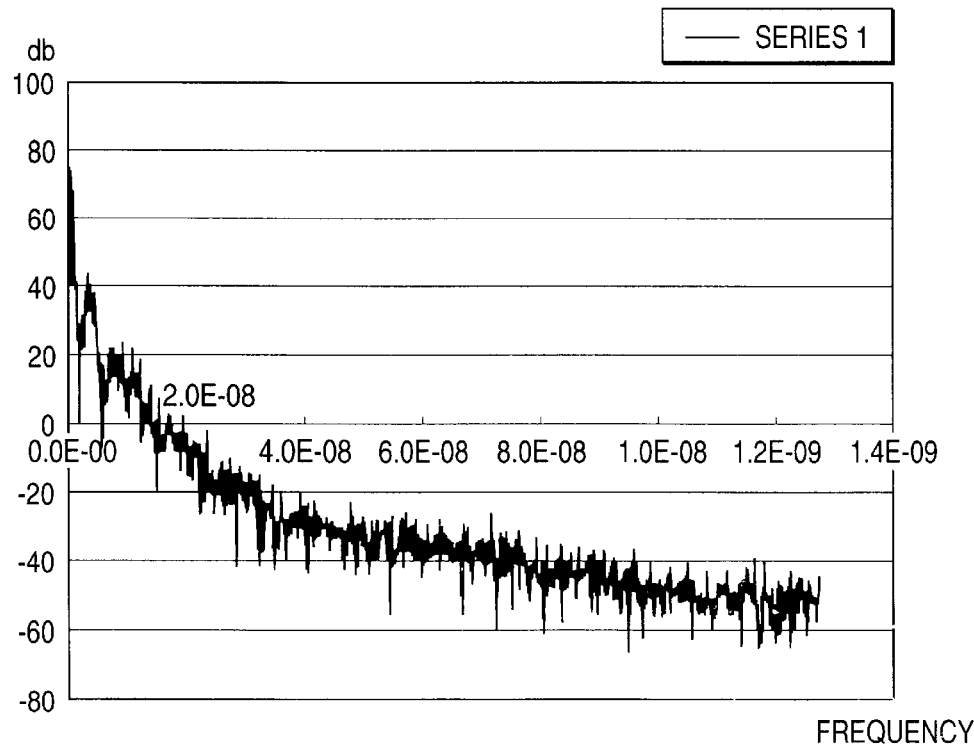
FIG. 5 is a graph showing the frequency spectrum obtained in the EMI analyzing method according to the eleventh embodiment of this invention.
Figure 6:
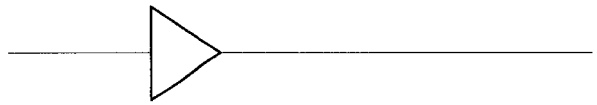
FIGS. 6(a)–6(d) show the views showing waveform models of an estimated power source current model.
Figure 6:
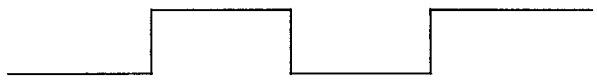
Figure 6:
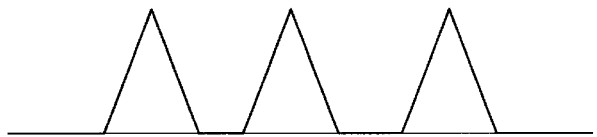
Figure 6:
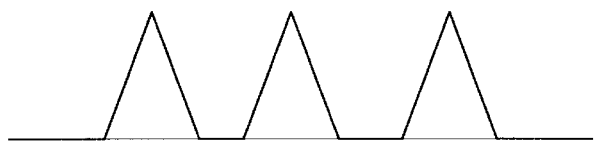

The frequency spectrum that is the FFT result finally acquired by this invention is shown in FIG. 5. The ordinate represents noise (dB mA) and the abscissa represents a frequency (Hz).

Figure 7:
FIGS. 7(a)–7(d) show the views showing an optimum waveform model which is used to realize a S/P/M-not-considered current estimating means in the eleventh embodiment of this invention.
Figure 7:
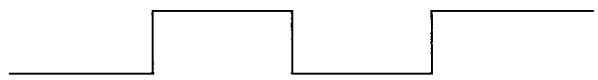
Figure 7:
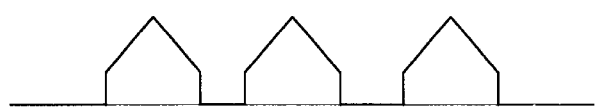
Figure 7:
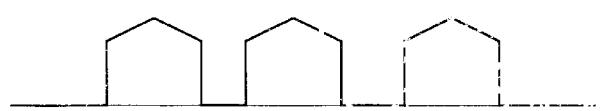

FIG. 7 shows the current waveforms estimated for each logical change during the digital simulation, which are illustrated as pedestaled triangular or Japanese chess shaped waves as shown in FIGS. 7(a)–7(d). The estimated power source current when the decoupling capacitance is small exhibits a sharp angle as shown in FIG. 7(c), whereas the estimated power source current exhibits an obtuse angle as shown in FIG. 7(d).

On the other hand, there is a method in which the estimated power source current is represent as a triangular wave as shown in FIGS. 6(a)–(d). In this method, the current is represented in the bottom of the triangle by a function of a transition time. Therefore, only one measure of for taking the decoupling capacitance into consideration is to adjust the bottom. However, enlargement of the bottom attenuates not only the noise in the range at a high frequency which is inherently attenuated by the decoupling capacitance but also the noise in the range with a low frequency. As a result, the estimated current does not coincide with the actual measurement result.

On the other hand, FIG. 7 shows an optimum waveform model when the S/P/M-not-considered current estimating means is realized using a logical simulator. The technique of modeling such as shown in FIG. 7 realizes an equivalent power source current circuit in the form approximate to an actual one.

In the technique, the bottom can be represented by a function of a transition time and the sides can be represented by a function of the decoupling capacitance. Therefore, the influence of the decoupling capacitance on the frequency spectrum (FFT result) can be represented accurately.

FIG. 8 shows the S/P/M-not-considered current information, which has been computed by the S/P/M-not-considered current estimating means using the model as shown in FIG. 7. The current information includes timings and the information of the corresponding power source current values, assuming that the power source current is given as data as shown in FIG. 10.

Figure 9:
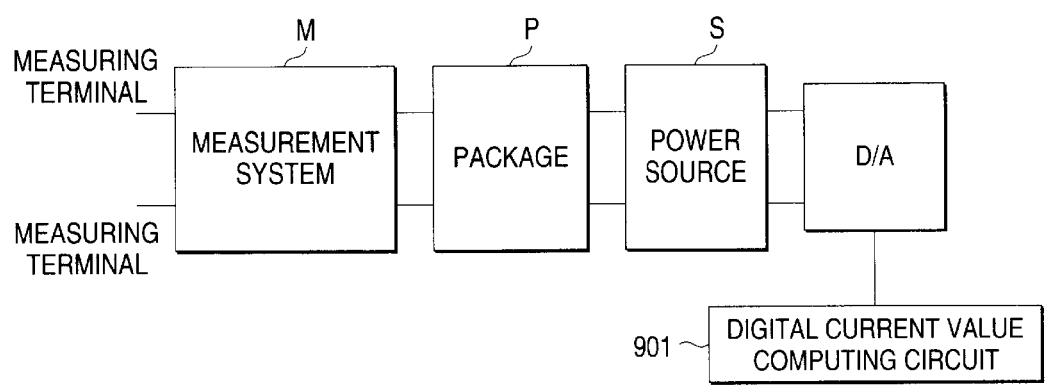
FIG. 9 is a view for explaining a method of computing an equivalent power source current in the eleventh embodiment of this invention.

An example of the technique for converting the power source current information into the equivalent power source current is shown in FIG. 9. The terminal of the LSI chip is connected to a D/A converter, and the S/P/M-not-considered current estimating means serving as a digital current value computing circuit 901 is connected to the D/A converter. After the information as illustrated in FIG. 8 has been computed by the digital current value computing circuit (i.e. S/P/M-not-considered current estimating means, constructed by the logical simulator), it is converted into the equivalent power source current using the D/A converter as shown in FIG. 9. Thus, the circuit as shown in FIG. 9 can be smoothly subjected to the simulation by the simulator in the transistor level.

By performing the simulation in the transistor level on the basis of the combination of the equivalent power source current circuit and the impedance circuit, the power source current computed by the S/P/M-not-considered current estimating means can be corrected to estimate the S/P/M-considered current. Further, by performing the FFT for the estimated current, the frequency spectrum as shown in FIG. 5 can be obtained.

An explanation will be given of the operation of the analysis control input unit 102 using the equivalent circuit shown in FIG. 11 and the block diagram shown in FIG. 12.

This is executed under synchronization between the step of computing the current in the gate level by the S/P/M-considered current estimating means and the step of computing the current in the transistor level by the S/P/M-considered FFT estimating means using the computed result. Specifically, while the estimated current concerning the cell, block and LSI is computed in the gate level, in synchronism with this, the computed value is simulated in combination with the power source net so that the current considering the influence by the power source net is acquired.

Figure 11:
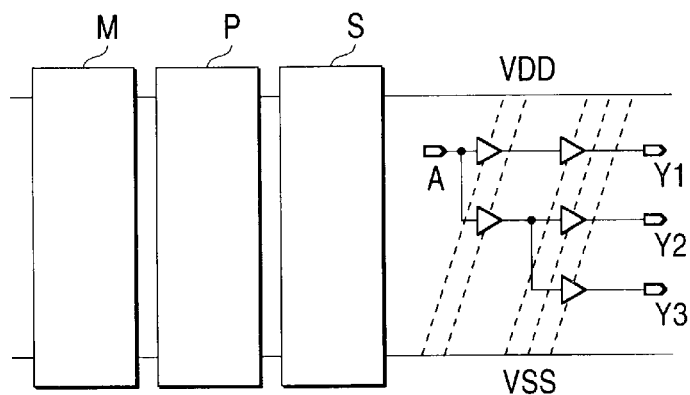
FIG. 11 is an equivalent circuit diagram showing the RLC information of the S/P/M in the EMI analyzing method according to the eleventh embodiment of this invention.
Figure 12:
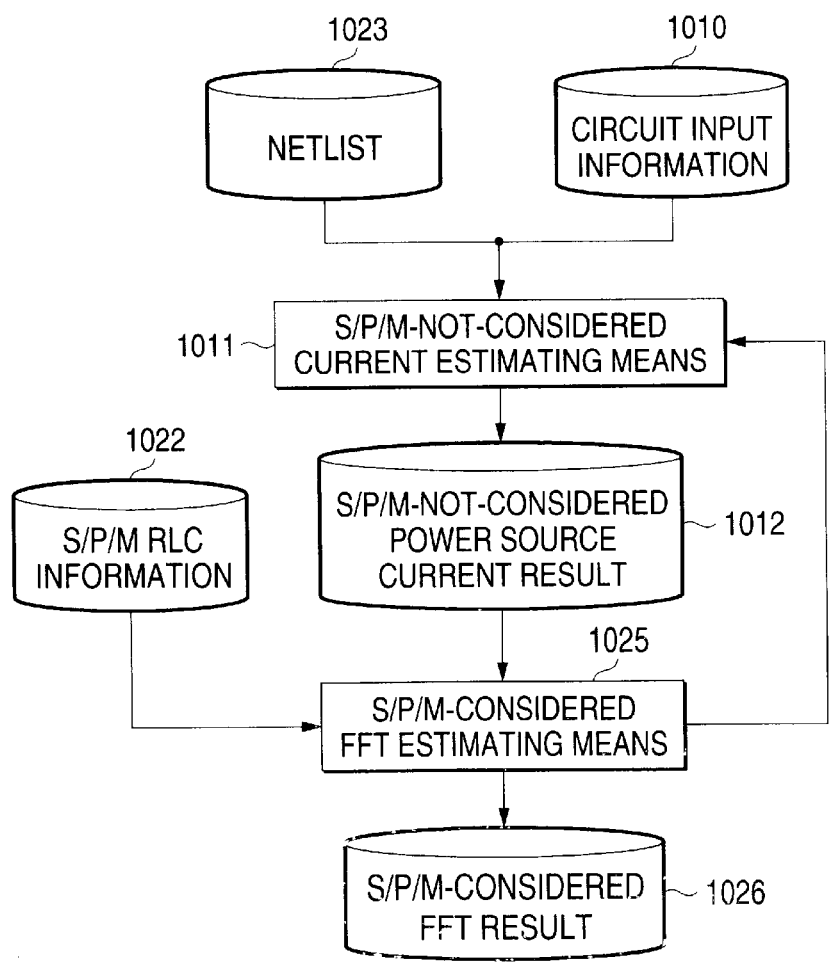
FIG. 12 is a detailed block diagram of the analysis control input unit 102 in FIG. 1 in the EMI analyzing method according to the eleventh embodiment of this invention.

The analysis control input unit 102, as seen from the equivalent circuit of FIG. 11 and block diagram of FIG. 12, includes an equivalent circuit estimating means 1021 for estimating, as an equivalent circuit, the S/P/M-not-considered current result 1012 acquired, through synchronous read, from the S/P/M-not-considered current estimating means 1011 and the S/P/M RLC information 1022 of the circuit information supplemented with the analysis control information of the above "S/P/M information"; and an S/P/N-considered FFT result estimating means 1025 for computing the estimated result through the FFT analysis by the FFT processing on the basis of the equivalent circuit acquired by the equivalent circuit estimating means 1021 from the total impedance that is the S/P/M RLC information 1022 due to the S/P/M, and the netlist 1023, thereby producing the S/P/M-considered FFT result 1026.

Referring to the flowcharts of FIGS. 13 and 14, an explanation will be given of the operations of the S/P/M-not-considered current estimating means and the S/P/M-considered current estimating means.

Figure 13:
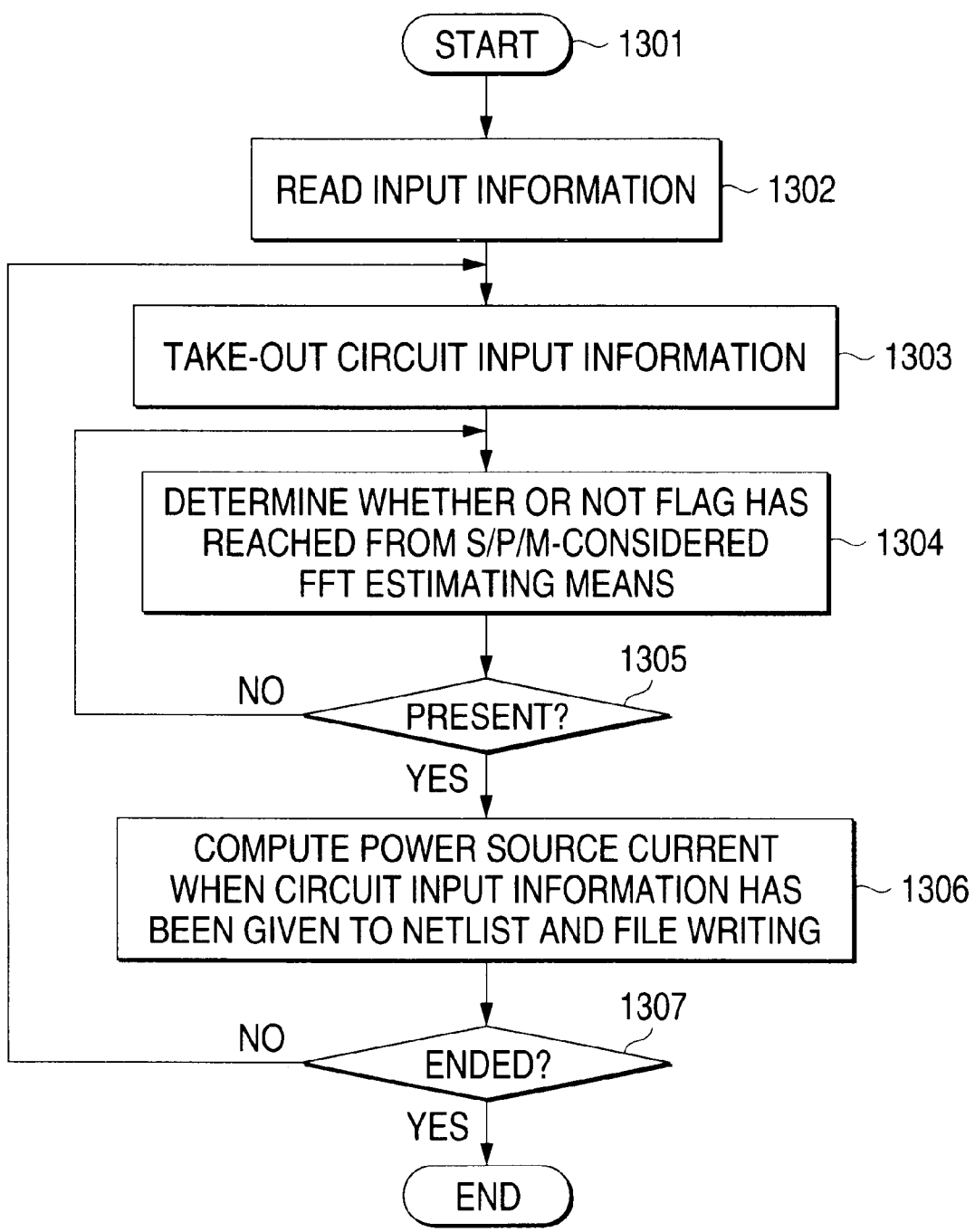
FIG. 13 is a flowchart showing the estimating method by the S/P/M-not-considered current estimating means according to the eleventh embodiment of this invention.

The current estimation in the S/P/M-not-considered current estimating means 1011, as seen from FIG. 13, comprises a step 1301 of inputting the netlist 1023 and the circuit input information 1010, a step 1302 of reading the inputted information, a step 1303 of taking out the circuit input information thus read every line, a step 1304 of seeing a flag to decide whether or not the flag has reached from the S/P/M-considered current estimating means, a step 1305 of deciding whether or not there is the flag, a step 1306 of computing, if YES, or the circuit information taken out is a first line, the power source current when the circuit input information taken out has been given to the netlist and writing it as a file. In step 1307, it is decided whether or not the processing for the all items of circuit input information. If YES, the processing is ended.

The circuit input information refers to time-series input values to be applied to the external input terminal of the netlist. The circuit information includes lines each composed a simulation timing and the corresponding logical signal value to be applied to each external input terminal, which is described until a simulating ending time.

In decision step 1307, if it is decided that all the lines of the circuit input information have not yet been processed, the processing returns to the step of taking out the circuit input information to repeat the same steps.

If the flag has not been reached from the S/P/M-considered current estimating means, whether or not the flag has been reached is seen again.

Figure 14:
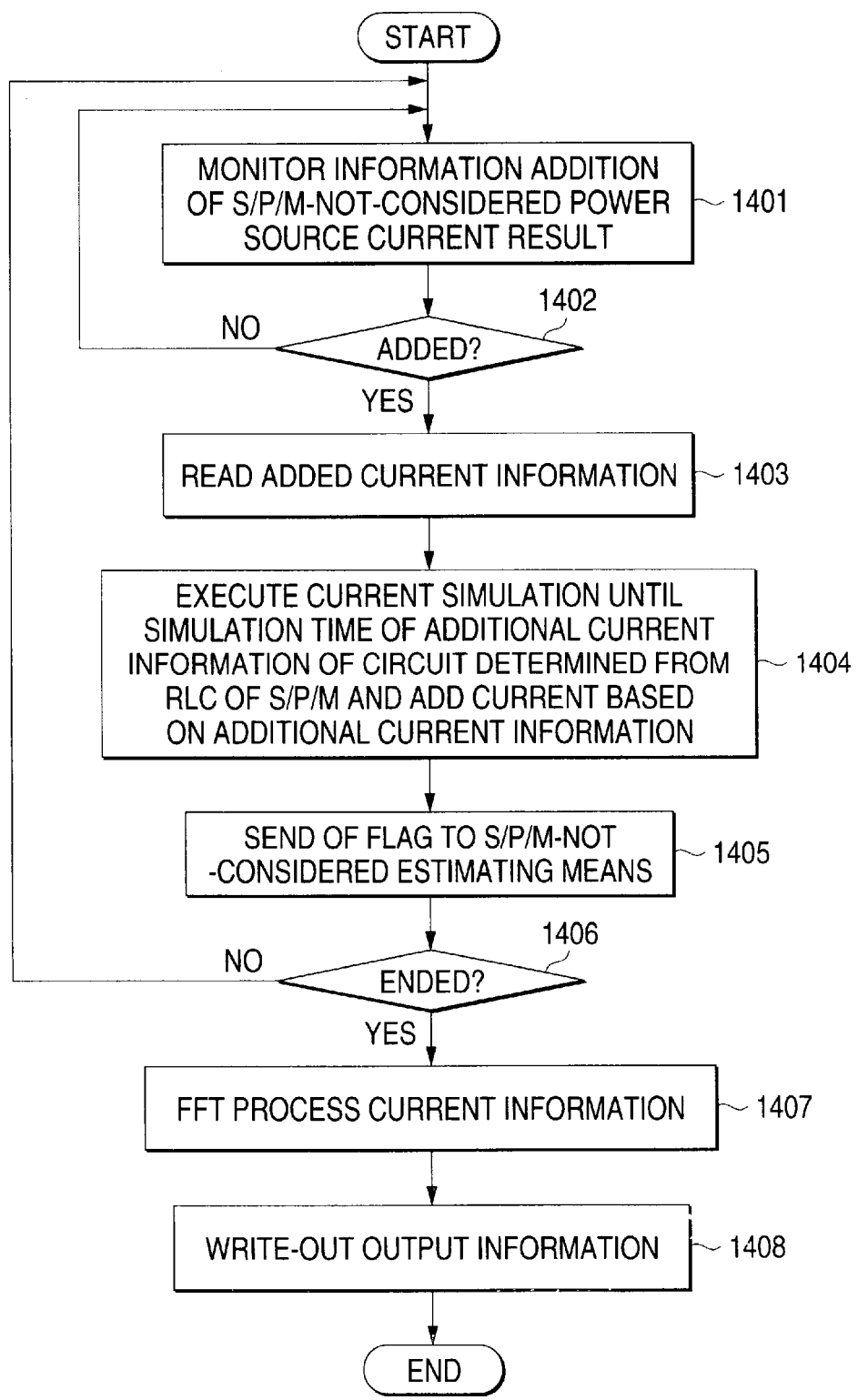
FIG. 14 is a flowchart of the estimating method in the S/P/M-considered current estimating means according to the eleventh embodiment of this invention.

In the current estimation in the S/P/M-considered current estimating means, as seen from FIG. 14, in step 1401, the addition of the information of the estimated result in the S/P/M-not-considered current estimating means is monitored; in step 1402, it is decided whether or not the addition of the information has been made in the monitoring step; and if it is decided that the addition of the information has been made, in step 1403, the added current information is read.

In step 1404, the current simulation is performed until the simulation time of the added current information of the circuit which is determined from the RLC of the S/P/M. In step 1405, a flag is sent to the S/P/M-considered current estimating means 1011.

In step 1406, it is decided whether or not the flag has been already sent; if YES, in step 1407, the current information is FFT-processed; and in step 1408, the output information is written out.

If it is decided that the flag has not yet been sent, the processing returns to the monitoring step 1401 where the addition of the information of the estimated result in the S/P/M-considered current estimating means is monitored. The subsequent steps are repeated in the same manner.

Embodiment 12

An explanation will be given of the twelfth embodiment of this invention.

This embodiment adopts the manner of reflecting the current computed result in the gate level, executed by the S/M/M-not-considered current estimating means, on the computing in the transistor level in post processing. Namely, in this embodiment, after the estimated current concerning the cell, block or LSI has been computed in the gate level, the computed value is simulated in combination with the power source net so that the current considering the influence by the power source net is acquired.

Figure 15:
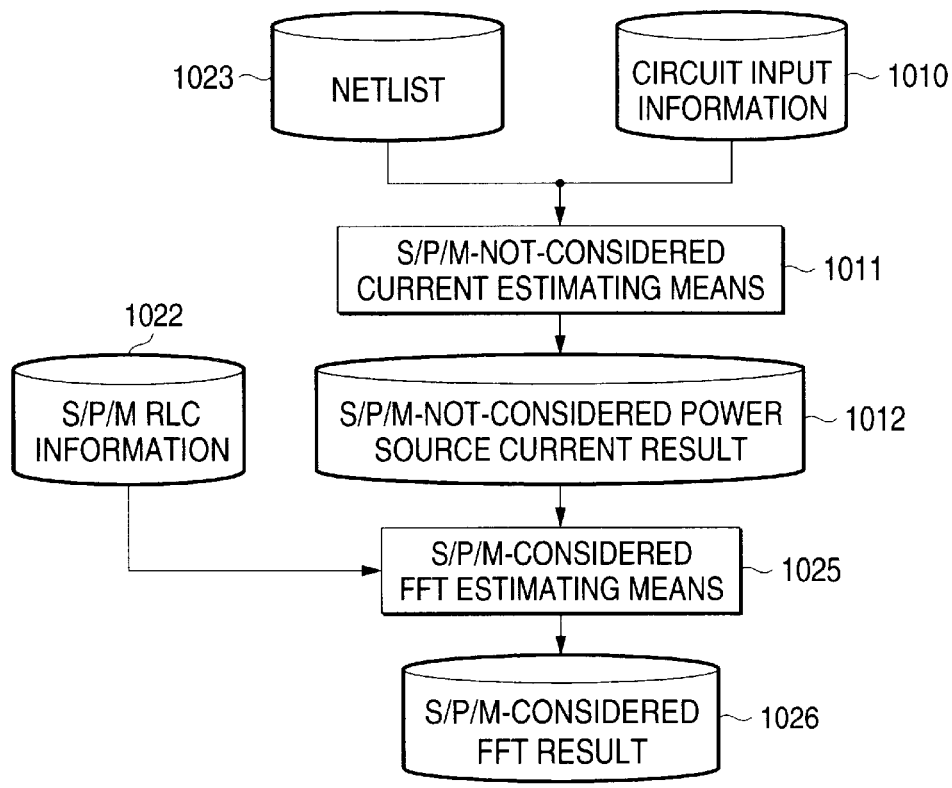
FIG. 15 is a detailed block diagram of the analysis control input unit 102 in FIG. 1 in the EMI analyzing method according to the twelfth embodiment of this invention.

FIG. 15 shows the process of reflecting the current computed result in the gate level on the computing in the transistor level in post processing. This process is the same as that shown in FIG. 12 except that there is not a step of sending the flag from the the S/P/M-considered current estimating means to the S/P/M-not-considered current estimating means, that was necessary for synchronization in the synchronous read explained with reference to FIG. 12.

Figure 16:
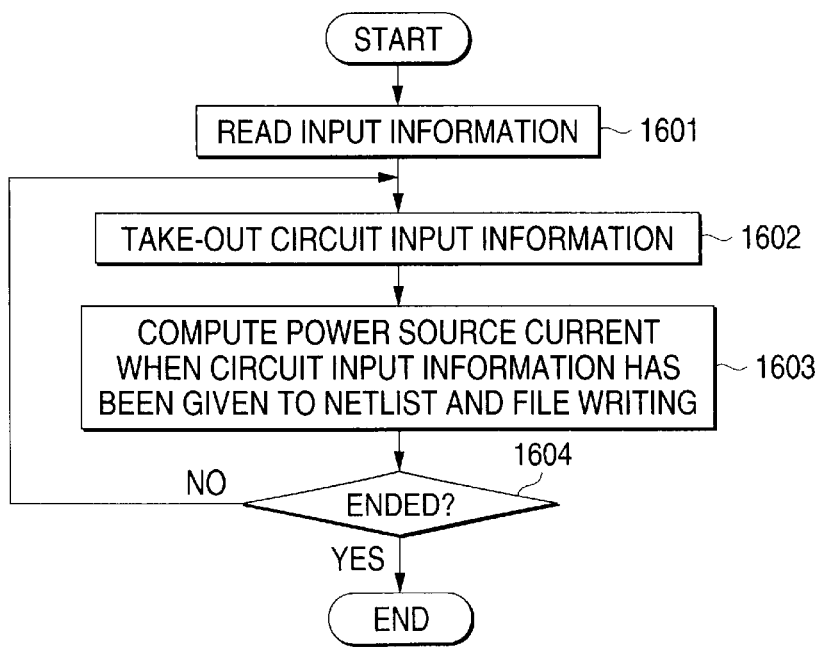
FIG. 16 is a flowchart of the estimating method in the S/P/M-not-considered current estimating means according to the twelfth embodiment of this invention.

FIG. 16 shows the current estimation in the S/P/M-not-considered current estimating means 1011. As seen from FIG. 16, the circuit input information 1010 is inputted as input information (step 1601); the pertinent circuit input information is taken out for one line (step 1602); and the circuit input information thus taken out is given to the netlist 1023 and the power source current at this time is computed and written as a file (step 1603). Further, it is decided whether or not the processing for the all items of circuit input information (decision step 1604). If YES, the estimating operation is ended.

If it is decided in decision step 1604 that the processing has not yet been ended, the processing returns to step of taking out circuit input information every line (step 1602) and the above operation is repeated.

Figure 17:
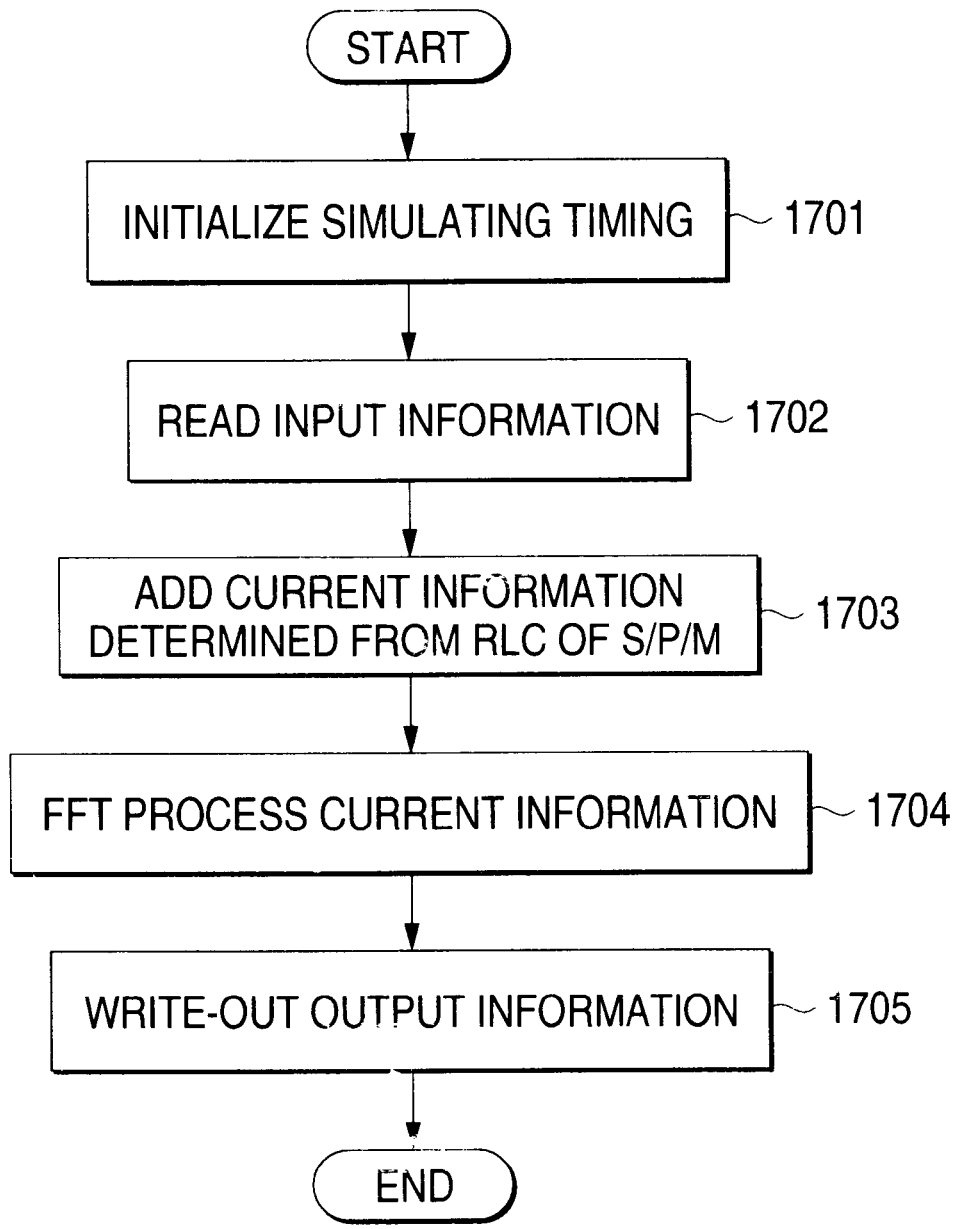
FIG. 17 is a flowchart of the estimating method in the S/P/M-considered current estimating means according to the twelfth embodiment of this invention.

FIG. 17 shows the current estimation in the S/P/M-considered current estimating means 1025. As seen from FIG. 17, the simulating timing is initialized (step 1701); the circuit input information 1010 is read as input information (step 1702); the pertinent circuit input information is added to the RLC information of the S/P/M to compute the current information (step 1703); and the current information is FFT-processed (step 1704). The FFT result thus acquired is written out (step 1705), which is outputted in a display device.

In this configuration, the influence of the power source net on the FFT result can be represented accurately in a time series. Further, in the case of such asynchronous read, the flag is not sent and so the step of sending the flag is removed. This permits the higher speed processing than in the case of the synchronous read.

Embodiment 13

An explanation will be given of the thirteenth embodiment of this invention.

This embodiment adopts the manner of reflecting the current computed result in the gate level, executed by the S/P/M-not-considered current estimating means, on the computing in the transistor level in an asynchronous manner. Namely, in this embodiment, a signal change concerning the cell, block or LSI is stored, the signal change is read at regular intervals, and the estimated current is represented as a current source by D/A conversion and also simulated in combination with the power source net so that the current considering the influence by the power source net is acquired.

FIG. 15 shows the process of asynchronous reading of the current computed result in the gate level. This process is entirely the same as the processing of reflecting it on the computing in the transistor level in the post processing, explained in the twelfth embodiment.

The current estimation in the S/P/M-not-considered current estimating means 1011 is the same as that shown in FIG. 16 explained for the twelfth embodiment.

Figure 18:
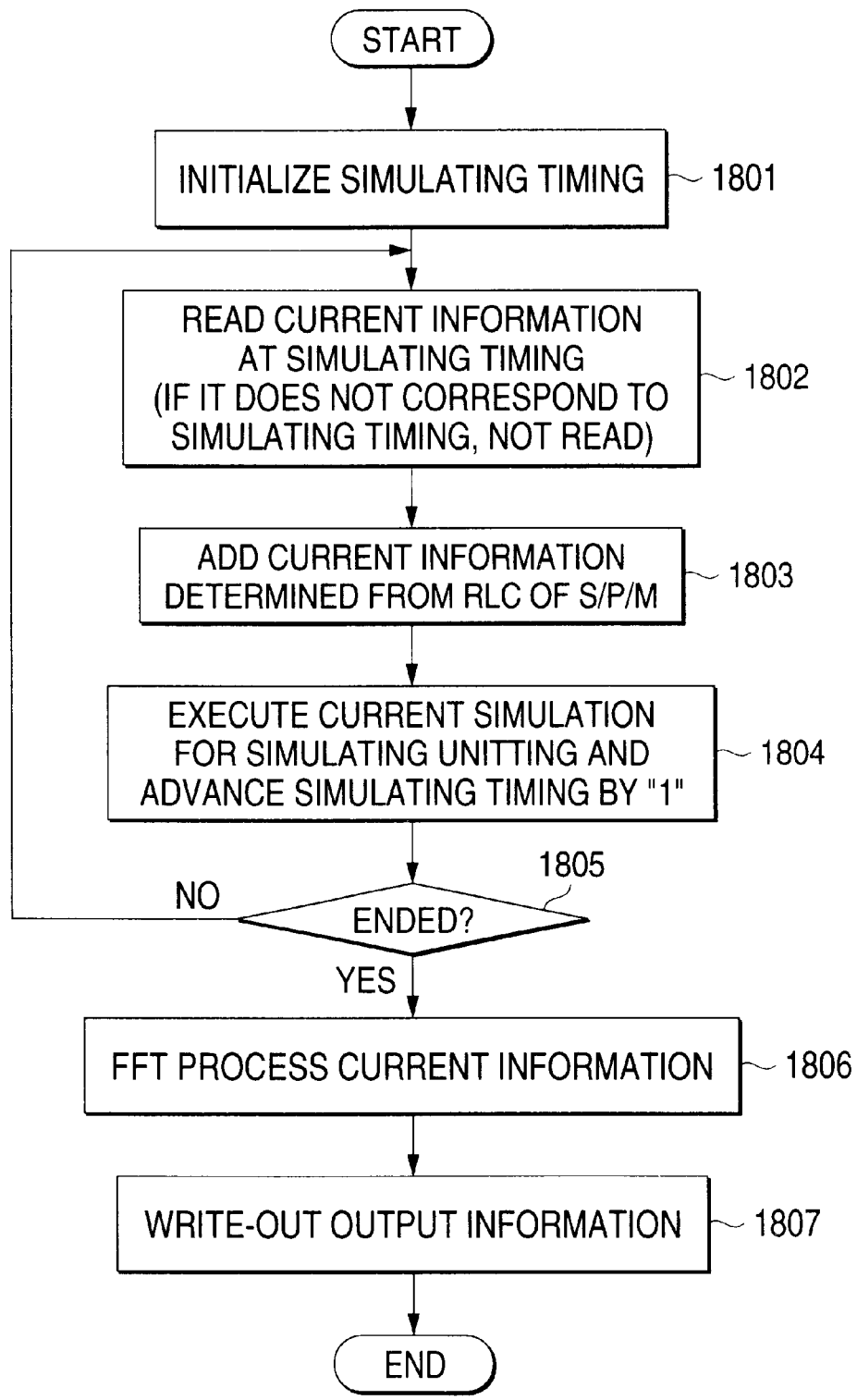
FIG. 18 is a flowchart of the estimating method in the S/P/M-considered current estimating means according to the thirteenth embodiment of this invention.

FIG. 18 shows the current estimation in the S/P/M-considered current estimating means 1025. As seen from FIG. 18, the simulating timing is initialized (step 1801); the circuit input information 1010 is read as input information at a simulating timing (step 1802); the pertinent circuit input information is added to the RLC information of the S/P/M to compute the current information (step 1803).

The current simulation is executed for a simulating unit time to acquire the current, and thereafter the simulating timing is advanced by 1 (step 1804).

It is decided whether or not the period for simulation has elapsed (step 1805). If YES, the current information is FFT-processed (step 1806). The FFT result thus acquired is written out (step 1807), which is outputted in a display device.

If the decision step 1805 has not been ended, the processing returns to the step 1802 of reading the current information at the simulating timing, and the above operation is repeated.

In this configuration, the influence of the power source net on the FFT result can be represented accurately. Such reading at regular intervals permits the digital part serving as the S/P/M-not-considered current estimating to be computed without being limited by the processing speed of the analog part serving as the S/P/M-considered current estimating means.

Embodiment 14

An explanation will be given of the fourteenth embodiment of this invention.

This embodiment adopts the manner of reflecting the average or maximum current computed result in the gate level on the computing in the transistor level. Namely, in this embodiment, after the estimated current concerning the cell, block or LSI has been computed in the gate level as the S/P/M-not-considered current estimating means, and the average or maximum value computed for each cycle as a current source is simulated in combination with the power source net so that the current considering the influence by the power source net is acquired.

Figure 19:
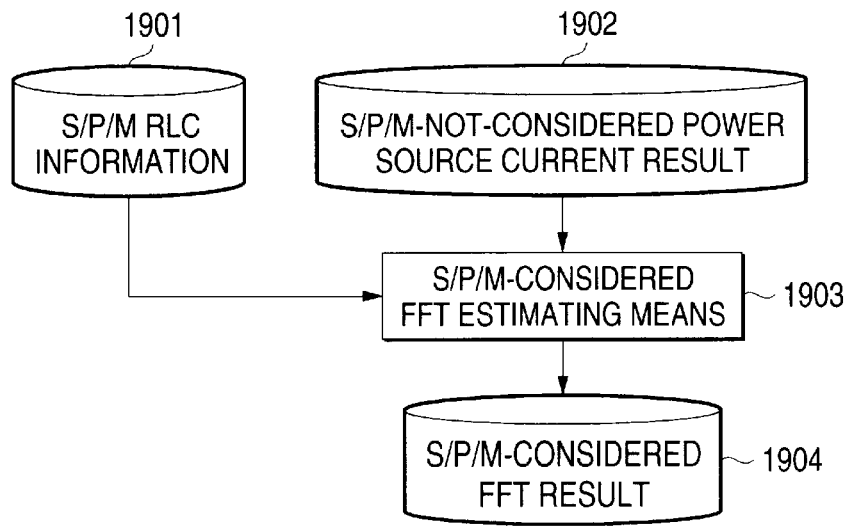
FIG. 19 is a flowchart of the FFT analysis in the fourteenth embodiment of this invention.

FIG. 19 shows the process for reflecting the current computed result in the gate level as the S/P/M-not-considered current estimating means, on the computing in the transistor level as the S/P/M-considered current estimating means in post processing. The process is basically the same as that explained referring to FIG. 12 for the eleventh embodiment, but includes the following information estimating means. As shown in FIG. 19, the average or maximum current value for each cycle of the S/P/M-not-considered power source current result 1902, obtained by the S/P/M-not-considered current estimating means (not shown), is computed so as to be folded in a single cycle, thereby providing an equivalent current source. The circuit information is supplemented with the analysis control information of the above "S/P/M information", thereby providing the RLC information 1901. The equivalent current source is supplemented with the RLC information and simulated and FFT-processed to compute the estimated result. Thus, the S/P/M-considered FFT result 1904 is produced.

Figure 20:
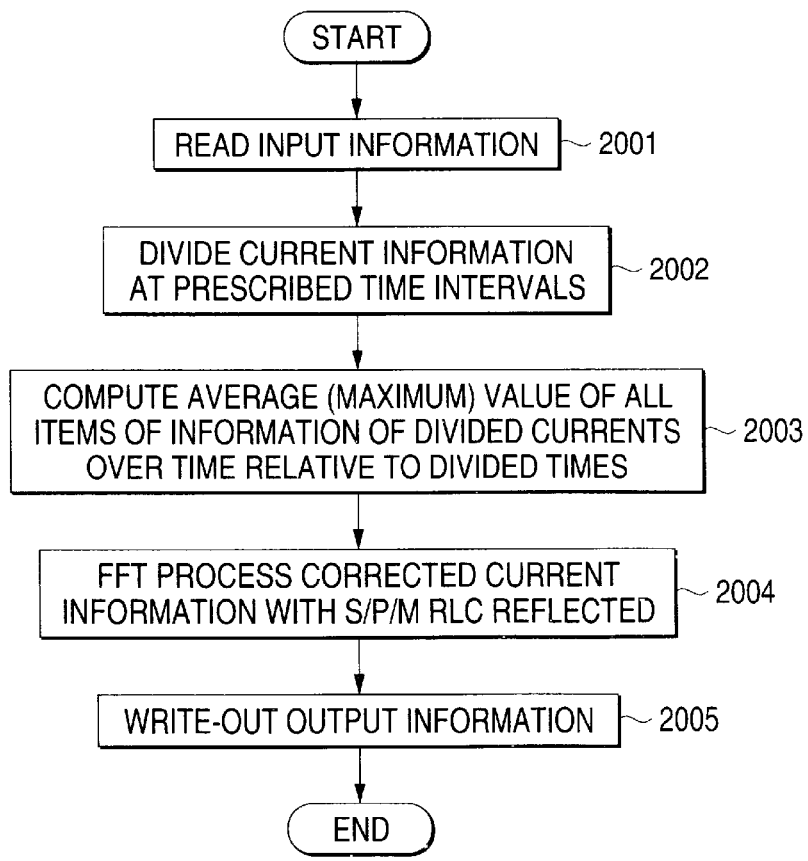
FIG. 20 is a flowchart of the S/P/M-considered current estimating method in the estimating means in the fourteenth embodiment of this invention.
Figure 21:
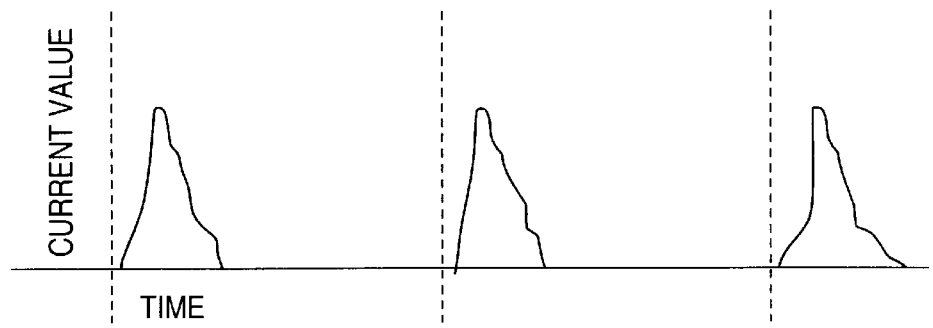
FIG. 21 is a graph showing the current information in the fourteenth embodiment of this invention.
Figure 22:
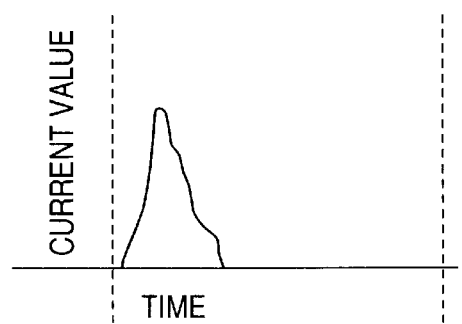
FIG. 22 is a graph showing the averaged current information in the fourteenth embodiment of this invention.

The estimating operation of the S/P/M-considered current estimating means 1903 is shown in FIG. 20. Now, the S/P/M-not-considered current result and the S/P/M RLC information are read as input current information (step 2001); the input current information is divided at prescribed time intervals, an example of which is shown in FIG. 21 (step 2002); and the average value or maximum value of all items of information of the divided currents is computed over the time relative to the divided times (step 2003). FIG. 22 shows the averaged current of the current information shown in FIG. 21. In FIGS. 21 and 22, the ordinate represents a current value and the abscissa represents a time. The corrected current information in which the S/P/M RLC information is reflected on the computed current information is FFT-processed (step 2004), and the FFT result thus obtained is written out as output information (step 2005).

In this configuration, the influence of the power source net on the FFT result can be represented accurately. Taking the average value or maximum value at regular intervals permits the influence of noise to be estimated at a high speed.

Embodiment 15

An explanation will be given of the fifteenth embodiment of this invention.

This embodiment adopts the manner of removing the change outside an object frequency band from the current computed result in the gate level and reflecting this on the computing in the transistor level. Namely, in this embodiment, as the current estimating means S/P/M-considered, the estimated current concerning the cell, block or LSI is computed in the gate level, the computed value is FFT-processed, and the frequency band outside the object frequency band is excluded from the computed result and further inverse-FFT processed. The result thus computed is simulated in combination with the power source net so that the current considering the influence by the power source net is acquired.

This embodiment uses the same configuration as shown in FIG. 19 for the fourteenth embodiment, but includes the following information estimating means. As shown in FIG. 19, the S/P/M-not-considered power source current result 1902, obtained by the S/P/M-not-considered current estimating means (not shown), is FFT-processed and the frequency band outside the object frequency band is excluded from the computed result and further inverse-FFT processed, thereby providing an equivalent current source. The circuit information is supplemented with the analysis control information of the above "S/P/M information", thereby providing the RLC information 1901. The equivalent current source is supplemented with the RLC information and simulated and FFT-processed to compute the estimated result. Thus, the S/P/M-considered FFT result 1904 is produced.

Figure 24:
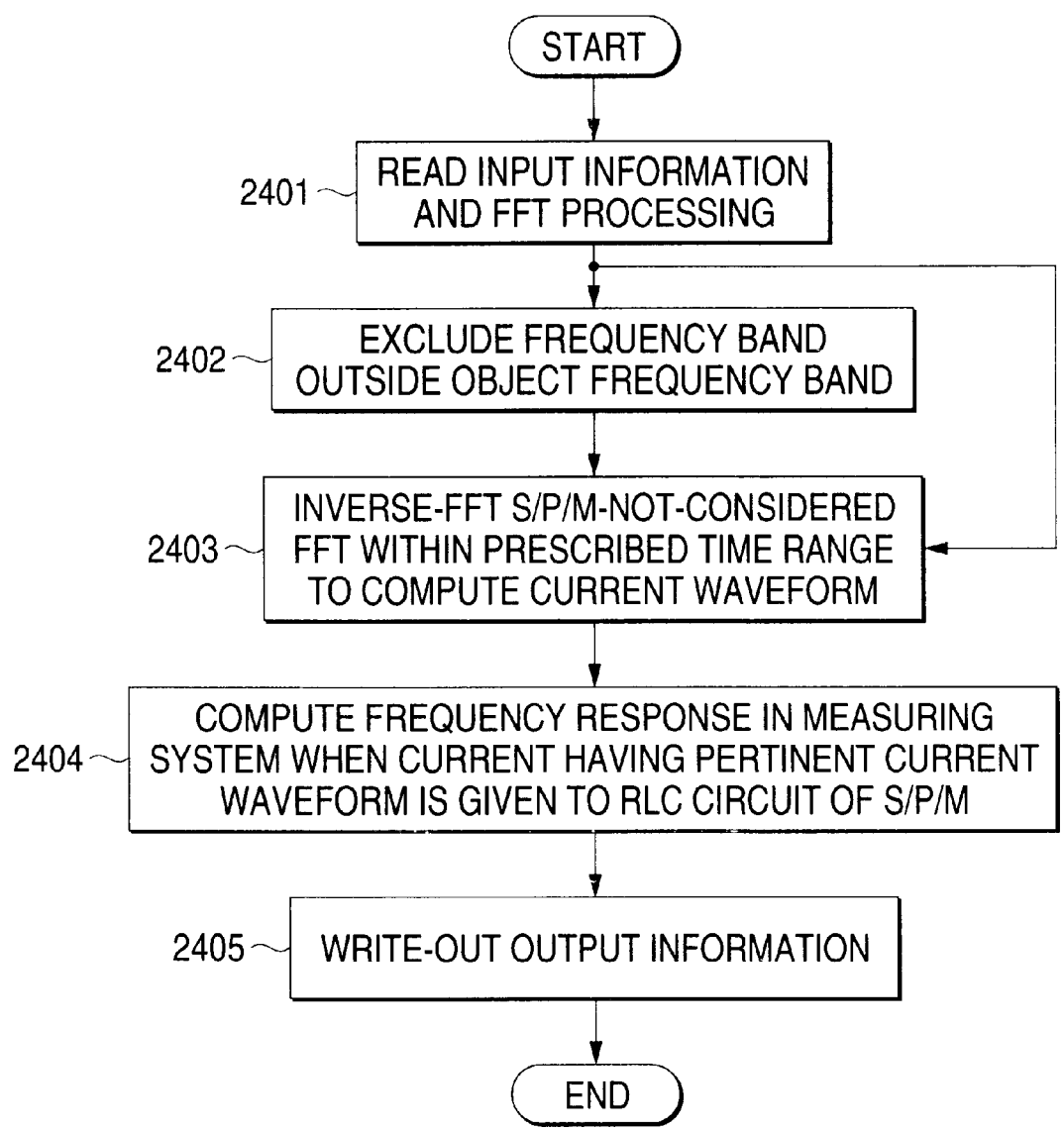
FIG. 24 is a flowchart of the S/P/M-considered current estimating method in the estimating means in the seventeenth embodiment of this invention.

The estimating operation of the S/P/M-considered FFT current estimating means 1903 is shown in FIG. 24. The estimated current obtained from the S/P/M-not-considered current estimating means (not shown) is inputted and FFT-processed (step 2401), the frequency band outside the object frequency band is excluded from the input information (step 2402), the FFT result of the S/P/M-not-considered power source current within a prescribed time range is further inverse-FFT processed to compute a current waveform (step 2403).

Thereafter, the frequency response in a measuring device when the current having the above pertinent current waveform is given to the RLC circuit of the S/P/M is computed (step 2404), and S/P/M-considered the current value is outputted as output information (step 2405).

In this configuration, the influence of the power source net on the FFT result can be represented accurately. Performing the FFT and the inverse-FFT permits the information of the current source to be reduced to terminate the simulation in the transistor level in a short time. The current estimation in the embodiment is an event-driven type and hence efficient. The current can also be analyzed on the basis of a block or a plurality of FFT results.

Incidentally, the step 2402 may be omitted. In this case also, the effect of compression of the estimated current by the inverse-FFT remains.

Embodiment 16

An explanation will be given of the sixteenth embodiment of this invention. In the eleventh to fifteenth embodiments, the equivalent power source current information acquired from the circuit information is simulated in combination with the total impedance of the analysis control information and circuit information. The method according to this embodiment computes the total impedance from the equivalent circuit of the power source, package and measurement system, acquires a function for correcting the equivalent power source current information on the basis of the total impedance, and computes/corrects the frequency spectrum of the equivalent power source current information using this function so that the frequency spectrum of the S/P/M-considered power source current information is acquired.

This embodiment adopts the manner of operating the FFT computed result as the current estimating means not S/P/M-considered using the function acquired from the S/P/M RLC information. Namely, in this embodiment, the estimated current concerning the cell, block or LSI is computed in the gate level, the computed value is FFT-processed, frequency response in a measurement device in the S/P/M is computed and the response result is multiplied by the S/P/M-not-considered current result so that the current considering the influence by the power source net is acquired.

Figure 23:
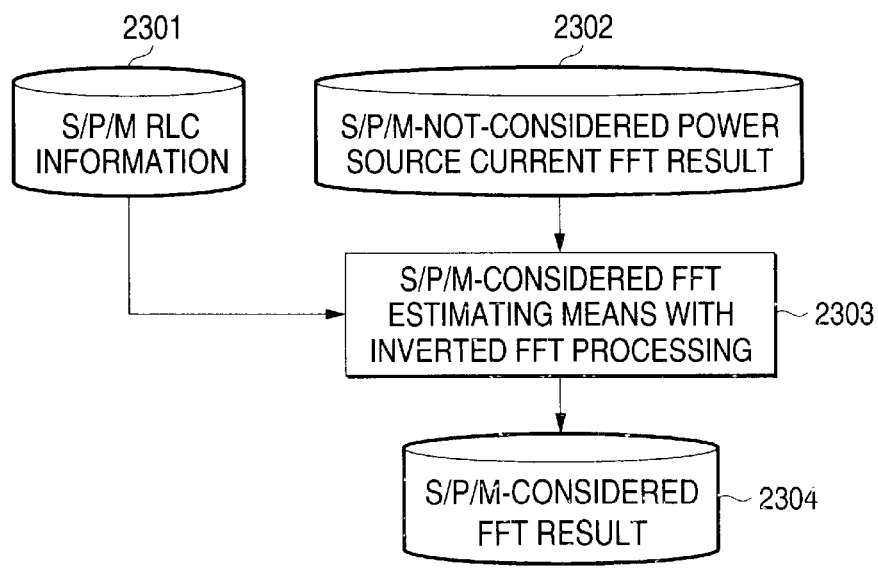
FIG. 23 is a flowchart of the FFT analysis in the fifteenth embodiment of this invention.

FIG. 23 shows the process for operating the current computed result in the gate level as the S/P/M-not-considered current estimating means using the function acquired from the RLC information of the S/P/M. The process is basically the same as that explained referring to FIG. 12 for the eleventh embodiment. As shown in FIG. 23, the estimated current acquired from the S/P/M-not-considered current estimating means (not shown) is FFT-processed to prepare the S/P/M-not-considered FFT result 2302. The FFT result 2302 is supplemented with the S/P/M RLC information 2301 of the "S/P/M information" described above. Thus, the S/P/M-considered FFT result 2304 is produced.

Figure 26:
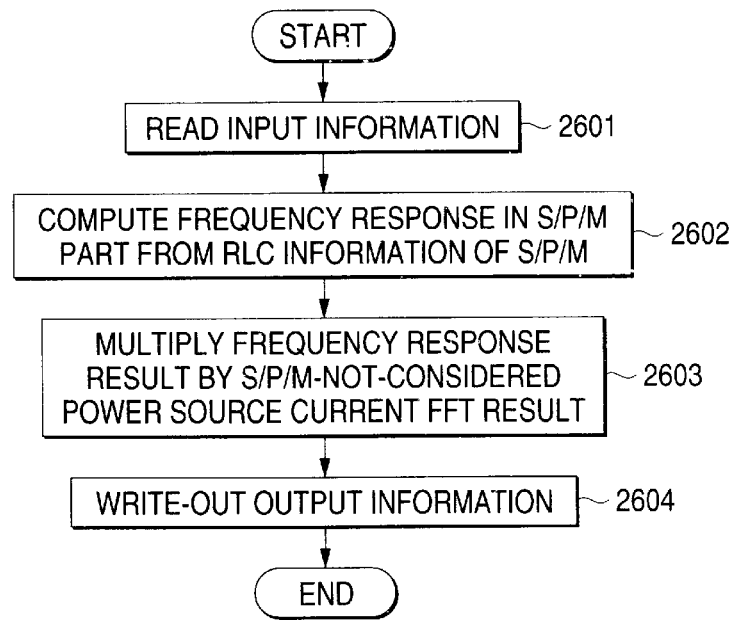
FIG. 26 is a flowchart of the estimating method of S/P/M-considered current estimating means according to the sixteenth embodiment of this invention.

The estimation operation of the S/P/M-considered FFT current estimating means is shown in FIG. 26. The FFT result of the estimated current obtained from the S/P/M-not-considered current estimating means (not shown) and the S/P/M RLC information are inputted as input information (step 2601). The frequency response of the S/P/M is computed from the S/P/M RLC information (step 2602). The frequency response is multiplied by the S/P/M-not-considered FFT result (step 2603). The current value thus obtained is produced as output information (step 2604).

Figure 27:
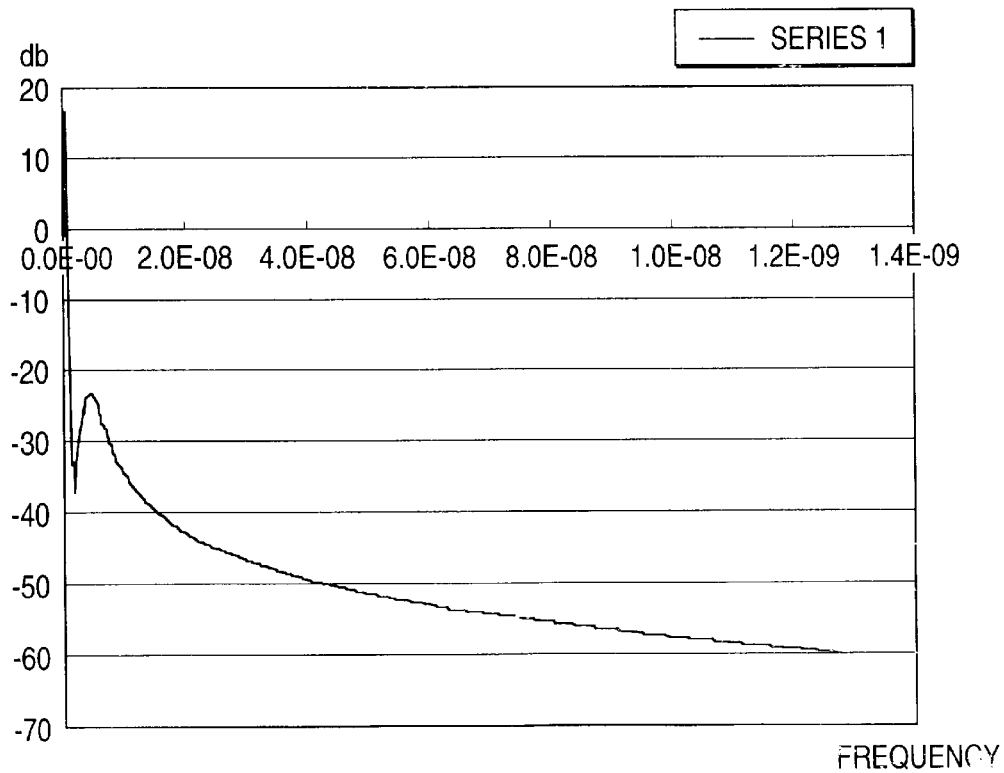
FIG. 27 is a graph showing the frequency response result in the sixteenth embodiment of this invention.

The frequency response result at this time is shown in FIG. 27.

In this configuration, the influence of the S/P/M can be reflected on the frequency spectrum, thereby permitting the computation at a high speed and great accuracy. Thus, the influence of the FFT power source net on the FFT result can be represented accurately. Multiplication of the response result for each frequency permits the high speed processing and saves a memory capacity.

Embodiment 17

This embodiment relates to a modification of the estimating operation of the S/P/M-considered FFT current estimating means 2303.

In the sixteenth embodiment, the frequency response in the measuring device for the S/P/M, and the frequency response is multiplied by the S/P/M-not-considered current result. This embodiment is characterized in that the frequency response for each frequency in the measuring device for the S/P/M is computed for the FFT result of the S/P/M, and the response results are accumulated.

Figure 25:
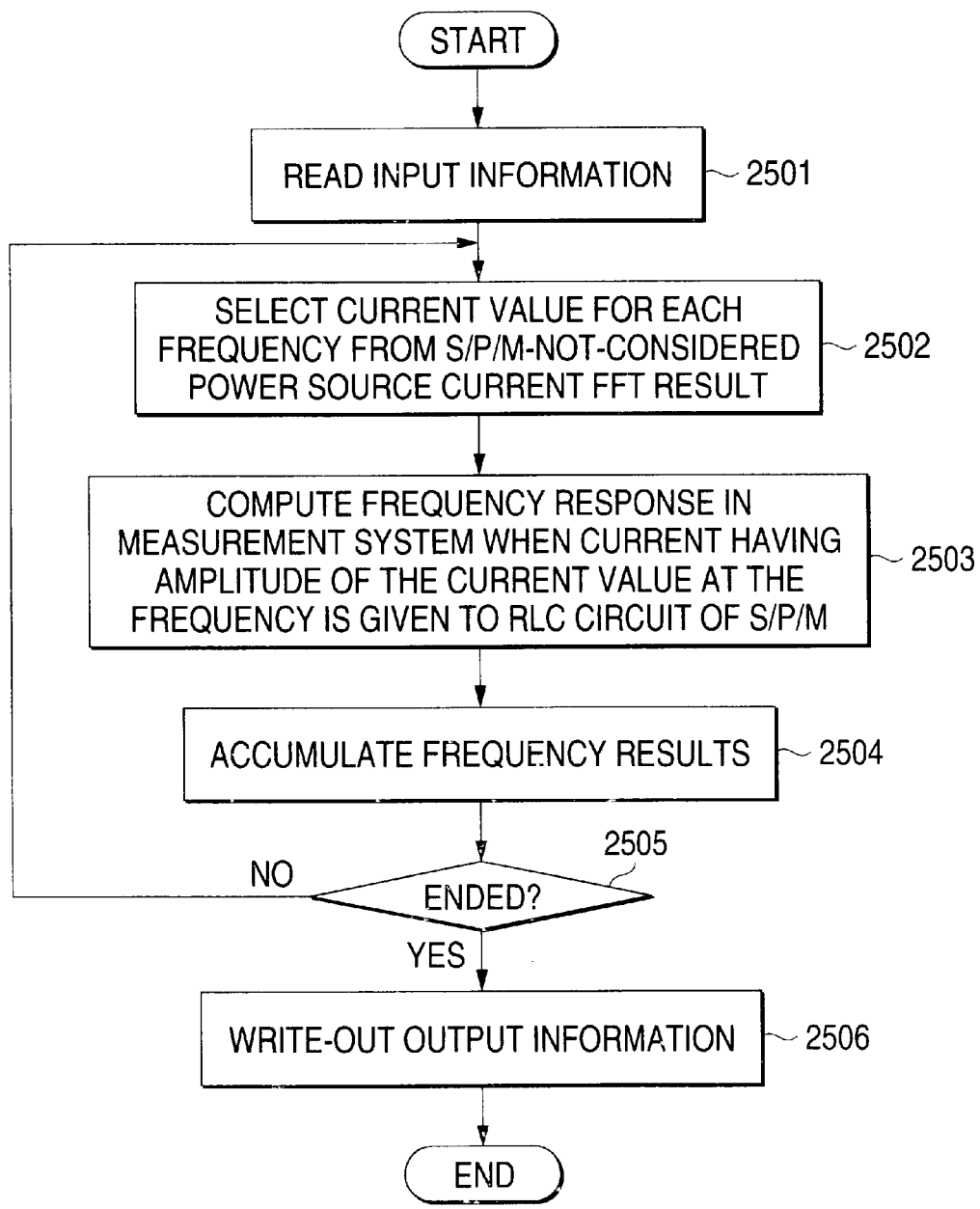
FIG. 25 is a flowchart of the operation of the S/P/M-considered FFT current estimating means according to the seventeenth embodiment of this invention.

FIG. 25 shows the estimating operation of the S/P/M-considered FFT current estimating means 2303. Input information is read which includes the FFT result of the estimated current acquired from S/P/M-not-considered the current estimating means (not shown) and the S/P/M RLC information (step 2501). The current value (noise level) for each frequency is selected from the FFT result (step 2502). The frequency response in the measuring device is computed when the current having the amplitude of the current value at the above frequency is given to the RLC circuit of the S/P/M (step 2503). The frequency response results are accumulated (step 2504). It is decided whether or not the processing has been ended for all the frequencies (step 2505). If ended, the S/P/M-considered frequency spectrum, which is the accumulated result of the frequency results, is produced as output information (step 2506).

In this configuration, the influence of the FFT result on the power source net can be accurately represented. Since the response results are accumulated for the respective frequency, the influence can be represented more accurately.

Embodiment 18

The feature of this embodiment resides in an analysis processing method.

In this embodiment, with the power source waveform result as a library, the FFT characteristic of the entire circuit is computed.

The apparatus according to this embodiment is provided with the FFT library which stores the FFT result of the current analysis of the cell or block with a parameter of an input/output condition, frequency, line capacitance, etc.

Figure 28:
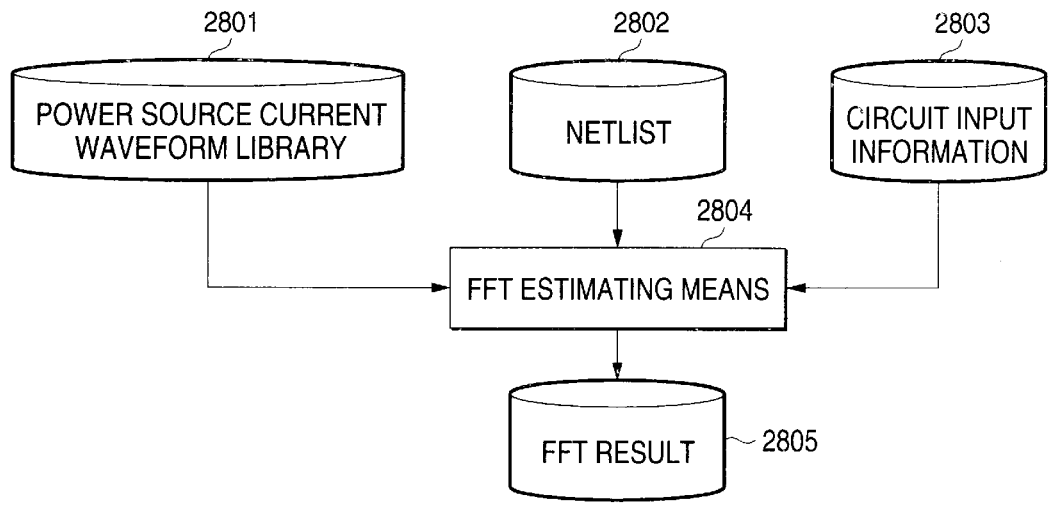
FIG. 28 is a block diagram showing an arrangement for realizing the EMI analyzing method according to the eighteenth embodiment of this invention.

FIG. 28 shows a device arrangement which is used for the EMI analysis technique according to this embodiment. The EMI analysis apparatus as shown includes a current waveform library 2801 which stores the result of the current analysis of the cell or block with a parameter of an input/output condition, frequency, line capacitance, etc., a netlist 2802, circuit input information 2803 and current FFT estimating means 2804, and produces an FFT result 2805.

Figure 29:
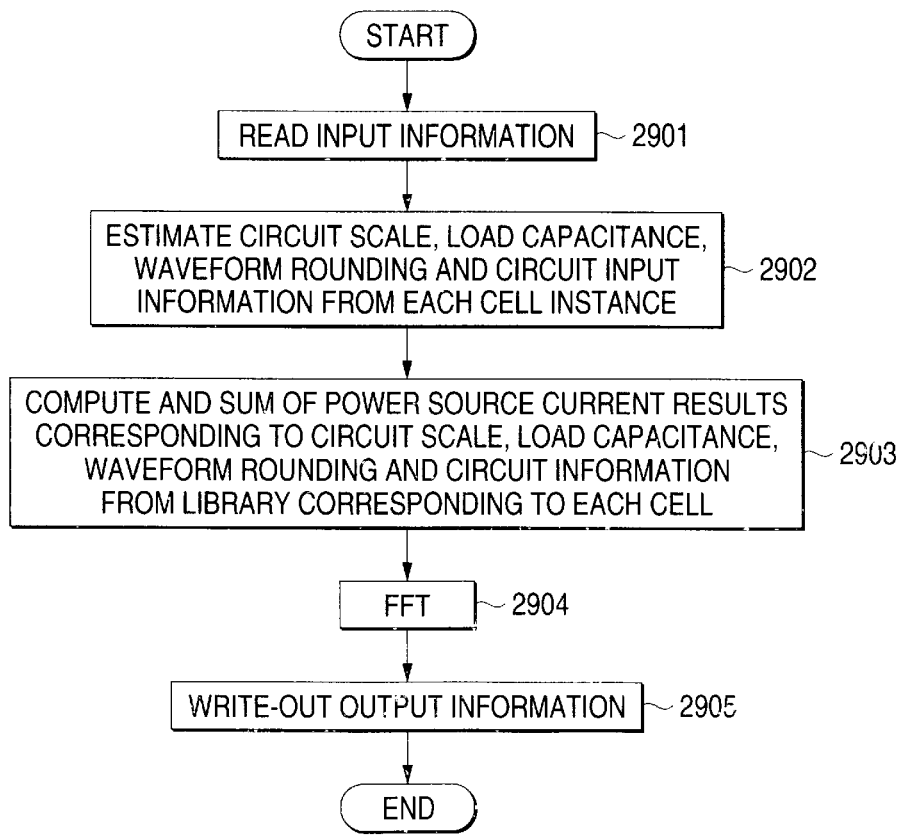
FIG. 29 is a flowchart showing the estimating method in the FFT estimating means according to the eighteenth embodiment of this invention.

The current FFT estimating means 2804 executes the analysis in the flowchart as shown in FIG. 29.

First, in step 2901, the netlist information stored in the netlist 3002 and circuit input information 3003 are read.

In step 2902, the circuit scale, load capacity, waveform rounding and circuit input information are estimated from the library corresponding to each cell.

In step 2903, the power source current waveforms corresponding to the circuit scale, load capacity, waveform rounding and circuit input information are invoked from the library corresponding to each cell and summed up to compute the power source current result.

In step 2904, the current result is FFT-processed. In step 2905, the output information is written out.

In this embodiment, in order to compute the FFT analysis result of the entire LSI, the FFT analysis results for all the device elements is not computed, but the current waveforms from the FFT are summed up from the FFT library. Thus, the FFT result can be obtained while the quantity of computing is reduced greatly.

Thus, the FFT estimation for the corresponding power current waveform taken out from the library permits the operation of current computation and FFT to be reduced, thereby performing the high speed processing.

Such a technique, when it is combined with any of the eleventh to seventeenth embodiments, provides the FFT result at a higher speed and with small capacity of memory and estimating the influence of noise on the entire LSI.

Embodiment 19

This embodiment intends to compute the FFT characteristic of the entire circuit using the FFT result stored in the library.

This embodiment is characterized by the provision of the FFT library which stores the result of the current analysis of the cell or block with a parameter of an input/output condition, frequency, line capacitance, etc.

Figure 30:
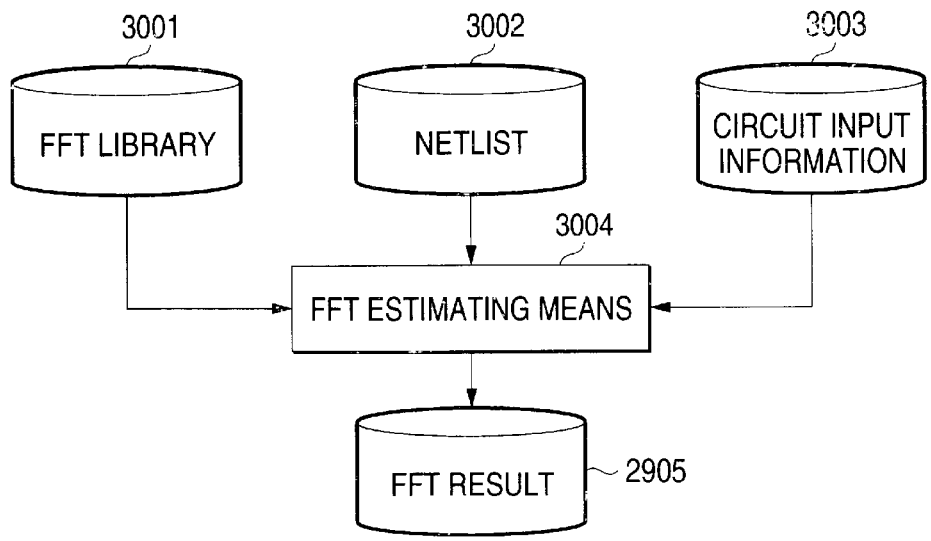
FIG. 30 is a block diagram showing an arrangement for realizing the EMI analyzing method according to the nineteenth embodiment of this invention.

FIG. 30 shows a device arrangement which is used for the EMI analysis technique according to this embodiment. The EMI analysis apparatus as shown includes a current waveform library 3001 which stores the result of the current analysis of the cell or block with a parameter of an input/output condition, frequency, line capacitance, etc., a netlist 3002, circuit input information 3003 and current FFT estimating means 3004, and produces an FFT result 3005.

Figure 31:
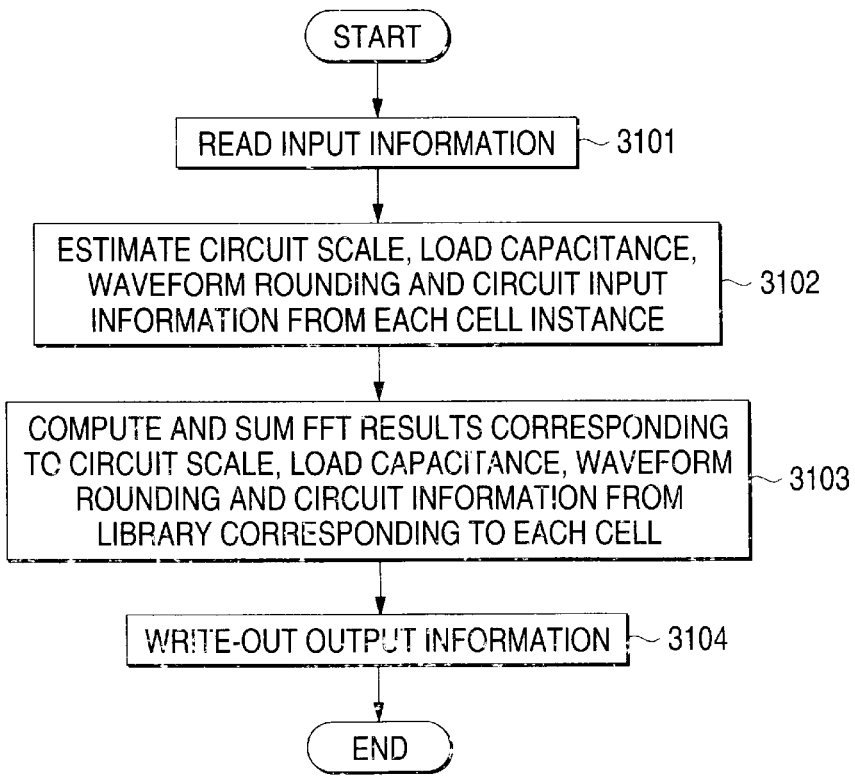
FIG. 31 is a flowchart showing the estimating method in the FFT estimating means according to the eighteenth embodiment of this invention.

The current FFT estimating means 3004 executes the analysis in the flowchart as shown in FIG. 31.

First, in step 3101, the netlist information stored in the netlist 3002 and circuit input information 3003 are read.

In step 3102, the circuit scale, load capacity, waveform rounding and circuit input information are estimated from the library corresponding to each cell.

In step 3103, the FFT results corresponding to the circuit scale, load capacity, waveform rounding and circuit input information are computed from the library corresponding to each cell and summed up.

In step 3104, the output information is written out.

Thus, the FFT estimation for the corresponding power current waveform taken out from the library permits the operation of current computation and FFT to be reduced, thereby performing the high speed processing.

Thus, the FFT estimation for the corresponding power current waveform taken out from the library permits the operation of current computation and FFT to be reduced, thereby performing the high speed processing.

Such a technique, when it is combined with any of the eleventh to seventeenth embodiments, provides the FFT result at a higher speed and with small capacity of memory and estimating the influence of noise on the entire LSI.

In this method, the FFT library previously stores the result of the FFT analysis of the cell or block with a parameter of an input/output condition, frequency, line capacitance, etc. However, the FFT data may be created by static analysis or dynamic analysis (JP-A-2001-022813, JP-A-2001-028013).

Using the FFT result in only the range to be estimated permits the quantity of data to be reduced.

Embodiment 20

This embodiment relates to analysis method of a functional level.

This embodiment is characterized in that a library stores the result of the FFT analysis of a clock buffer, memory, FF and IO with a parameter of an input/output condition, frequency, line capacitance, configuration, etc., and only the main component is provisionally logical-synthesized from a function description to estimate the FFT result.

Figure 32:
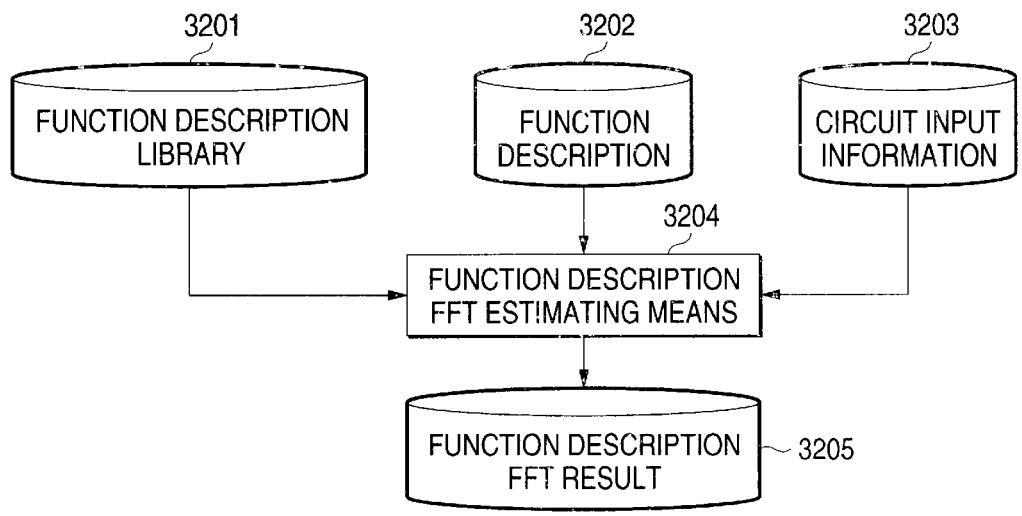
FIG. 32 is a block diagram showing an arrangement for realizing the EMI analyzing method according to the twentieth embodiment of this invention.

FIG. 32 shows a device arrangement which is used for the EMI analysis technique according to this embodiment. The EMI analysis apparatus as shown includes a library for function description 3002 which stores the result of the FFT analysis of a clock buffer, memory, FF and 10 with a parameter of an input/output condition, frequency, line capacitance, configuration, etc., a function description unit with function description 3202, circuit input information 3203 and function description FFT estimating means 3204, and produces an function description FFT result 3205.

Figure 33:
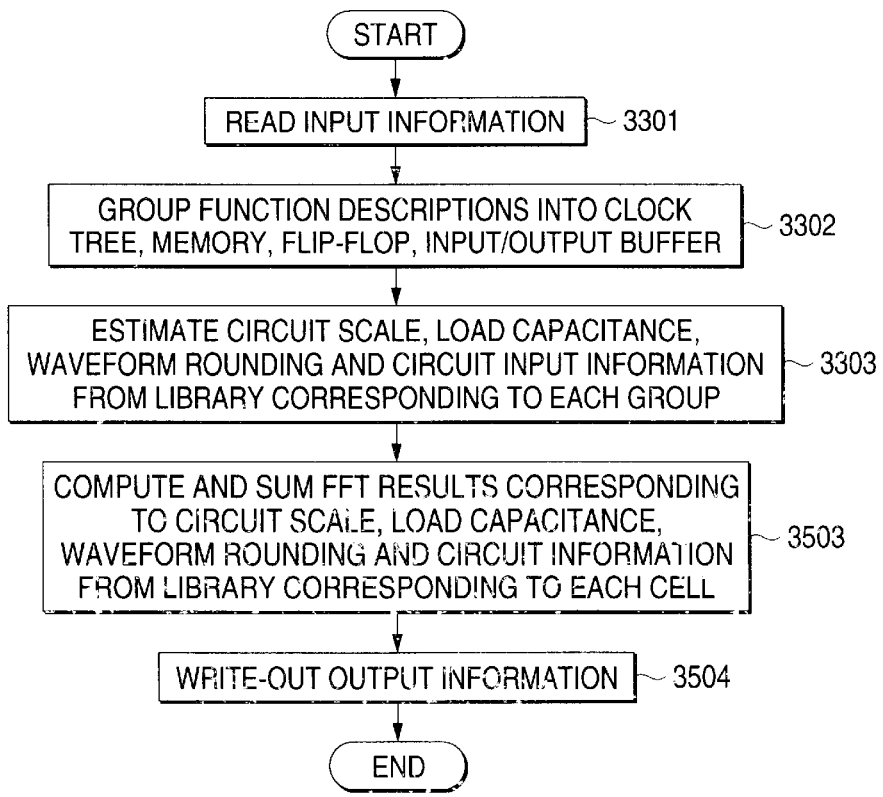
FIG. 33 is a flowchart showing the estimating method in the FFT estimating means according to the twentieth embodiment of this invention.
Figure 34:
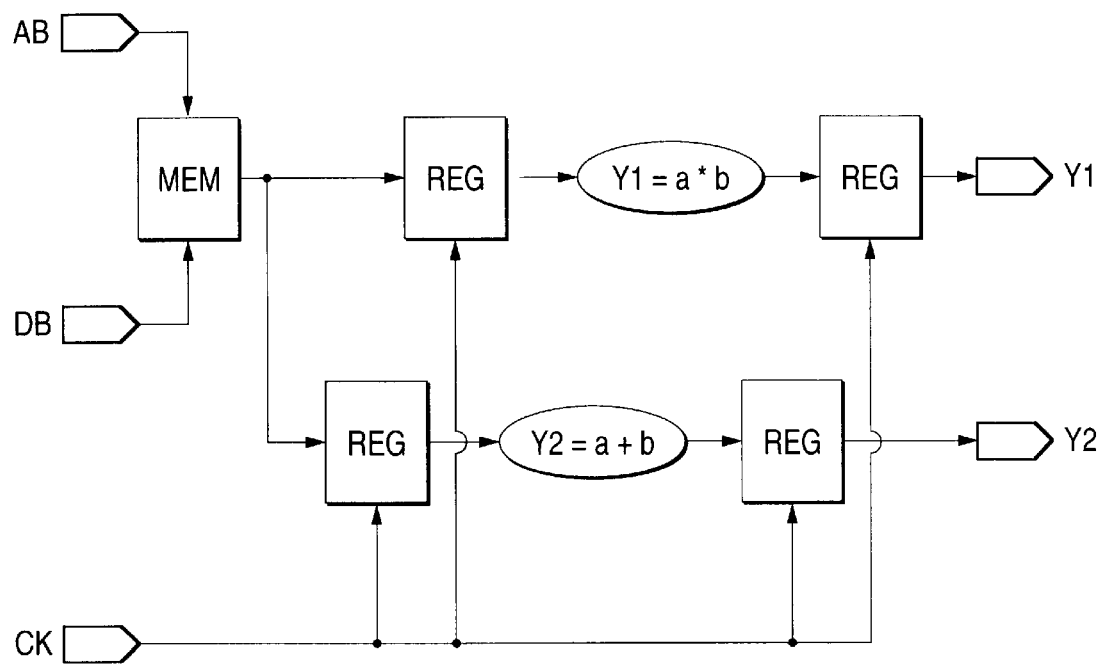
FIG. 34 is a view showing an example of a function description in the tenth embodiment of this invention.

The function description FFT estimating means 3204 executes the analysis in the flowchart as shown in FIG. 33.

First, in step 3301, the function descriptions 3202 stored in the function description unit 3202 and circuit input information 3203 are read.

In step 3302, the function descriptions are grouped into the functions of a clock tree memory, flip-flop, input/output buffer, etc.

In step 3303, the circuit scale, load capacity, waveform rounding and circuit input information are estimated from the library corresponding to each group.

In step 3304, the FFT results corresponding to the circuit scale, load capacity, waveform rounding and circuit input information are computed from the library corresponding to each group and summed up.

In step 3305, the output information is written out.

In this embodiment, in order to compute the FFT analysis result of the entire LSI, the FFT analysis results for all the elements is not computed, but they are grouped into functions. Thus, Such a technique permits the influence of noise on the entire LSI to be estimated.

Embodiment 21

This embodiment relates to a hybrid analysis technique using the respective merits of the dynamic analysis and the static analysis.

Namely, in this embodiment, the estimating technique is previously selected to obtain optimum FFT result estimation.

Figure 35:
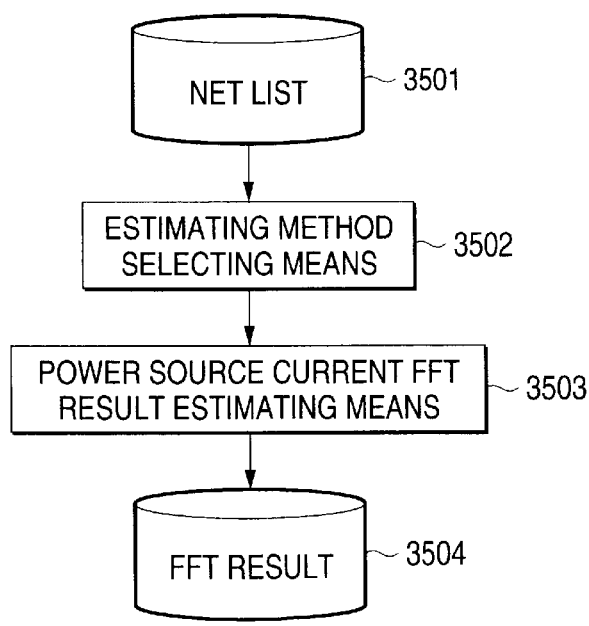
FIG. 35 is a block diagram showing the estimating method using hybrid analysis in the twenty-first embodiment of this invention.

FIG. 35 shows a device arrangement which is used for the EMI analysis technique according to this embodiment. The EMI analysis apparatus as shown includes an estimating technique selecting means 3502 for selecting an estimating technique from a netlist 3501 according to an input/output condition, frequency, line capacitance, configuration, required accuracy, etc., and an FFT result estimating means 3503 for estimating the FFT result in combination with the selected estimating technique, and produces an function description FFT result 3205.

Figure 36:
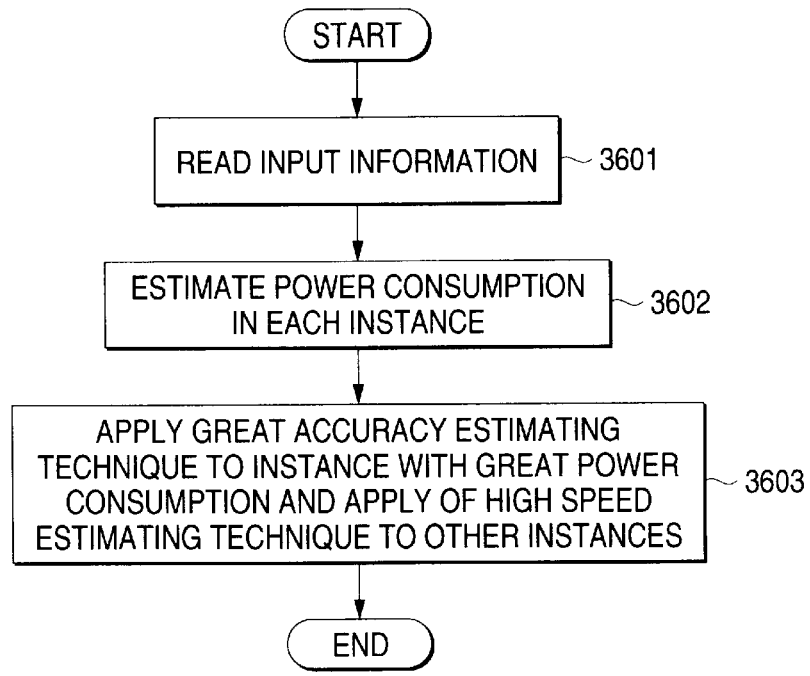
FIG. 36 is a flowchart showing the estimating method using hybrid analysis in the twenty-first embodiment of this invention.

The estimating technique selecting means 3502 executes the analysis in the flowchart as shown in FIG. 36.

First, in step 3601, circuit input information is read.

In step 3602, the power consumption of each instance is estimated.

In step 3603, the estimating technique is selected so that a great accuracy estimating technique is applied to the instance with great power consumption and a high speed estimating technique is applied to other instances.

In this way, high speed processing is performed.

Embodiment 22

Figure 37:
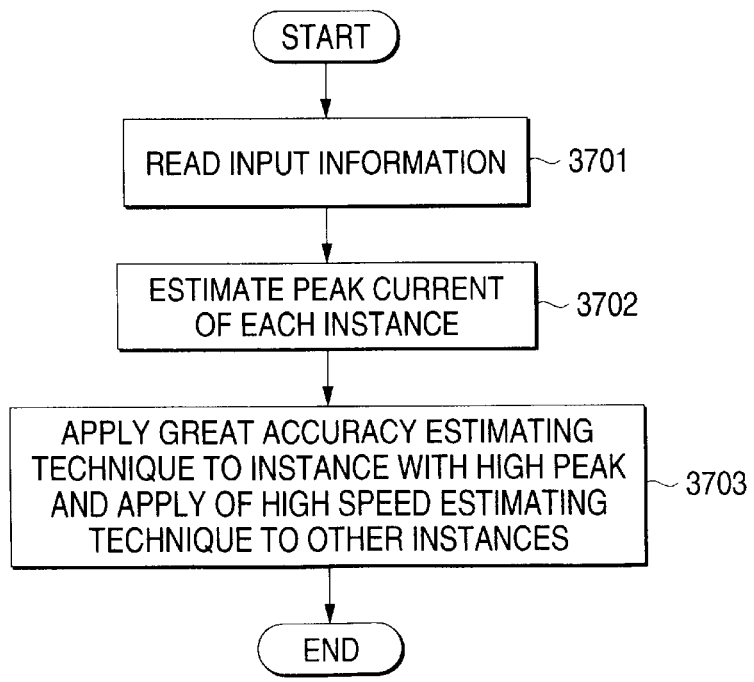
FIG. 37 is a flowchart showing the estimating method using hybrid analysis in the twenty-second embodiment of this invention.

In the first step, after rough analysis has been conducted, detailed analysis using the dynamic analysis is conducted for the portion with a high peak, thereby permitting the influence of noise on the entire LSI to be estimated at a high speed (FIG. 37).

The estimating technique selecting means 3502 executes the analysis in the flowchart as shown in FIG. 37.

First, in step 3701, circuit input information is read.

In step 3702, the peak current of each instance is estimated.

In step 3703, the estimating technique is selected so that a great accuracy estimating technique is applied to the instance with great power consumption and a high speed estimating technique is applied to other instances.

In this way, high speed processing can be performed.

Embodiment 23

Figure 38:
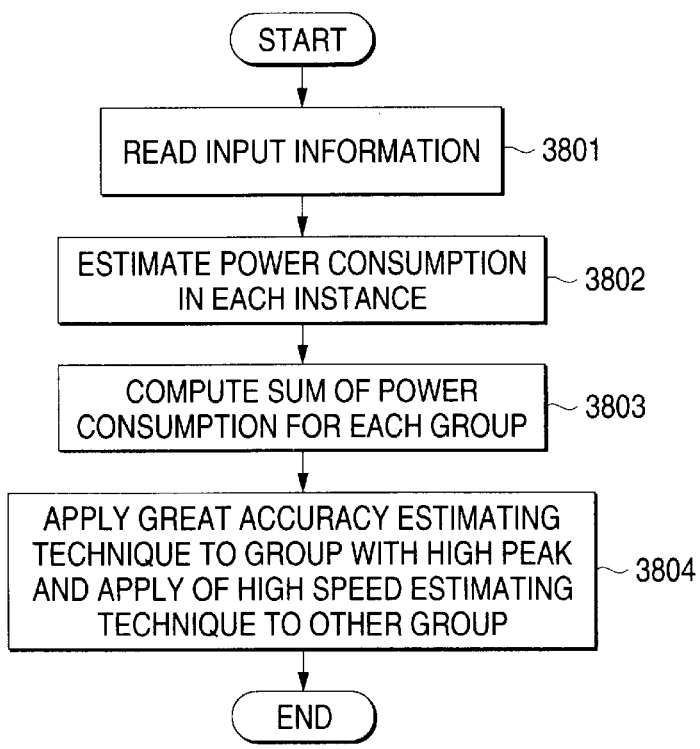
FIG. 38 is a flowchart showing the estimating method using hybrid analysis in the twenty-third embodiment of this invention.

Further, a technique may be adopted in which in the first step, an analysis technique is selected for each block from convergent of power consumption and FF/CLK (FIG. 38).

The estimating technique selecting means 3502 executes the analysis in the flowchart as shown in FIG. 38.

First, in step 3801, circuit input information is read.

In step 3802, the power consumption of each instance is estimated.

In step 3803, the sum of power consumption is computed for each block group.

In step 3804, the estimating technique is selected so that a great accuracy estimating technique is applied to the instance with great power consumption and a high speed estimating technique is applied to other instances.

In this way, high speed processing can be performed.

Embodiment 24

Figure 39:
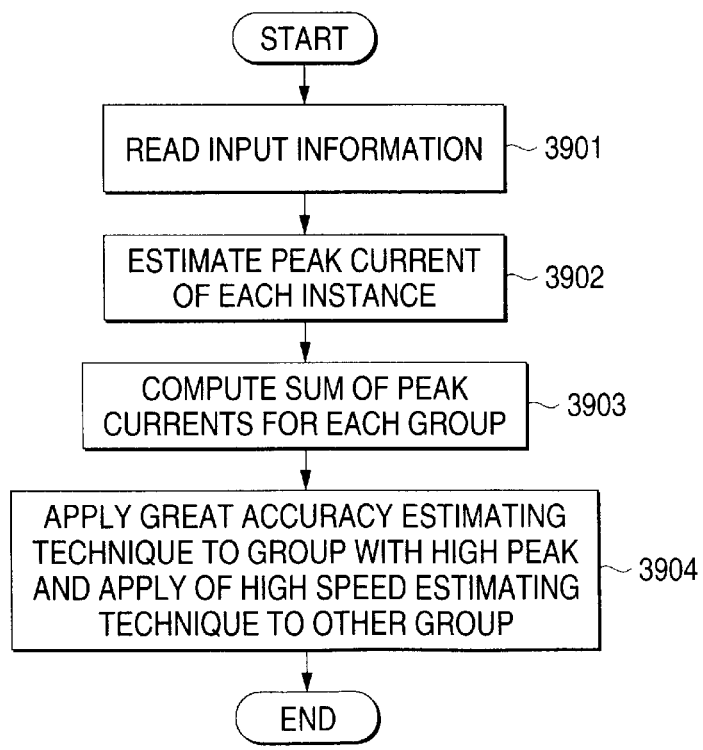
FIG. 39 is a flowchart showing the estimating method using hybrid analysis in the twenty-forth embodiment of this invention.

The sum of the peak currents is computed for each group and the technique may be adopted so that a great accuracy estimating technique is applied to the group with a high peak and a high speed estimating technique is applied to other groups (FIG. 39).

The estimating technique selecting means 3502 executes the analysis in the flowchart as shown in FIG. 39.

First, in step 3901, circuit input information is read.

In step 3902, the peak current of each instance is estimated.

In step 3903, the sum of peak currents is computed for each group.

In step 3904, the estimating technique is selected so that a great accuracy estimating technique is applied to the group with a high peak and a high speed estimating technique is applied to other groups.

In this way, high speed processing can be performed.

Embodiment 25

The number of flip-flops/clock buffers is computed for each group and a technique may be selected so that a great accuracy estimating technique is applied to the group with a large number of them and a high speed estimating technique is applied to other groups.

Figure 40:
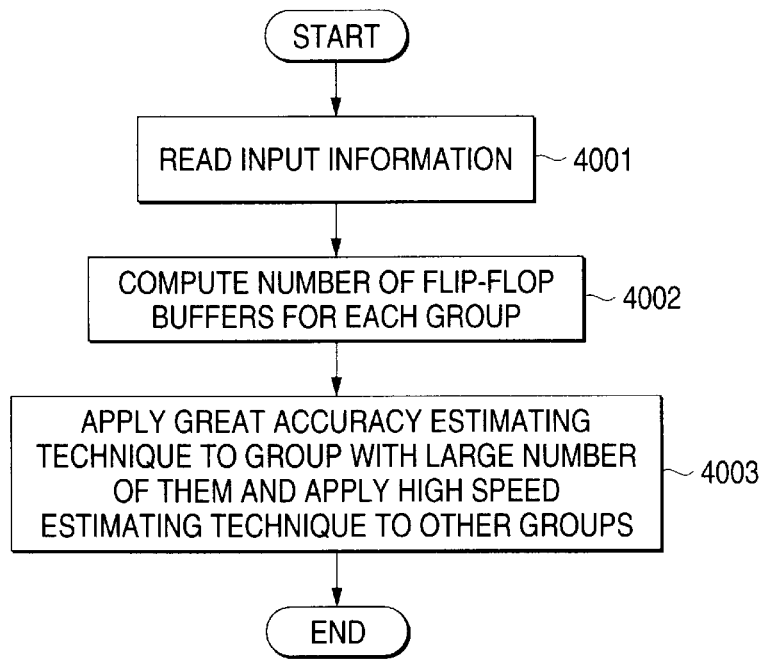
FIG. 40 is a flowchart showing the estimating method using hybrid analysis in the twenty-fifth embodiment of this invention.

The estimating technique selecting means 3502 executes the analysis in the flowchart as shown in FIG. 40.

First, in step 4001, circuit input information is read.

In step 4002, the number of flip-flops/clock buffers is computed to estimate the power consumption of each instance.

In step 4003, the estimating technique is selected so that a great accuracy estimating technique is applied to the group with a large number of them and a high speed estimating technique is applied to other groups.

In this way, high speed processing can be performed.

Embodiment 26

This embodiment also relates to a hybrid analysis technique using the respective merits of the dynamic analysis and the static analysis.

Namely, in this embodiment, according to required analysis accuracy, the estimating technique is previously selected to obtain optimum FFT result estimation.

Figure 41:
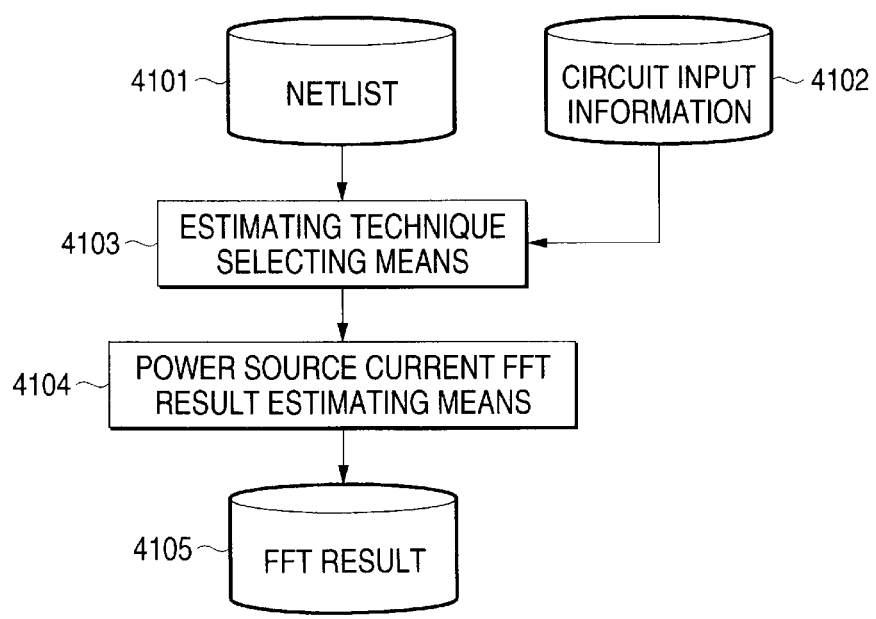
FIG. 41 is a flowchart showing the estimating method using hybrid analysis in the twenty-sixth embodiment of this invention.

FIG. 41 shows a device arrangement which is used for the EMI analysis technique according to this embodiment. The EMI analysis apparatus as shown includes an estimating technique selecting means 4103 for selecting an estimating technique from a netlist 4101 and circuit input information according to an input/output condition, frequency, line capacitance, configuration, required accuracy, etc., and a power source current FFT result estimating means 4104 for estimating an FFT result in combination with the selected estimating technique, and produces the FFT result 4105.

Figure 42:
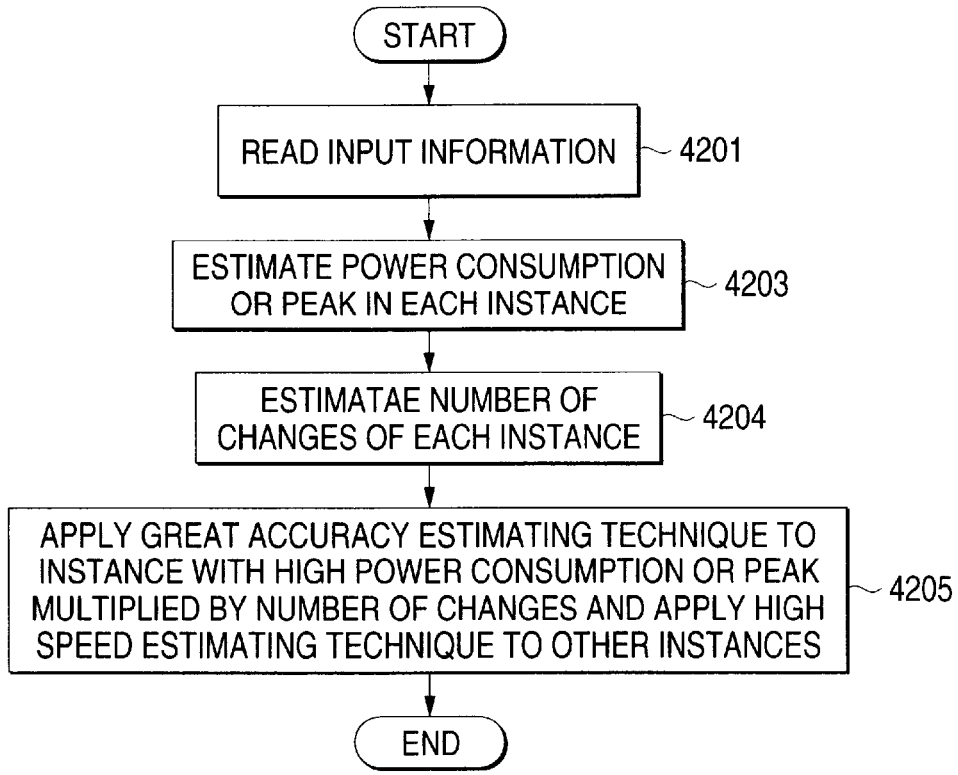
FIG. 42 is a flowchart showing the estimating method using hybrid analysis in the twenty-sixth embodiment of this invention.

The estimating technique selecting means 4102 executes the analysis in the flowchart as shown in FIG. 42.

First, in step 4201, circuit input information is read.

In step 4202, the power consumption or peak current in each instance is estimated.

In step 4203, the number of changes of each instance is estimated.

In step 4204, the power consumption or peak current is multiplied by the number of changes are accumulated, and the estimating technique is selected so that a great accuracy estimating technique is applied to the instance with a great accumulated value and a high speed estimating technique is applied to other instances.

In this way, high speed processing can be performed.

Embodiment 27

Whereas the frequency spectrum is computed by the high speed estimating technique, the great accuracy estimating technique may be applied again to the portion with a high peak.

Figure 43:
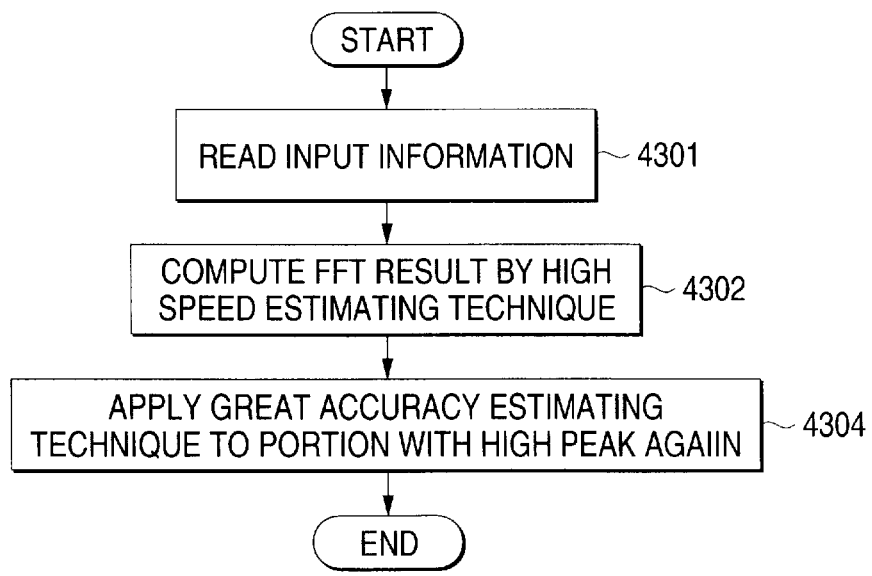
FIG. 43 is a flowchart showing the estimating method using hybrid analysis in the twenty-seventh embodiment of this invention.

The estimating technique selecting means 4102 executes the analysis in the flowchart as shown in FIG. 43.

First, in step 4301, circuit input information is read.

Next, in step 4302, the frequency spectrum (FFT result) is computed by the high speed estimating technique.

In step 4303, the great accuracy estimating technique is applied again to the portion with a high peak to select the estimating technique.

In this way, high speed and precise processing can be performed.

Embodiment 28

An explanation will be given of an EMI analysis technique using increment computing.

It takes a very long time to correct the FFT result since re-computation is required. This embodiment has been accomplished in order to solve this problem, and is characterized in that only the difference is computed to perform the processing.

Figure 44:
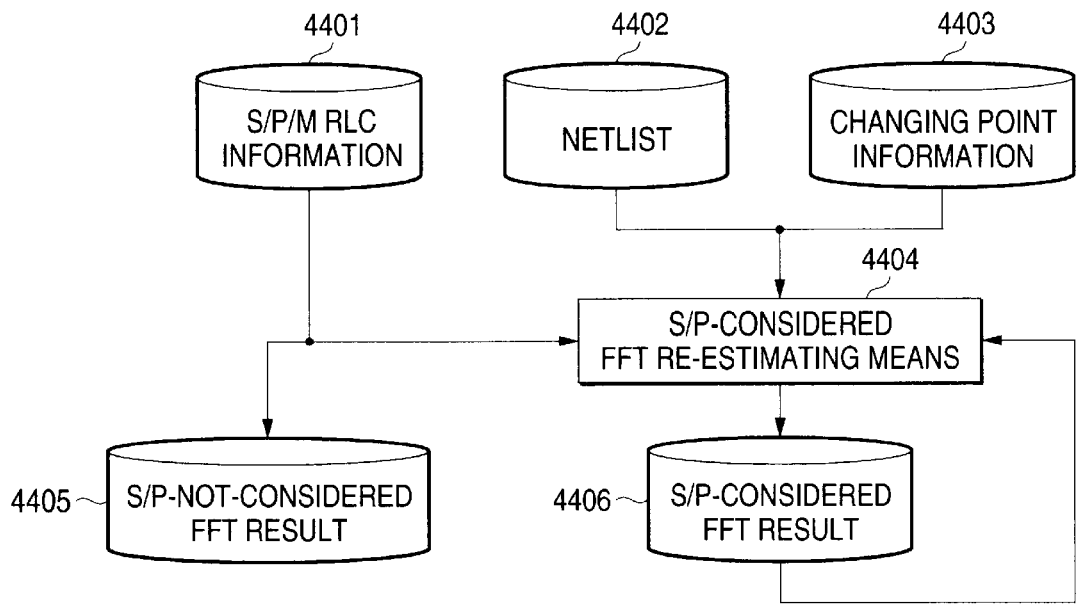
FIG. 44 is a block diagram showing the estimating method using incremental analysis in the twenty-eighth embodiment of this invention.

FIG. 44 shows a device arrangement which is used for the EMI analysis technique according to this embodiment. The EMI analysis apparatus as shown includes an S/P-considered FFT re-estimating means 4404 for estimating an FFT result on the basis of RLC information 4401 of S/P/M, frequency result obtained by the S/P not-considered FFT, netlist 4402 according to an input/output condition, frequency, line capacitance, configuration, required accuracy, etc., and changing point information 4403 representative of changing points, and produces the FFT result 4406.

Figure 45:
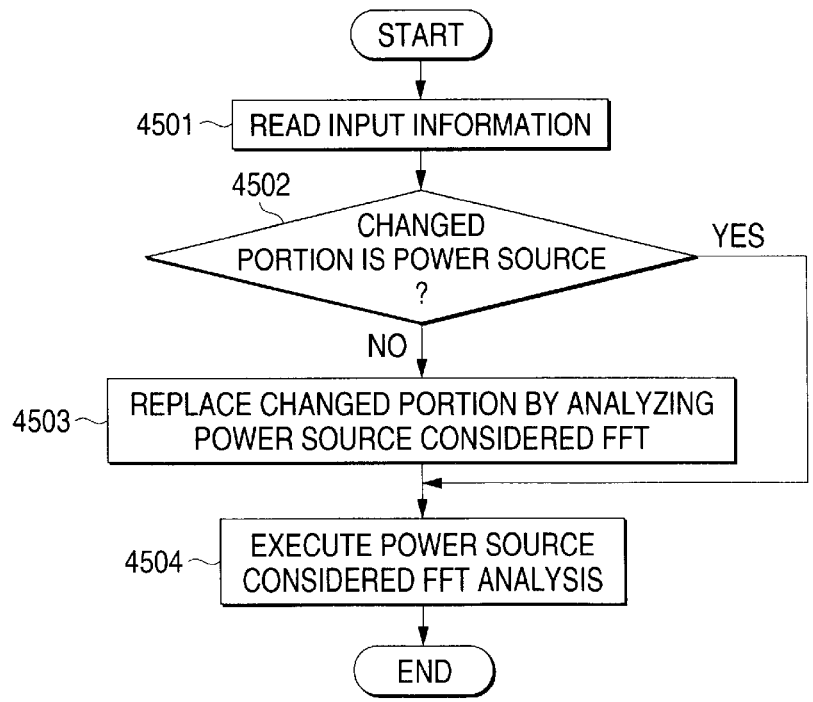
FIG. 45 is a block diagram showing the estimating method using incremental analysis in the twenty-eighth embodiment of this invention.
Figure 46:
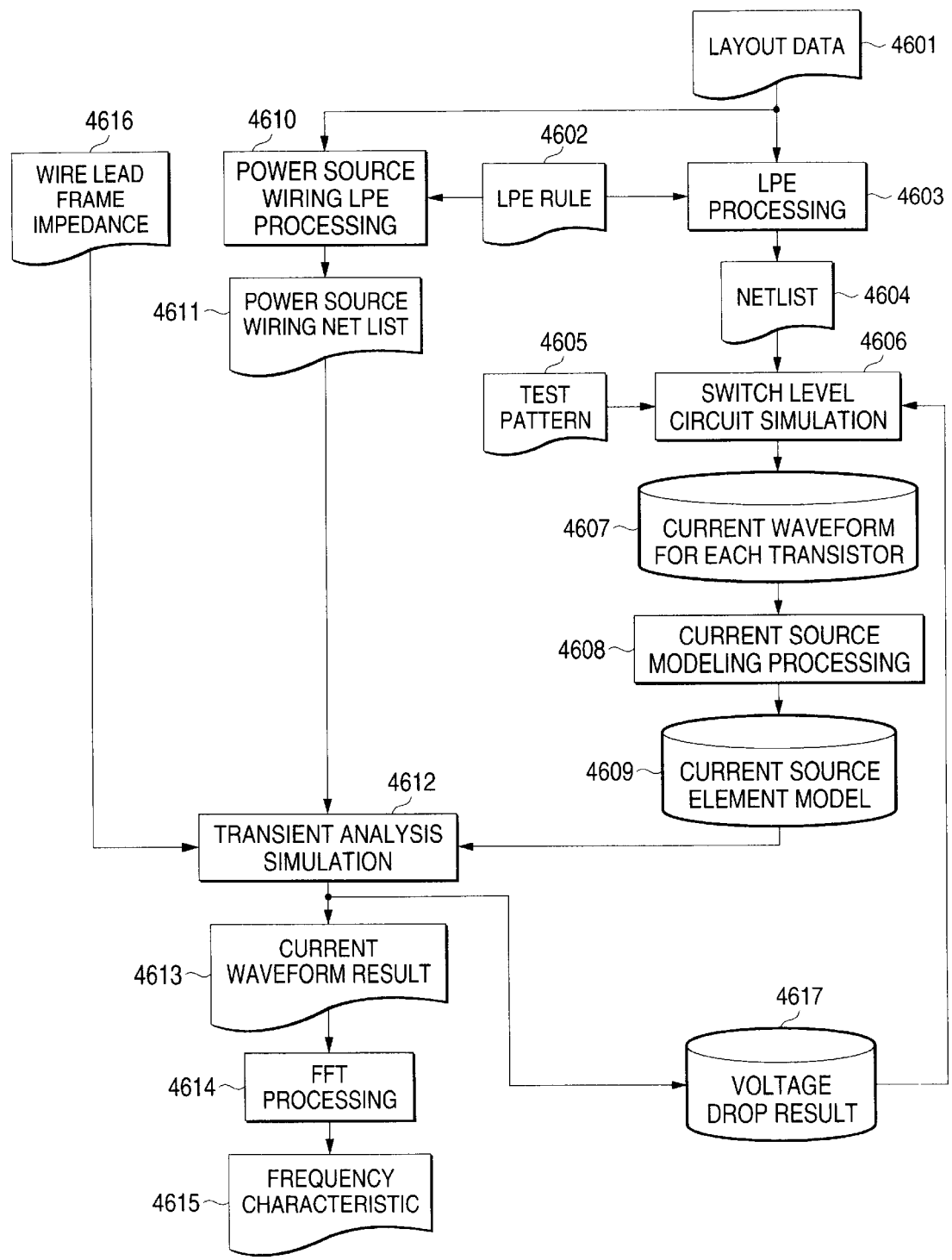
FIG. 46 is a block diagram showing the conceptual arrangement for realizing the EMI analysis method according to a prior art.
Figure 47:
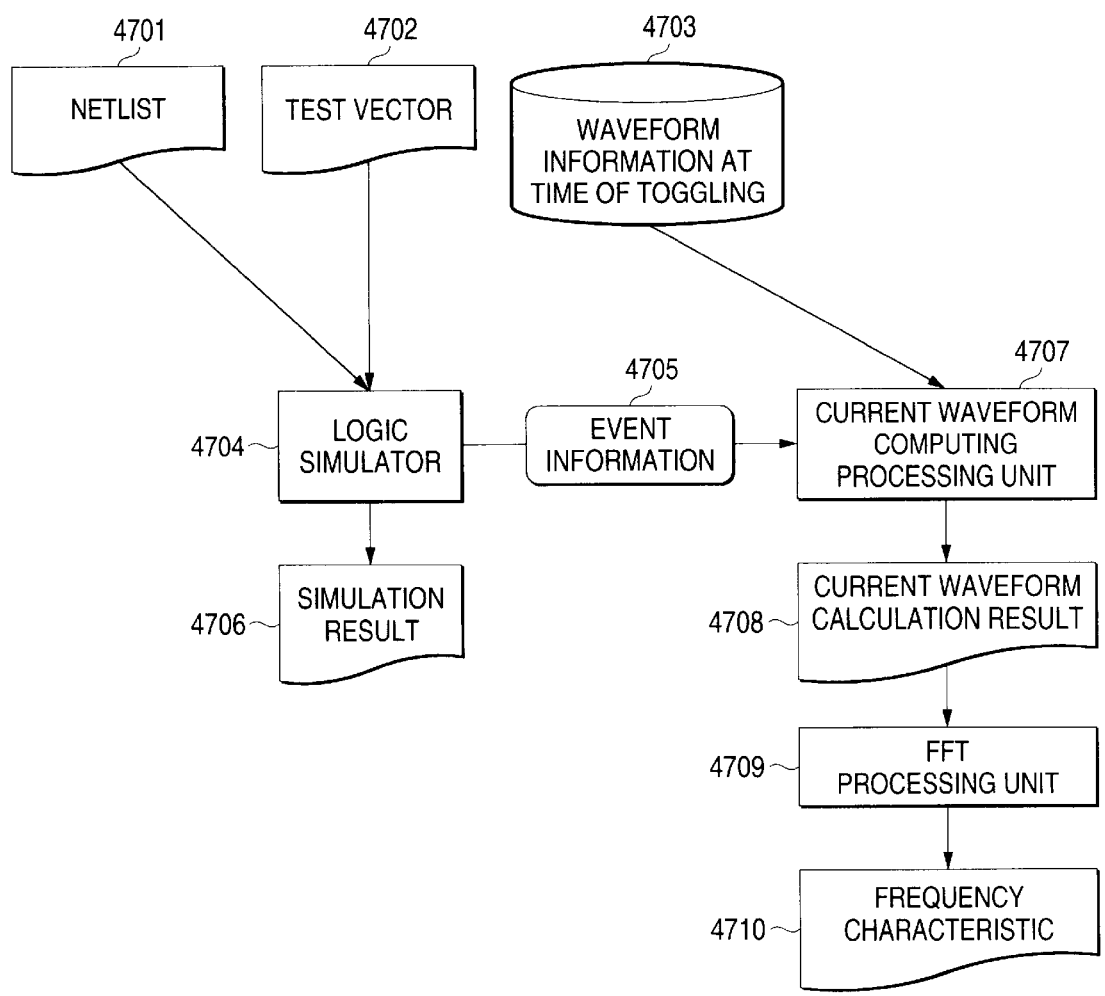
FIG. 47 is a block diagram showing the conceptual arrangement for the EMI analysis method in a transistor level according to the prior art.

The estimating technique selecting means 4404 executes the analysis in the flowchart as shown in FIG. 45.

First, in step 4501, circuit input information is read.

In step 4502, it is decided whether or not the changed portion is a power source. If YES, the power source considered FFT analysis is executed (step 4504).

If NO, only the changed portion is replaced by the power source not-considered FFT analysis (step 4503). Subsequently, the power source considering FFT analysis is executed (step 4504).

In this way, high speed and precise processing is performed.

This invention intends to make EMI analysis inclusive of the analysis of a change in a power source current which may be a main cause of the EMI, thereby optimizing the EMI. This invention effectively reflects the influence of decoupling due to the resistance, capacitance, inductance in the power source and ground on the analysis to make high speed and precision compatible so that the EMI can be evaluated in a practical time. This invention supports to define the portion from which the EMI is generated, thereby permitting effective EMI measures to be implemented.

This invention performs analysis of the power source analysis which may be the main cause of the EMI, including a step of computing equivalent power source current information flowing in the power source current in an ideal power source on the basis of the circuit information of an LSI chip at issue, a step of estimating, as an equivalent circuit, total information composed of the circuit information and analysis control information reflected thereon, the analysis control information of the "S/P/M information" described above, and a step of executing simulation according to the total information estimated in the estimating step, thereby optimizing the EMI effectively.

In such a configuration, the EMI due to the power source, package and measurement system can be accurately analyzed at a high speed and with small capacity of memory.

The influence of decoupling due to the resistance, capacitance, inductance in the power source and ground on the computing of the power source current by hybrid analysis to make high speed and precision compatible so that the EMI can be evaluated in a practical time on the simulation. This invention also supports to define the portion from which the EMI is generated, thereby permitting effective EMI measures to be implemented.

This invention also includes a step of sorting and displaying blocks or instances according to the level of noise so that the analysis can be done at a higher speed and with greater accuracy, thereby implementing excellent processing.

Additionally, although the optimization cannot be actually implemented full-automatically, the information inherent on the EMI from which the quantity of noise generated from each instance can be known can be used to select/determine the best optimizing technique interactively with a user, thereby implementing the optimization.

What is claimed is:

1. A method for optimizing electromagnetic interference (EMI) comprising:

an EMI analyzing step of analyzing a quantity of electromagnetic interference of an LSI by execution of simulation;

a step of selecting an instance with a large quantity of noise in said EMI analyzing step; and a step of adjusting a driving capability of said instance so as to be lowered to an extent that a delay does not occur in a signal timing of said instance selected.

2. A method of optimizing EMI according to claim 1, wherein said instance is regarded as a first instance and when there exists a second instance having an output signal line in parallel adjacently to another output signal line of said first instance, said step of adjusting includes lowering the driving capability of at least any one of said first instance and said second instance in accordance with gradient of output signal wave forms thereof.

3. A method for optimizing electromagnetic interference (EMI) comprising the steps of:

an EMI analyzing step of analyzing a quantity of electromagnetic interference of an LSI by execution of simulation;

a step of selecting an instance with a large quantity of noise in said EMI analyzing step; and a step of correcting a driving capability of said instance in such a way that an inductance is added to a local power source line communicated with said instance in a degree to which a delay does not occur in a signal timing of said instance selected.

4. A method for optimizing electromagnetic interference (EMI) according to claim 3, wherein said step of correcting includes to increase a power supply line resistance.

5. A method for optimizing electromagnetic interference (EMI) comprising the steps of:
an EMI analyzing step of analyzing a quantity of electromagnetic interference of an LSI by execution of simulation;
a step of selecting an aggressor instance with crosstalk; and
a step of adjusting a driving capability of said aggressor instance so that it is lowered to an extent that a delay does not occur in a signal timing of said instance selected.

6. A method for optimizing electromagnetic interference (EMI) according to claim 5, further comprising a step of raising the driving capability of a victim instance to an extent that EMI noise of the victim instance is negligible.

7. A method for optimizing electromagnetic interference (EMI) according to claim 5, wherein where the driving capability of each of said aggressor instance and a victim instance is lowered, their driving capabilities are set so that their ratio is not increased.

8. A method for optimizing electromagnetic interference (EMI) comprising the steps of:
(A) an EMI analyzing step of analyzing a quantity of electromagnetic interference of an LSI by execution of simulation;
(B) a step of sampling a block or instance with a large quantity of noise in said EMI analyzing step;
(C) a step of reducing the EMI in said block or instance according to a designing stage, said block or instance being sampled in said step of sampling; and
(D) a step of repeating steps A–C until the quantity of EMI is made smaller than a prescribed value.

9. A method for optimizing electromagnetic interference (EMI) according to claim 8, wherein said step of reducing EMI includes a first step of changing layout data at a floorplan stage.

10. A method for optimizing electromagnetic interference (EMI) according to claim 8 or 9, wherein said step of reducing EMI includes a second step of changing layout data at a layout stage.

11. A method for optimizing electromagnetic interference (EMI) according to claim 9, wherein said first step includes the steps of:
computing a necessary quantity of decoupling capacitance from peak current information of an object block sampled in said step of sampling;
computing a quantity of insufficiency of a power source area from the necessary quantity of decoupling capacitance thus computed in said step of computing; and
changing the layout data on the basis of said quantity of insufficiency.

12. A method for optimizing electromagnetic interference (EMI) according to claim 10, wherein said second step includes the steps of:
computing a necessary quantity of decoupling capacitance from peak current information of an object block sampled in said step of sampling;
computing a quantity of insufficiency of a power source area from the necessary quantity of decoupling capacitance thus computed in said step of computing; and
changing the layout data on the basis of said quantity of insufficiency.

13. A method for optimizing electromagnetic interference (EMI) according to claim 9, wherein said first step includes the steps of:
computing a necessary quantity of decoupling capacitance from peak current information of an object block sampled in said step of sampling;
computing a quantity of insufficiency of a power source area from the necessary quantity of decoupling capacitance thus computed in said step of computing; and
changing the layout data for a required block on the basis of said quantity of insufficiency.

14. A method for optimizing electromagnetic interference (EMI) according to claim 11, wherein said step of changing the layout data is to change the aspect ratio of the object block so that the line area of a power source current path is changed substantially.

15. A method for optimizing electromagnetic interference (EMI) according to claim 11, wherein said step of changing the layout data is to change the position of the object block so that the line area of a power source current path is changed substantially.

16. A method for optimizing electromagnetic interference (EMI) according to claim 10, wherein said second step is to invert a direction of one of cell lines arranged each sharing a ground line or power line so that a prescribed interval is given between the power line and said ground line adjacent to each other.

17. A method for optimizing electromagnetic interference (EMI) according to claim 10, wherein said second step includes to arrange an auxiliary line connected to a potential between a power supply potential and a ground potential above or below a layer where the power line and ground line are formed so that a sum of the capacitances between said power line and ground line, between said ground line and auxiliary line and between said auxiliary line and said power line becomes a desired decoupling capacitance.

18. A method for analyzing electromagnetic interference (EMI) comprising the steps of:
sampling blocks or instances with noise in a so high level as to require a measure for EMI in such a manner that an instantaneous current quantity for an object block created when a signal change is generated is computed by execution of simulation, taking into consideration event information inclusive of the name of an instance for each cell of an LSI at issue, name of a signal, timing of the signal change and transient information; and
sorting/displaying the blocks or instances according to the level of noise.

19. A method for analyzing electromagnetic interference (EMI) comprising the steps of:
sampling blocks or instances with noise in a so high level as to require a measure for EMI in such a manner that an instantaneous current quantity for an object block created when a signal change is generated is computed by execution of simulation, taking into consideration event information inclusive of the name of an instance for each cell of an LSI at issue, name of a signal, timing of the signal change and transient information;
modeling said instantaneous current quantity according to a predetermined rule; and
executing an FFT analysis of current change information computed by said step of modeling, wherein it further comprises a step of displaying frequency information acquired in said step of FFT analysis.

20. A method for analyzing electromagnetic interference (EMI) according to claim 19, further comprising the steps of:

highlighting a block to be noticed from the information displayed in said step of displaying;

analyzing EMI information after EMI optimizing processing is executed for said block; and displaying the information thus analyzed.

21. A method for analyzing electromagnetic interference (EMI) according to claim 20, further comprising the steps of:

storing said optimizing processing as processing historical information; and displaying said processing historical information as occasion demands.

22. A method for analyzing electromagnetic interference (EMI) according to claim 20, further comprising the steps of analyzing EMI information of a portion EMI-optimized for said block; and displaying the analyzed information.

23. A method for analyzing electromagnetic interference (EMI) comprising the steps of:

deciding a portion with much EMI noise on the basis of an analysis result of EMI noise in an LSI;

displaying the portion which has been decided to have much EMI noise.

24. A method for analyzing electromagnetic interference (EMI) according to claim 23, wherein said step of displaying includes to compute a difference of the portion having a large EMI noise from differences of a plurality of FFT results and displaying it.

25. A method for analyzing electromagnetic interference (EMI) according to claim 23, wherein said step of displaying includes to display two FFT results so that differences of specified portions of any shape are displayed in different colors for the color identification of the differences of a shape.

26. A method for analyzing electromagnetic interference (EMI) according to claim 23, wherein said step of deciding includes to compute the differences on the basis of information of circuit portions sorted according to the degree of noise.

27. A method for analyzing electromagnetic interference (EMI) according to claim 23, wherein said step of displaying includes to display the portions in color identification between circuit diagram information and layout information or by character information.

* * * * *